United States Patent
Kang et al.

(10) Patent No.: US 9,991,271 B2
(45) Date of Patent: Jun. 5, 2018

(54) INTEGRATED CIRCUIT DEVICE INCLUDING VERTICAL MEMORY DEVICE AND METHOD OF MANUFACTURING THE SAME

(71) Applicants: Shin-hwan Kang, Seoul (KR); Young-hwan Son, Hwaseong-si (KR); Dong-seog Eun, Seongnam-si (KR); Chang-sup Lee, Hwaseong-si (KR); Jae-hoon Jang, Seongnam-si (KR)

(72) Inventors: Shin-hwan Kang, Seoul (KR); Young-hwan Son, Hwaseong-si (KR); Dong-seog Eun, Seongnam-si (KR); Chang-sup Lee, Hwaseong-si (KR); Jae-hoon Jang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/345,763

(22) Filed: Nov. 8, 2016

(65) Prior Publication Data
US 2017/0358590 A1    Dec. 14, 2017

(30) Foreign Application Priority Data
Jun. 9, 2016    (KR) .................. 10-2016-0071890

(51) Int. Cl.
*H01L 27/00*    (2006.01)
*H01L 27/11556*    (2017.01)
*H01L 27/11524*    (2017.01)
*H01L 27/1157*    (2017.01)
*H01L 27/11582*    (2017.01)

(52) U.S. Cl.
CPC .... *H01L 27/11556* (2013.01); *H01L 27/1157* (2013.01); *H01L 27/11524* (2013.01); *H01L 27/11582* (2013.01)

(58) Field of Classification Search
CPC ......... H01L 27/11556; H01L 27/11524; H01L 27/1157; H01L 27/11582
See application file for complete search history.

(56) References Cited

U.S. PATENT DOCUMENTS

| | | |
|---|---|---|
| 8,237,211 B2 | 8/2012 | Fukuzumi et al. |
| 8,426,908 B2 | 4/2013 | Higashi |
| 8,476,713 B2 | 7/2013 | Lee et al. |
| 8,625,322 B2 | 1/2014 | Samachisa et al. |

(Continued)

FOREIGN PATENT DOCUMENTS

KR    10-2011-0015337 A    2/2011

OTHER PUBLICATIONS

US 9,230,972, 01/2016, Shimabukuro et al. (withdrawn)

*Primary Examiner* — Long Pham
(74) *Attorney, Agent, or Firm* — Harness, Dickey & Pierce, P.L.C.

(57) ABSTRACT

In one embodiment, the semiconductor device includes a stack of alternating interlayer insulating layers and conductive layers on a substrate. Each of the conductive layers extends in a first direction less than a previous one of the conductive layers to define a landing portion of the previous one of the conductive layers. An insulating plug is in one of the conductive layers under one of the landing portions, and a contact plug extends from an upper surface of the one of the landing portions.

19 Claims, 53 Drawing Sheets

(56) References Cited

U.S. PATENT DOCUMENTS

| | | | |
|---|---|---|---|
| 8,692,312 B2* | 4/2014 | Fukuzumi | H01L 29/66833 257/324 |
| 8,765,598 B2 | 7/2014 | Smith et al. | |
| 8,787,082 B2 | 7/2014 | Son et al. | |
| 8,957,471 B2 | 2/2015 | Fukuzumi | |
| 9,029,938 B2 | 5/2015 | Nakaki | |
| 9,099,566 B2 | 8/2015 | Kwon et al. | |
| 9,245,839 B2 | 1/2016 | Chae et al. | |
| 9,257,388 B2 | 2/2016 | Mizukami et al. | |
| 2013/0334591 A1* | 12/2013 | Matsuda | H01L 29/66833 257/324 |

* cited by examiner

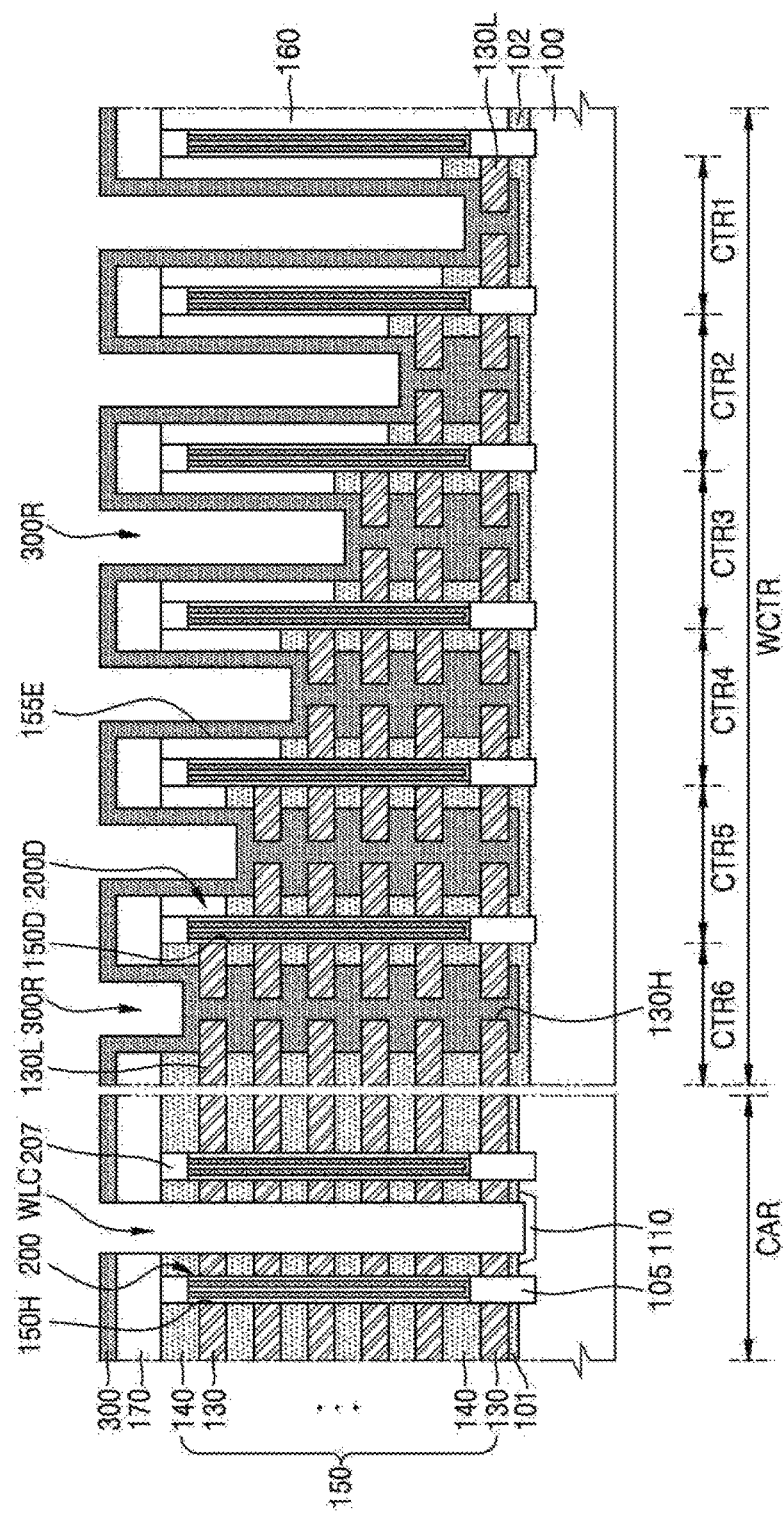

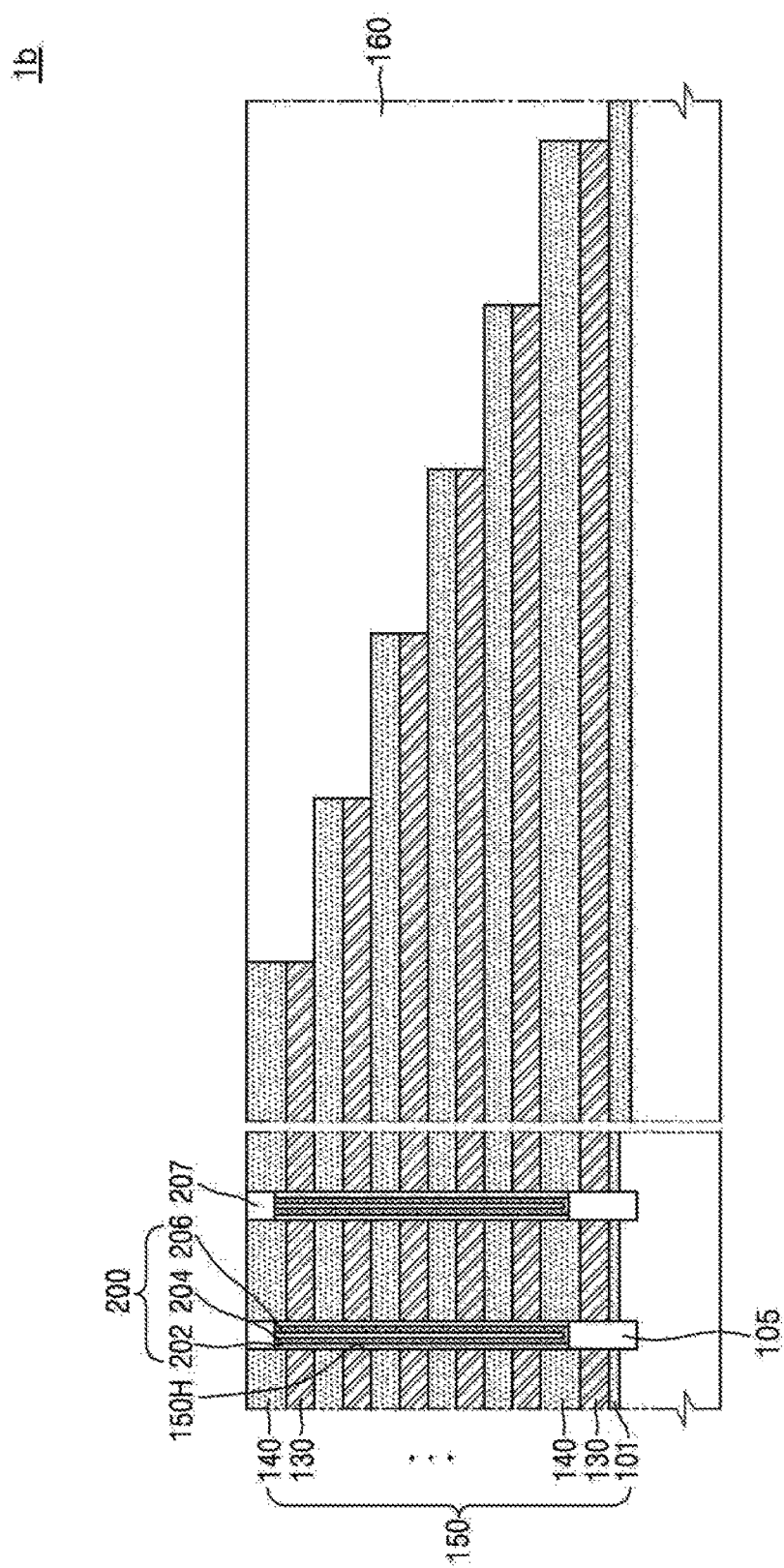

INTEGRATED CIRCUIT DEVICE INCLUDING VERTICAL MEMORY DEVICE AND METHOD OF MANUFACTURING THE SAME

CROSS-REFERENCE TO RELATED APPLICATION

This application claims the benefit of Korean Patent Application No. 10-2016-0071890, filed on Jun. 9, 2016, in the Korean Intellectual Property Office, the disclosure of which is incorporated herein in its entirety by reference.

BACKGROUND

The inventive concepts relate to an integrated circuit (IC) device and/or a method of manufacturing the IC device, and more particularly, to an IC device including a nonvolatile vertical memory device and/or a method of manufacturing the IC device.

Large capacity and high integration of IC devices including memory devices have been required according to recent multifunctional information and communication devices. Operation circuits and wiring lines which are included in the memory devices for operation and electrical connection of the memory devices have become more complicated due to a reduction in memory cell size for high integration. Accordingly, an IC device including a memory device having improved integration and excellent electrical characteristics is desired.

SUMMARY

At least one embodiment related to a semiconductor device.

In one embodiment, the semiconductor device includes a stack of alternating interlayer insulating layers and conductive layers on a substrate. Each of the conductive layers extends in a first direction less than a previous one of the conductive layers to define a landing portion of the previous one of the conductive layers. An insulating plug is in one of the conductive layers under one of the landing portions, and a contact plug extends from an upper surface of the one of the landing portions.

In another embodiment, the semiconductor device includes a first insulating layer over a portion of a substrate; a first gate electrode layer on the first insulating layer; a second insulating layer on the first gate electrode layer; a second gate electrode layer on the second insulating layer; a first conductive contact plug extending from an upper surface of the first gate electrode layer; a second conductive contact plug extending from an upper surface of the second gate electrode layer; and an insulating plug disposed in the first gate electrode layer. The insulating plug is disposed under the second conductive contact plug, and a diameter of the insulating plug is less than a diameter of the second conductive contact plug.

At least one embodiment relates to a method of manufacturing a semiconductor device.

In one embodiment, the method includes forming a stack of alternating first and second layers on a substrate, each of the second layers extending in a first direction less than a previous one of the second layers to define a landing portion of the previous one of the second layers. The method further includes forming a first hole through a plurality of the first layers and a plurality of the second layers in the stack such that the first hole penetrates one of the landing portions; etching the plurality of the first layers to widen portions of the first hole at least under the plurality of the second layers; and forming a support insulating layer within the first hole including the widened portions.

In another embodiment, the method includes forming a stack of alternating interlayer insulating layers and sacrificial layers on a substrate, each of the sacrificial layers extending in a first direction less than a previous one of the sacrificial layers to define a first landing portion of the previous one of the sacrificial layers. The method further includes removing (i) a portion of the landing portions of the sacrificial layers and (ii) a portion of the interlayer insulating layers at least above and below remaining portions of each of the landing portions of the sacrificial layers to define a plurality of recesses; forming a support insulating layer within the plurality of recesses; removing the sacrificial layers to form sacrificial layer removal space; and filling the sacrificial layer removal space with a conducting material to form gate electrode layers alternately stacked with the interlayer insulating layers.

BRIEF DESCRIPTION OF THE DRAWINGS

FIGS. 4A through 4D are cross-sectional views for sequentially describing a method of manufacturing an IC device according to an embodiment of the inventive concepts and cross-sectional views illustrating the IC device according to an embodiment of the inventive concepts;

DETAILED DESCRIPTION

Figure 1:
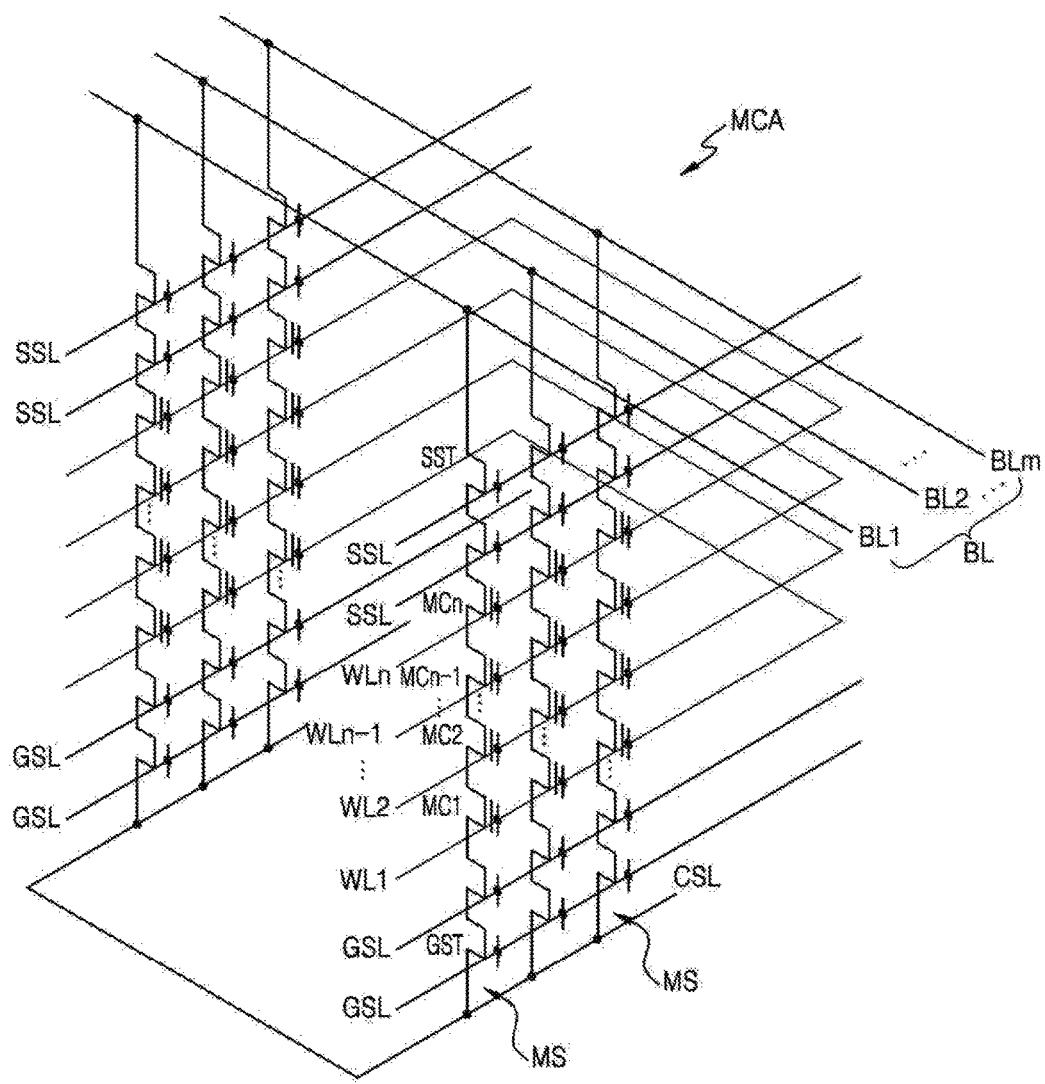
FIG. 1 is an equivalent circuit diagram of a memory cell array (MCA) included in a memory cell array region of an integrated circuit (IC) device according to an embodiment of the inventive concepts.

FIG. 1 is an equivalent circuit diagram of a memory cell array (MCA) included in a memory cell array region of an integrated circuit (IC) device according to an embodiment of the inventive concepts. FIG. 2 illustrates an equivalent circuit diagram of a NAND flash memory device having a vertical channel structure.

Referring to FIG. 1, the memory cell array MCA may include a plurality of memory cell strings MS. The memory cell array MCA may include a plurality of bit lines BL1, BL2, . . . , BLm, a plurality of word lines WL1, WL2, . . . , WLn−1, and WLn, at least one string select line SSL, at least one ground select line GSL, and a common source line CSL. The plurality of memory cell strings MS may be respectively formed between the plurality of bit lines BL1, BL2, . . . , BLm and the common source line CSL.

Each of the plurality of memory cell strings MS may include at least one string select transistor SST, at least one ground select transistor GST, and a plurality of memory cell transistors MC1, MC2, . . . , MCn−1, and MCn. A drain region of one of the string select transistors SST may be connected to the bit lines BL1, BL2, . . . , BLm. A source region of one of the ground select transistors GST may be connected to the common source line CSL. The common source line CSL may be a region connected in common with source regions of a plurality of the ground select transistors GST.

The string select transistors SST may be connected to the respective string select lines SSL. The ground select transistor GST may be connected to respective ground select lines GSL. The plurality of memory cell transistors MC1, MC2, . . . , MCn−1, and MCn may be connected to the word lines WL1, WL2, . . . , WLn−1, and WLn, respectively.

The memory cell array MCA may have a 3-dimensional (3D) structure. The plurality of memory cell transistors MC1, MC2, . . . , MCn−1, and MCn that constitute the memory cell strings MS may have a structure serially connected to a main surface of a substrate 100 (see FIGS. 2A through 16G) in a vertical direction. Accordingly, channel regions 204 (see FIGS. 2N, 3, 4D, 5C, 6, 7I, 8, 9, 10C, 11, and 12) of the string select transistor SST, the ground select transistor GST, and the plurality of memory cell transistors MC1, MC2, . . . , MCn−1, and MCn may extend in a substantially vertical direction with respect to the main surface of the substrate 100.

Figure 2A:
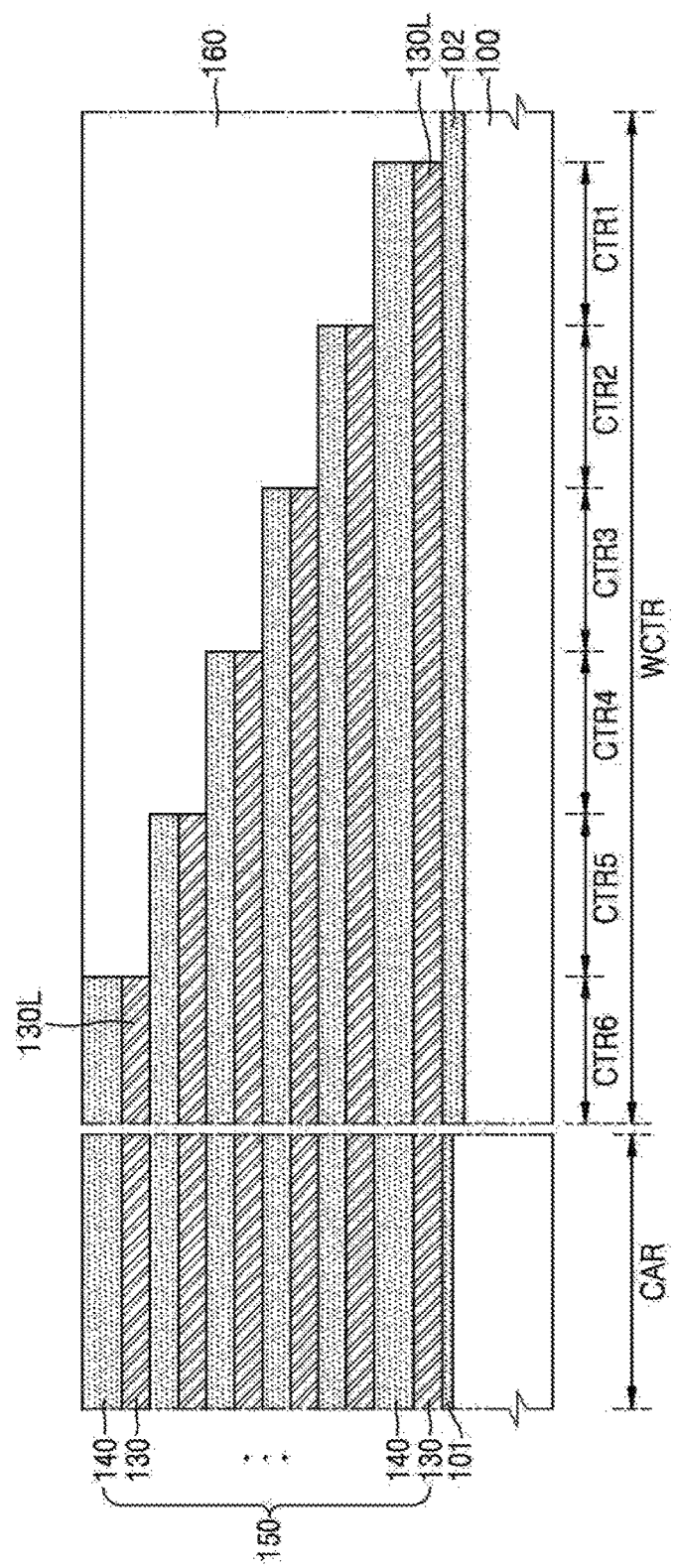
FIGS. 2A through 2N are cross-sectional views for sequentially describing a method of manufacturing an IC device according to an embodiment of the inventive concepts, and cross-sectional views illustrating the IC device according to an embodiment of the inventive concepts.
Figure 2B:
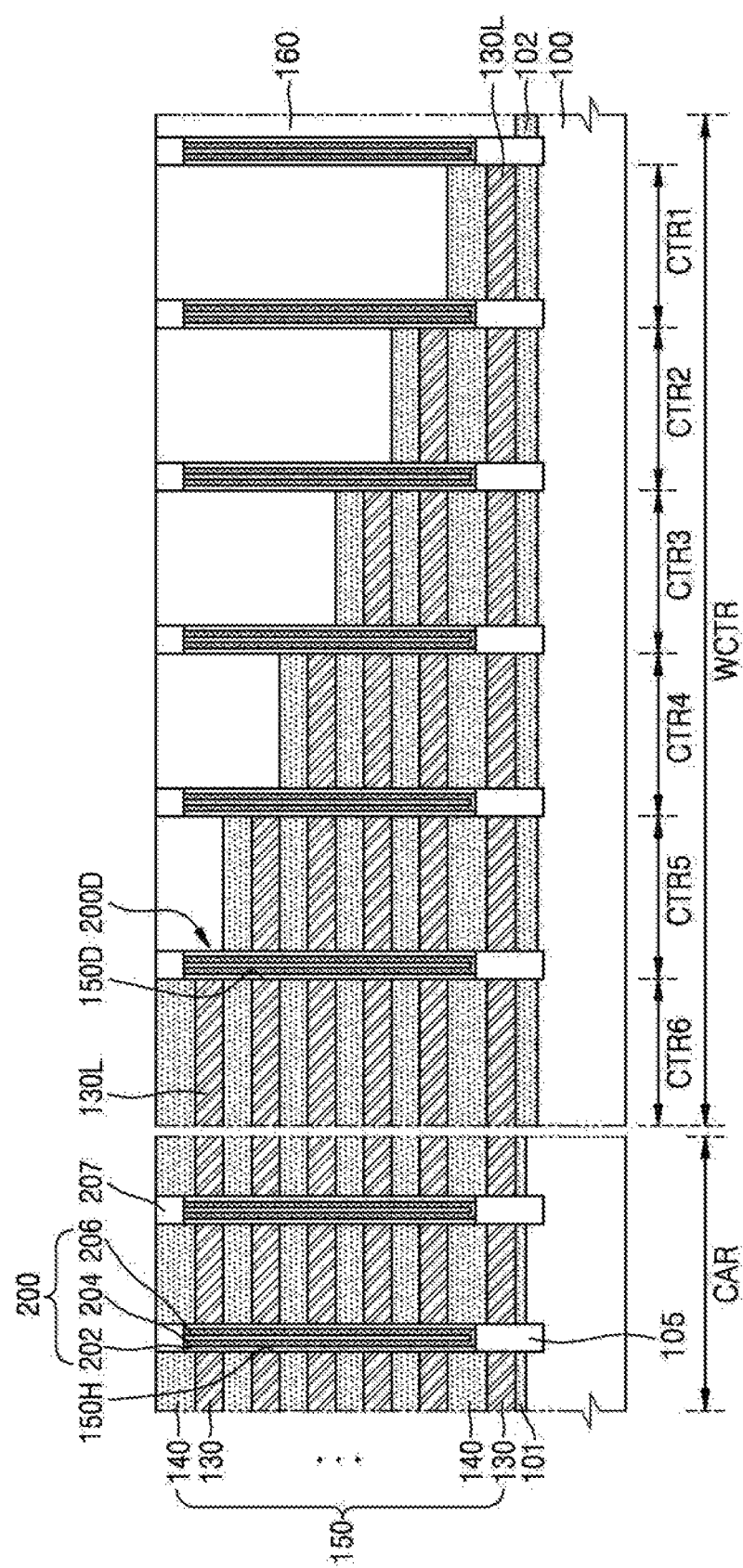
FIG. 2O is a schematic perspective view of a shape of an insulating support layer included in an IC device according to an embodiment of the inventive concepts.
Figure 2C:
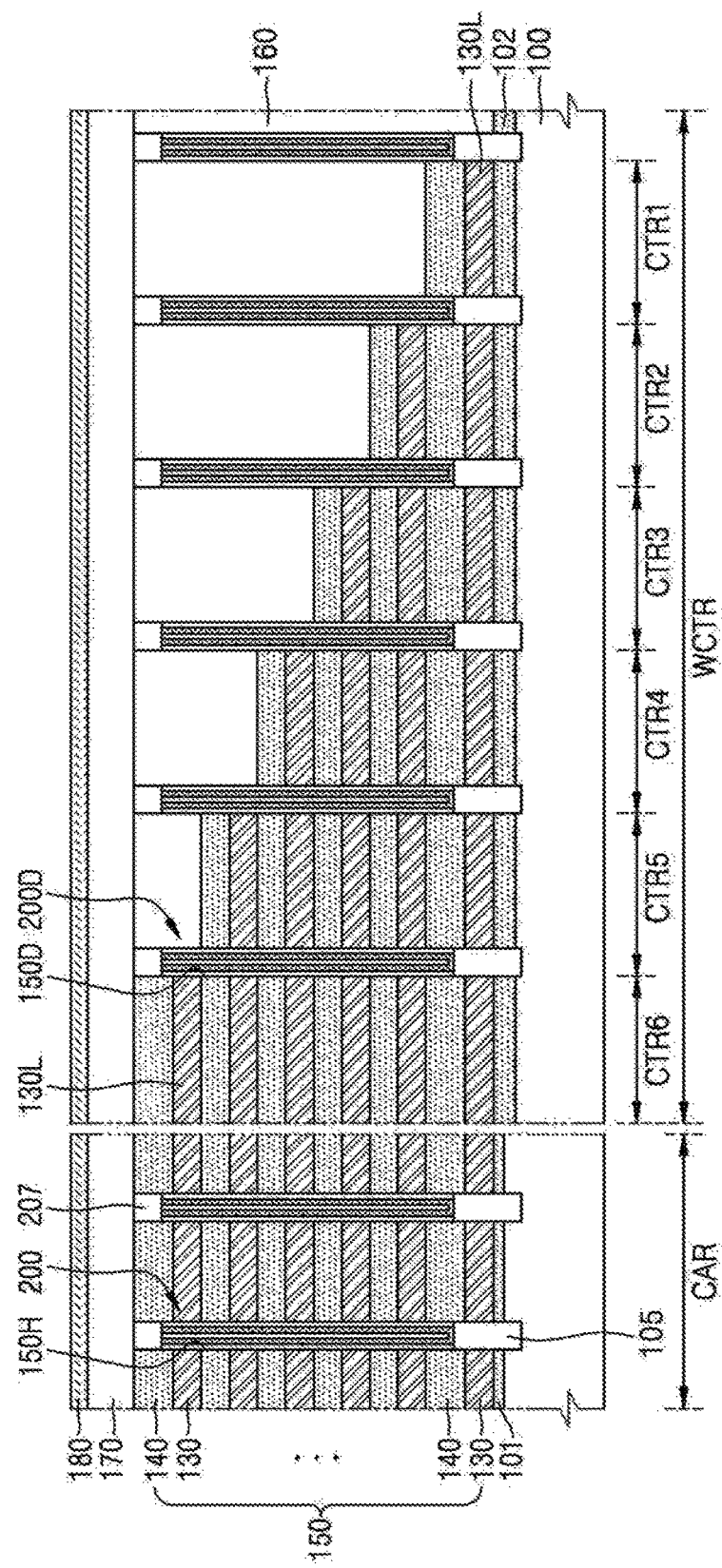
Figure 2D:
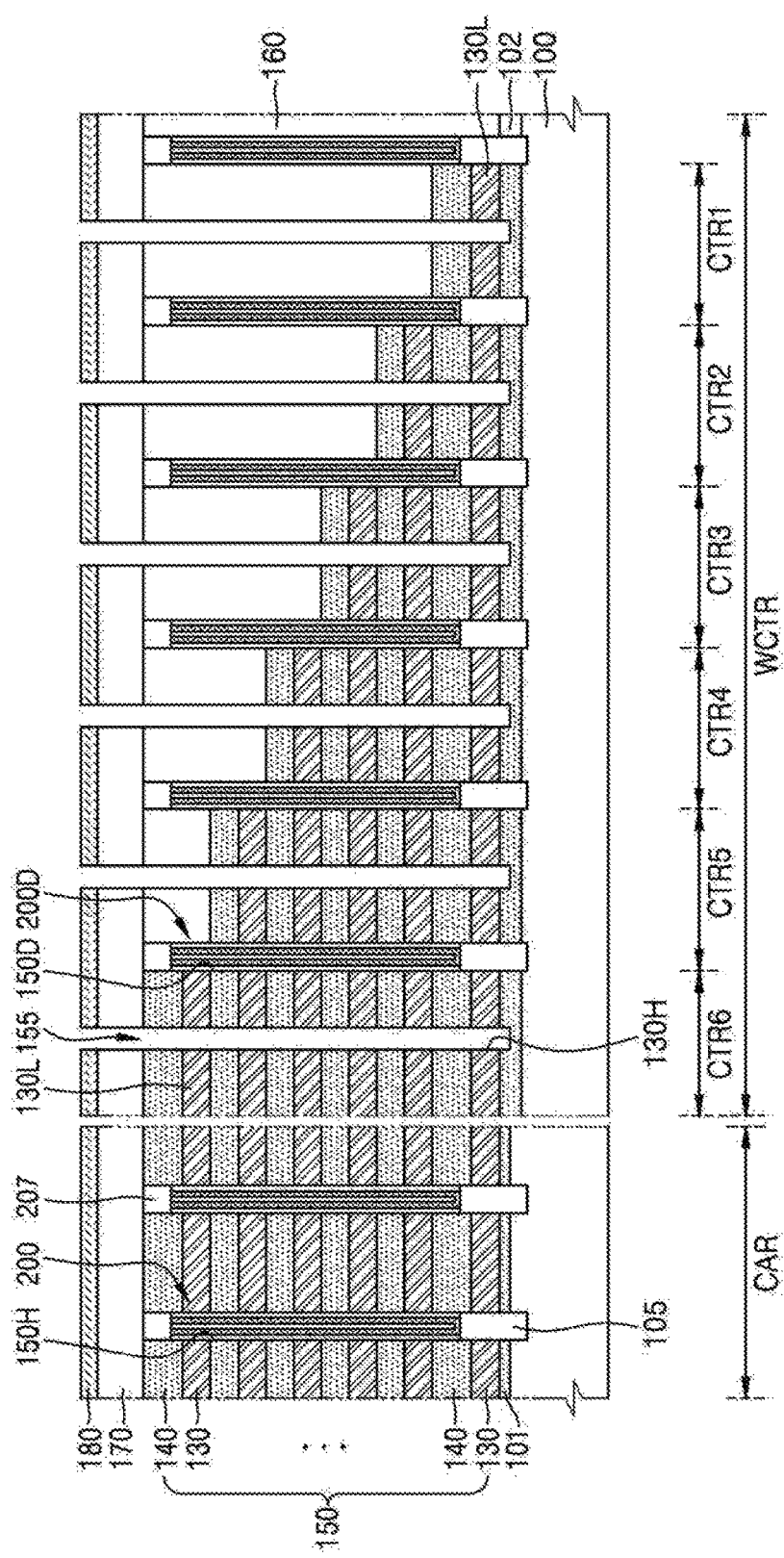
Figure 2E:
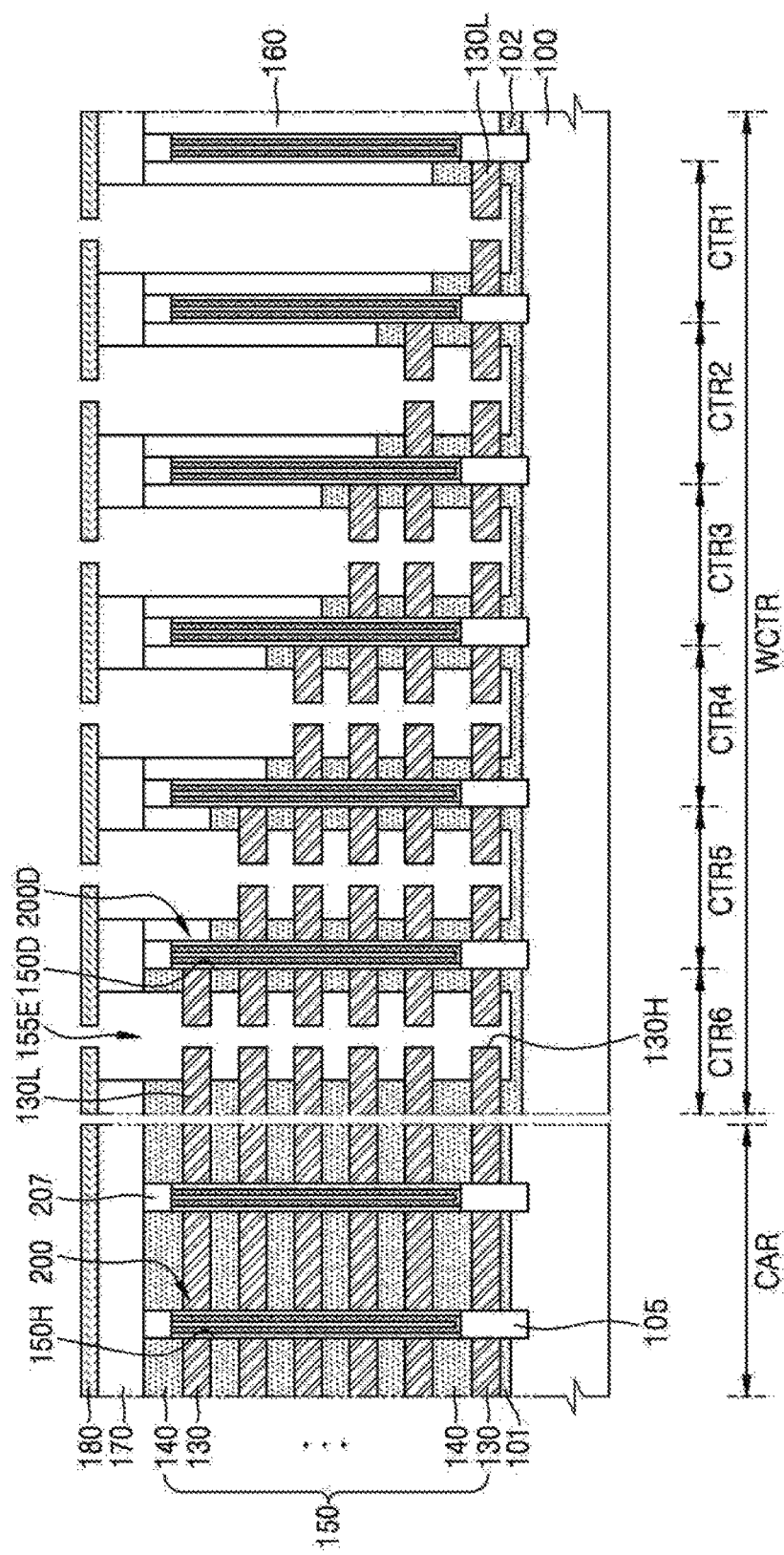
Figure 2F:
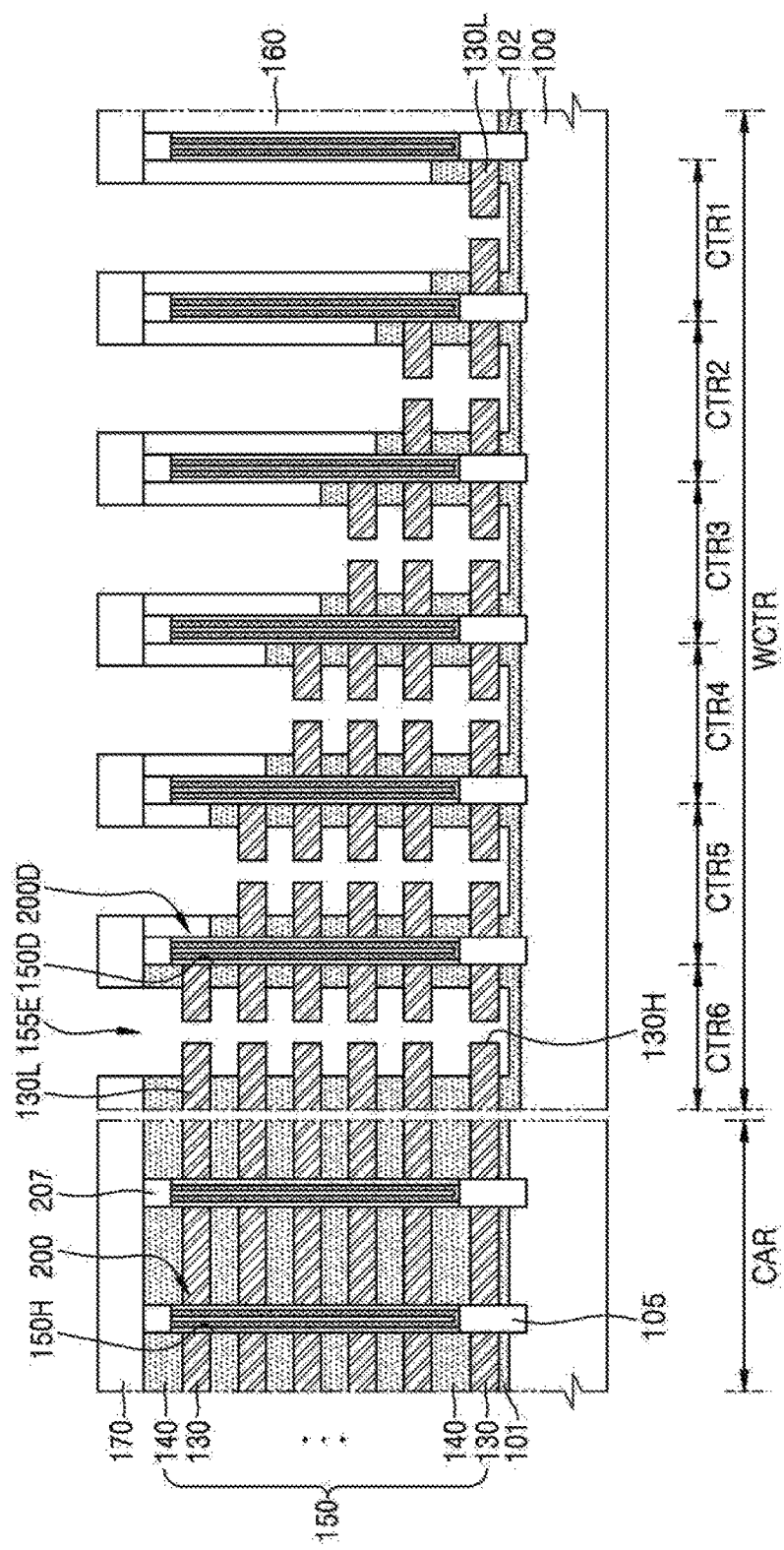
Figure 2G:
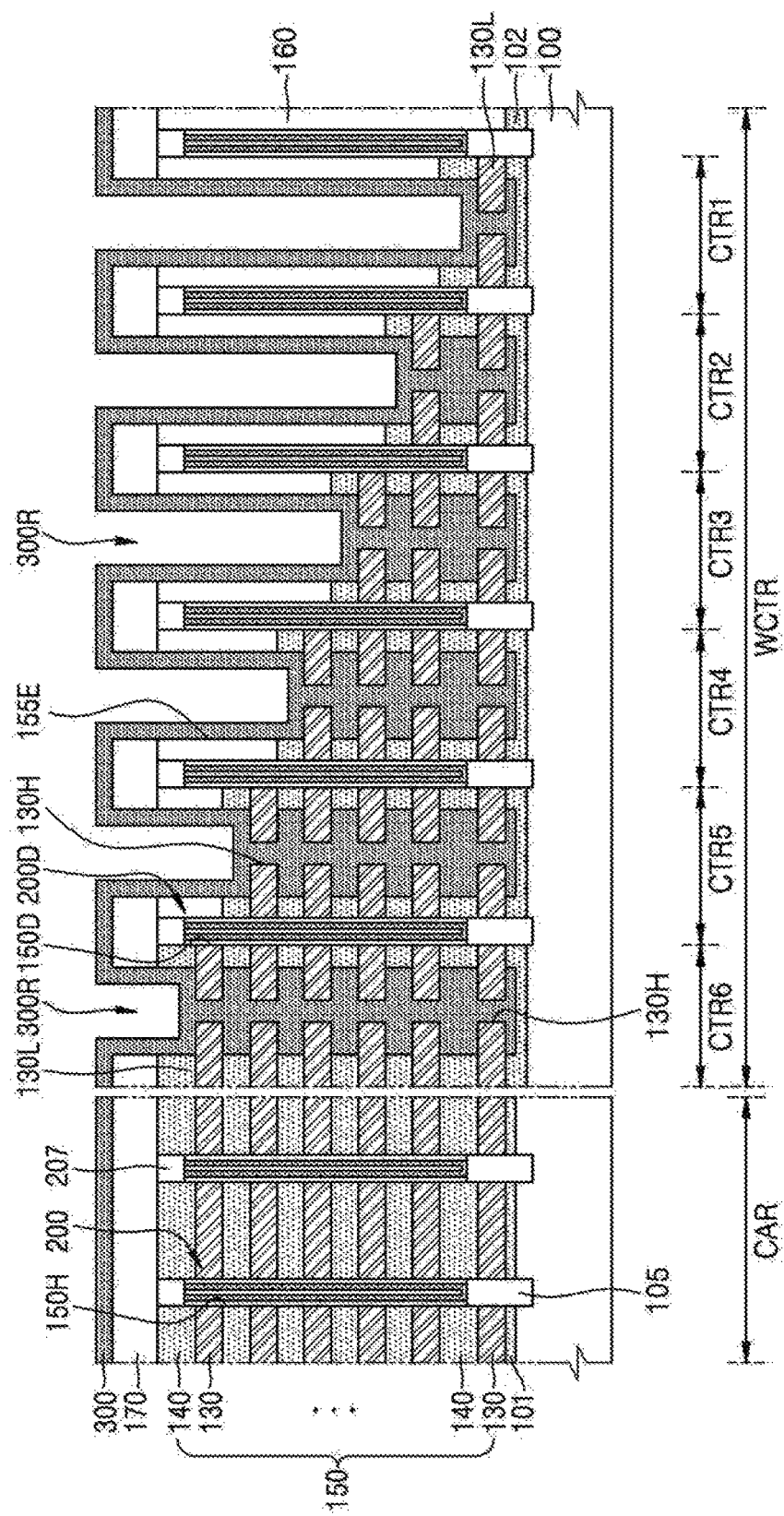
Figure 2I:
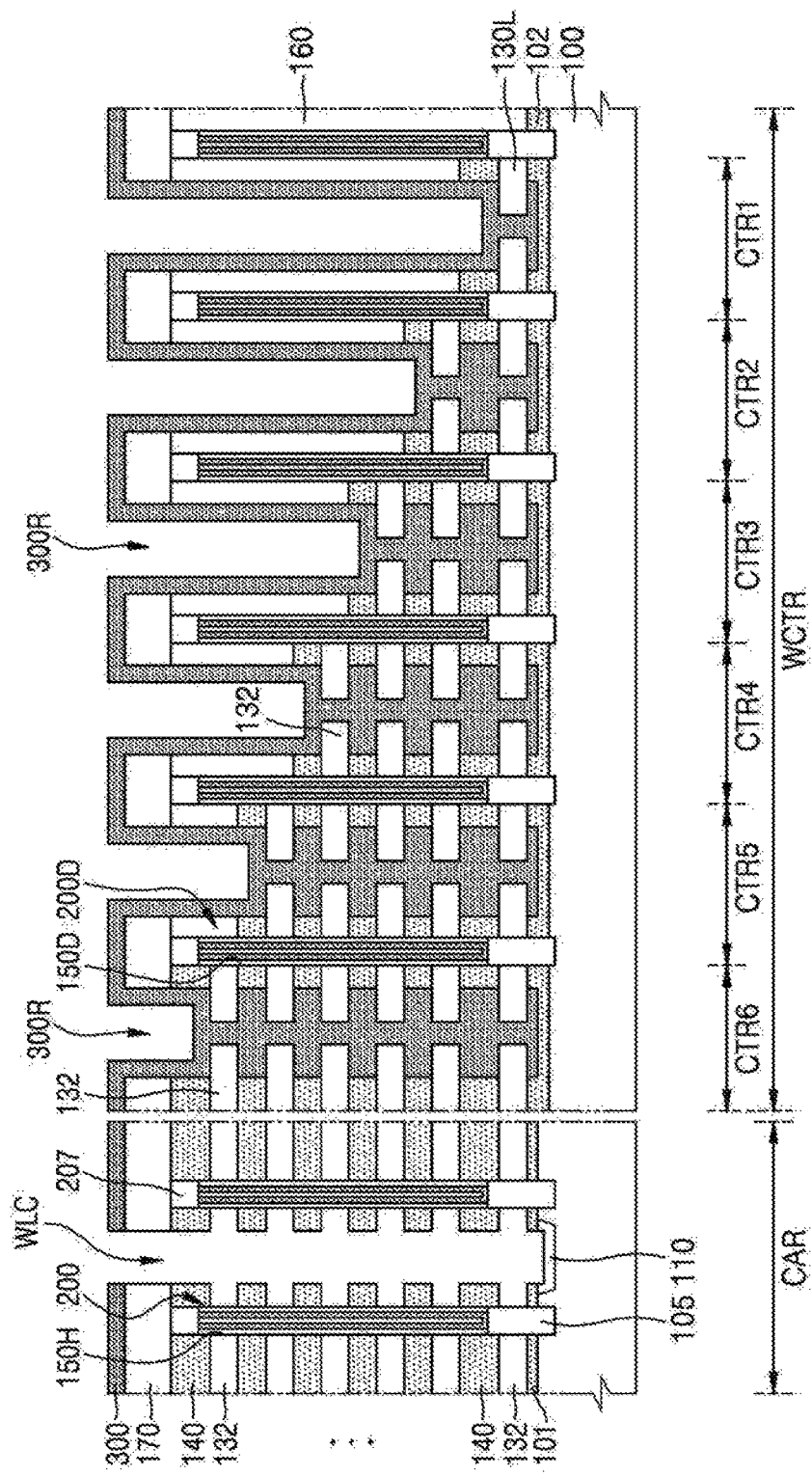
Figure 2J:
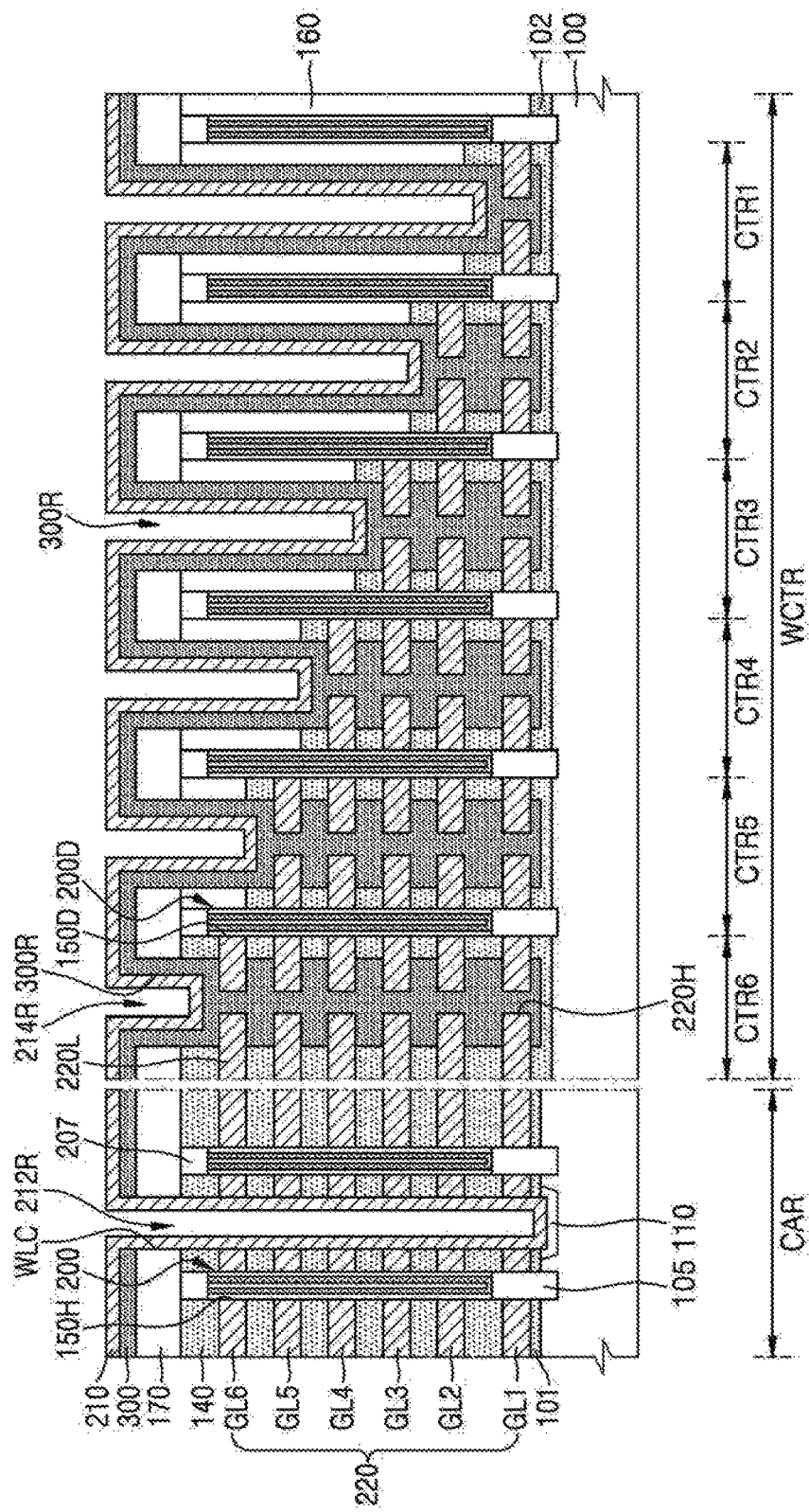
Figure 2K:
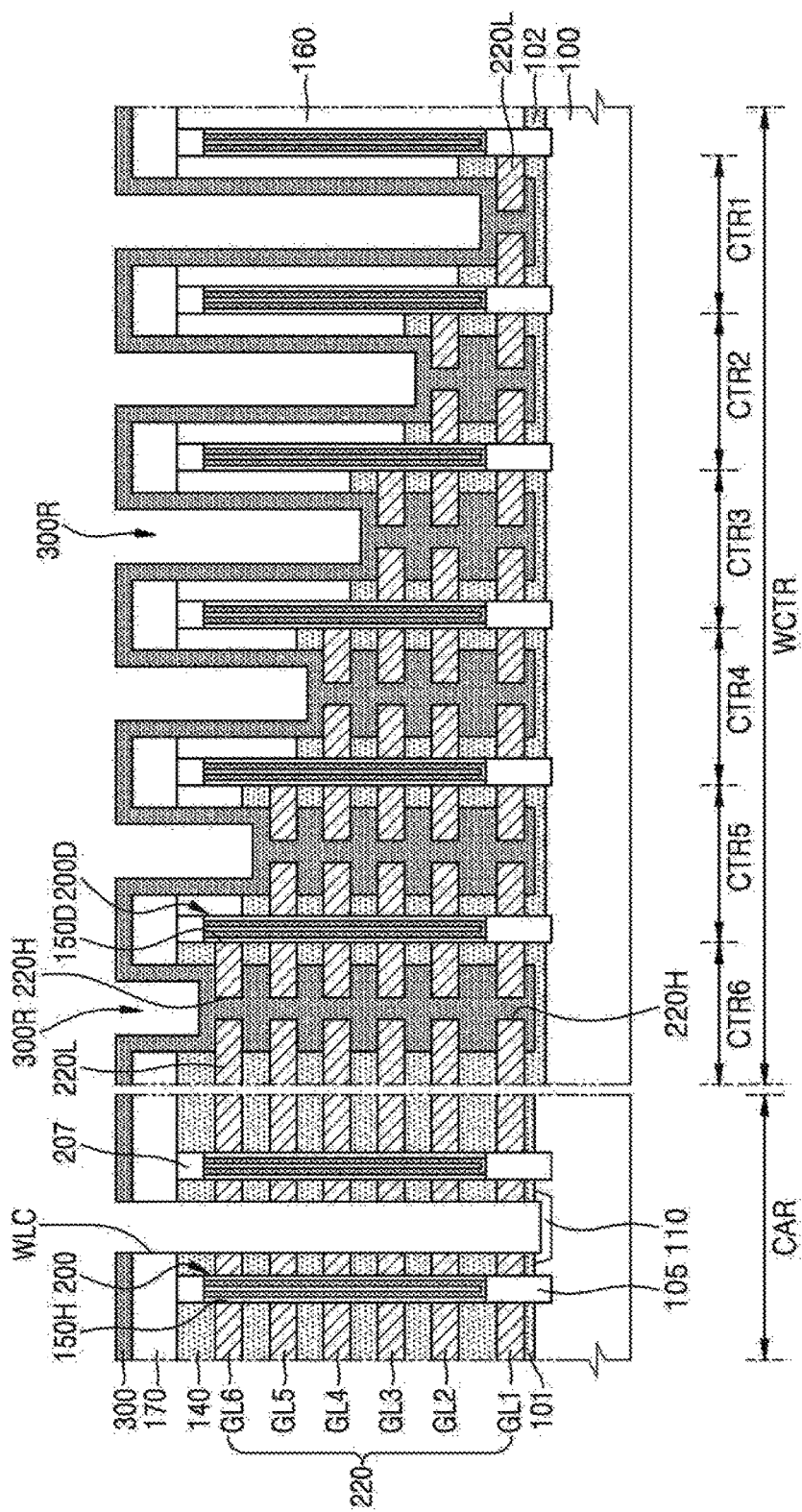
Figure 2L:
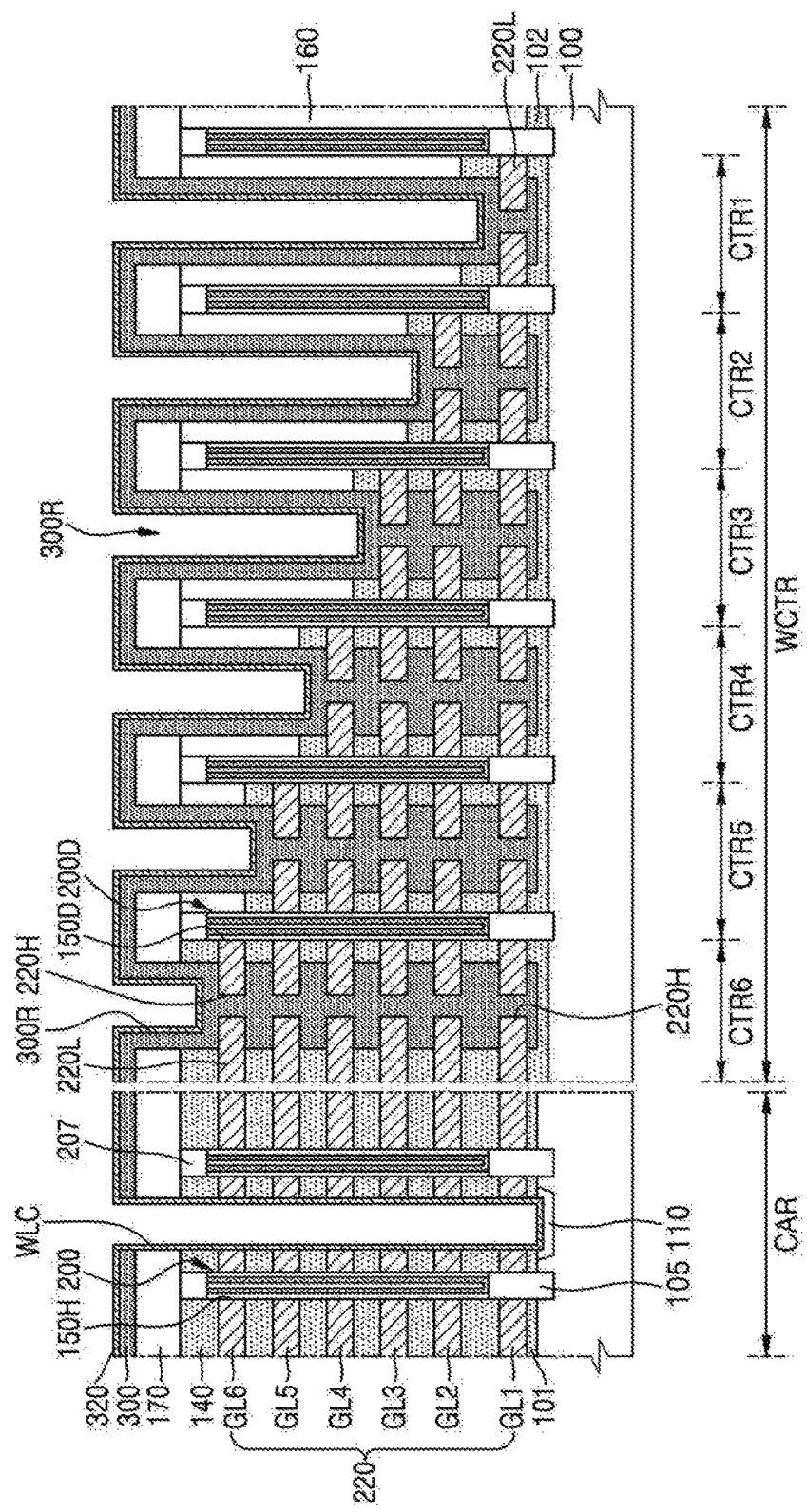
Figure 2M:
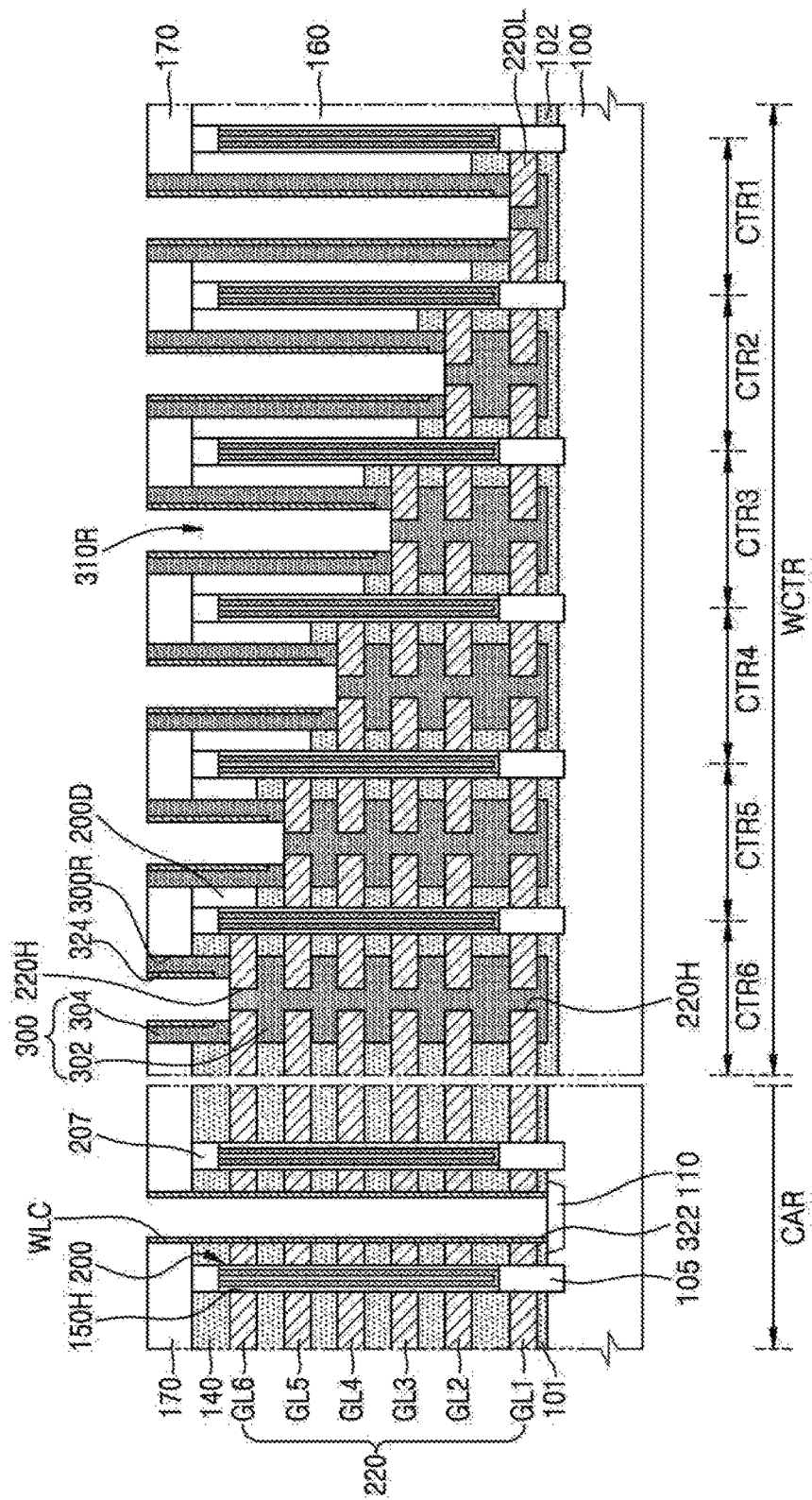
Figure 2N:
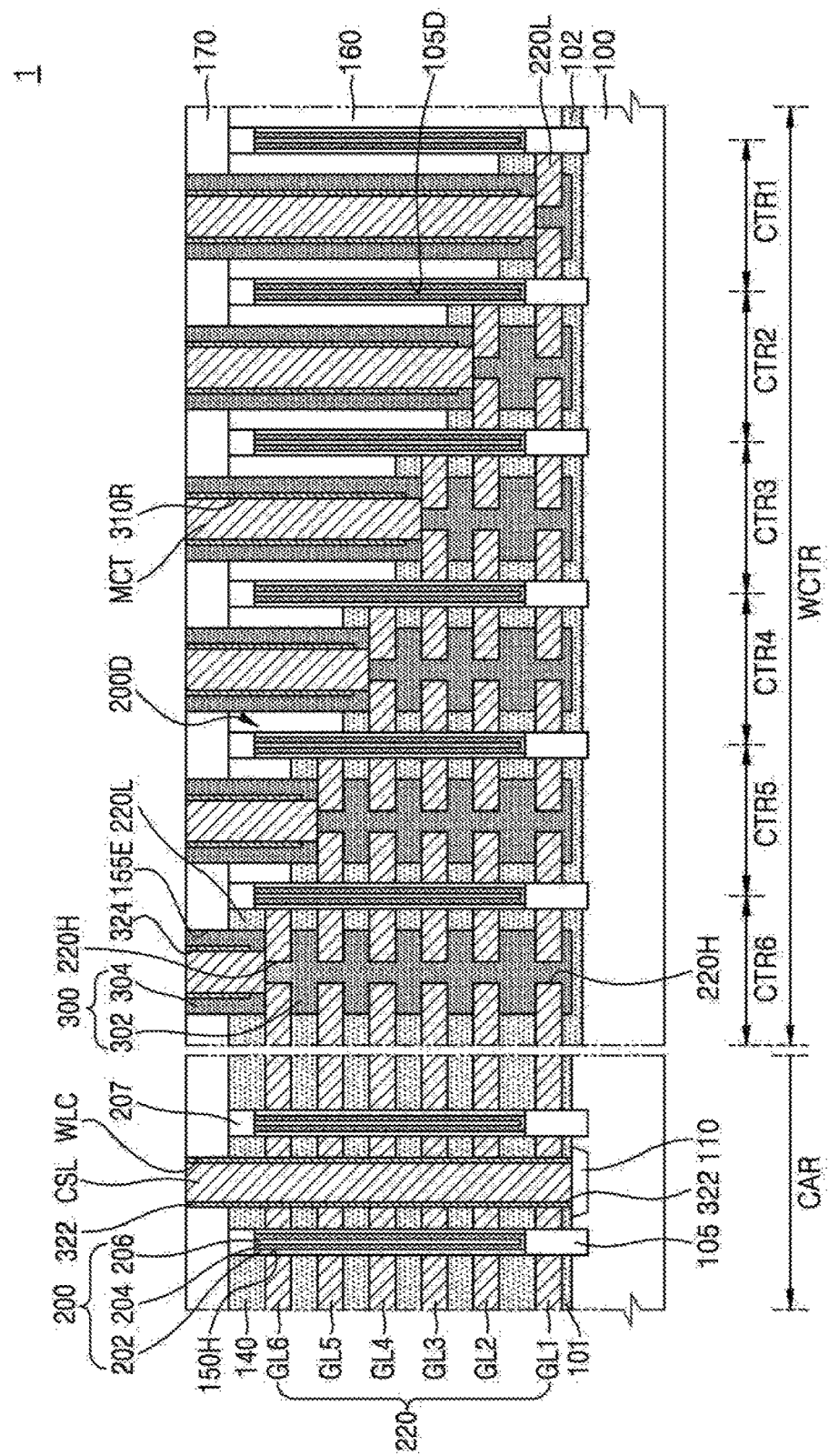
Figure 20:
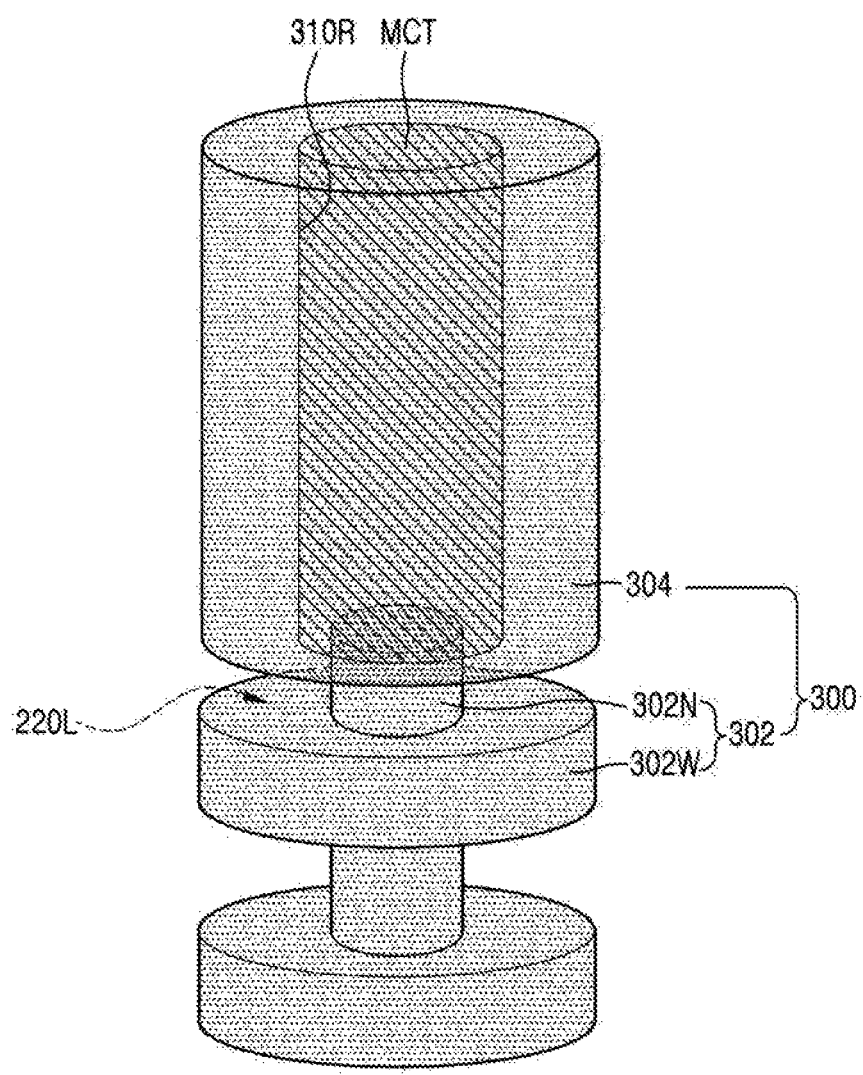

FIGS. 2A through 2N are cross-sectional views for sequentially describing a method of manufacturing an IC device according to an embodiment of the inventive concepts and cross-sectional views illustrating the IC device according to an embodiment of the inventive concepts.

Referring to FIG. 2A, the substrate 100 having a cell array region CAR and a word line contact region WCTR may be prepared. The substrate 100 may include a semiconductor material. In some embodiments, the substrate 100 may have a silicon-on-insulator (SOI) structure or a germanium-on-insulator (GeOI) structure. The substrate 100 may include a conductive region, for example, a well doped with impurities. A device isolation layer 102 defining an active region may be formed on the substrate 100 and then a thin film structure 150 may be formed by alternatively stacking a plurality of sacrificial layers 130 and a plurality of interlayer insulating layers 140 on the substrate 100 one by one. The device isolation layer 102 may be formed by performing a shallow trench isolation (STI) process.

A lower gate dielectric layer 101 may be formed in the cell array region CAR and interposed between the lowermost sacrificial layer 130 and the substrate 100. For example, the lower gate dielectric layer 101 may include silicon oxide, silicon nitride, silicon oxynitride, gallium oxide, germanium oxide, a high dielectric material, or a combination thereof. The lower gate dielectric layer 101 may be silicon oxide formed through, for example, a thermal oxidation process.

The interlayer insulating layer 140 may include, for example, silicon oxide. The sacrificial layer 130 may include a material having an etch selectivity with respect to the lower gate dielectric layer 101 and the interlayer insulating layer 140. For example, the sacrificial layer 130 may include a material having a different wet etch characteristic from that of the lower gate dielectric layer 101 and the interlayer insulating layer 140. The sacrificial layer 130 may include, for example, a silicon nitride layer, a silicon oxynitride layer, a poly silicon layer or a poly silicon germanium layer. The sacrificial layer 130 and the interlayer insulating layer 140 may be formed by using, for example, a chemical vapor deposition (CVD) method.

Among the plurality of sacrificial layers 130 and the plurality of interlayer insulating layers 140, the lower sacrificial layer 130 and the lower interlayer insulating layer 140 may have greater areas than those of the upper sacrificial layer 130 and the upper interlayer insulating layer 140. The plurality of sacrificial layers 130 may have a continuous step shape in the word line contact region WCTR. Accordingly, the plurality of sacrificial layers 130 may have different horizontal lengths. A horizontal length of each of the plurality of sacrificial layers 130 may be reduced upwardly from the substrate 100. For example, the lowermost sacrificial layer 130 may have the longest horizontal length, and the uppermost sacrificial layer 130 may have the shortest horizontal length. A horizontal length of each of the plurality of interlayer insulating layer 140 may be substantially the same as the horizontal length of the sacrificial layer 130 arranged below each of the interlayer insulating layer 140.

The word line contact region WCTR may include a plurality of contact regions CTR1~CTR6. The number of the plurality of contact regions CTR1~CTR6 may be the same as the number of the plurality of sacrificial layers 130. A portion forming a step board having a step shape included in the plurality of sacrificial layers 130 may be arranged in each of the plurality of contact regions CTR1~CTR6. The portion forming the step board of each of the plurality of sacrificial layers 130 in the step shape may be a preparatory landing portion 130L. The preparatory landing portion 130L may be a portion that does not include the next sacrificial layer 130 at an upper part thereof in a direction perpendicular to a main surface of the substrate 100 at an end of each of the plurality of sacrificial layers 130. A contact plug landing portion 220L of FIG. 2N that is a portion of a plurality of gate electrode layers 220 of FIG. 2N to which a word line contact plug MCT of FIG. 2N, that will be described below, is connected may be formed in the portion in which the preparatory landing portion 130L is formed.

That is, the preparatory landing portion 130L of the lowermost sacrificial layer 130 may be arranged in the first contact region CTR1. The preparatory landing portions 130L of the second, third, fourth, and fifth sacrificial layers 130 from the lowermost sacrificial layer 130 may be respectively arranged in the second, third, fourth, and fifth contact regions CTR2, CTR3, CTR4, and CTR5. The preparatory landing portion 130L of the uppermost sacrificial layer 130 may be arranged in the sixth contact region CTR6.

A first insulting layer 160 may include an upper surface at the same level as that of the uppermost interlayer insulating layer 140. The first insulating layer 160 may include silicon oxide, silicon nitride, silicon oxynitride, or a low-k material having a low dielectric constant.

Referring to FIG. 2B, a plurality of channel holes 150H and a plurality of dummy holes 150D may be respectively formed in the cell region CAR and the word line contact region WCTR, respectively. The plurality of channel holes 150H and the plurality of dummy holes 150D may be formed by forming a mask pattern (not shown) on the thin film structure 150 and the first insulating layer 160 and continuously, anisotropically etching the thin film structure 150, the first insulating layer 160, and the lower gate insulating layer 101 by using the mask pattern as an etch mask until an upper surface of the mask 100 is exposed. The plurality of channel holes 150H may pass through the lower gate insulating layer 101, and thus the substrate 100 may be exposed through the plurality of channel holes 150H.

The plurality of channel holes 150H may expose side walls of the sacrificial layers 130 and the interlayer insulating layers 140. In some embodiments, during formation of the plurality of channel holes 150H, the upper surface of the substrate 100 exposed through the plurality of channel holes 150H may be recessed at a desired (or, alternatively a predetermined) depth through over etch. The plurality of dummy holes 150D may pass through the device isolation layer 102, and thus the substrate 100 may be exposed through a bottom surface of each of the plurality of dummy holes 150D; but the inventive concepts are not limited thereto. In some embodiments, the plurality of dummy holes 150D may not pass through the device isolation layer 102, and thus the device isolation layer 102 may be exposed through the bottom surface of each of the plurality of dummy holes 150D and the substrate 100 may not be exposed through the bottom surfaces of the plurality of dummy holes 150D. The plurality of channel holes 150H and the plurality of dummy holes 150D may have a hole shape of a circular cross section and may be simultaneously formed through anisotropic etching.

A plurality of semiconductor patterns 105 that partially fill a lower portion of each of the plurality of channel holes 150H may be formed by performing a selective epitaxial growth (SEG) process that uses the upper surface of the substrate 100 exposed through the plurality of channel holes 150H as a seed. When the substrate 100 is exposed through the bottom surface of each of the plurality of dummy holes 150D, the semiconductor pattern 105 may be formed to partially fill the lower portion of each of the plurality of dummy holes 150D. In some embodiments, when the substrate 100 is not exposed through the bottom surfaces of the plurality of dummy holes 150D and the device isolation layer 102 is exposed through the bottom surfaces of the plurality of dummy holes 150D, the semiconductor pattern 105 may not be formed in the lower portion of each of the plurality of dummy holes 150D. The semiconductor pattern 105 may include single crystal silicon or single crystal silicon-germanium. In some embodiments, the semiconductor pattern 105 may further include ions doped with impurities. An upper surface of each of the plurality of semiconductor patterns 105 may be positioned at a higher level than that of an upper surface of the lowermost sacrificial layer 130.

A vertical channel structure 200 and a contact pad 207 may be formed in each of the plurality of channel holes 150H. At the same time, a dummy pillar 200D and the contact pad 207 may be formed in each of the plurality of dummy holes 150D. The vertical channel structure 200 may include a gate dielectric layer pattern 202, a vertical channel pattern 204, and a filling insulating layer 206. The vertical channel structure 200 may vertically pass through the plurality of sacrificial layers 130 and the plurality of interlayer insulating layers 140 so that the vertical channel structure 200 may be in contact with the semiconductor pattern 105 and may be electrically connected to the substrate 100. A bottom surface of the vertical channel structure 200 may be positioned at a higher level than that of the upper surface of the lowermost sacrificial layer 130. When the semiconductor pattern 105 is formed in the lower portion of each of the plurality of dummy holes 150D, the dummy pillar 200D may have the same structure as the vertical channel structure 200, and thus a detailed description thereof is omitted. In some embodiments, when the semiconductor pattern 105 is not formed in the lower portion of each of the plurality of dummy holes 150D, the dummy pillar 200D may pass through the lowermost sacrificial layer 130, and thus the dummy pillar 200D may be in contact with the device isolation layer 102. In this case, the dummy pillar 200D may be electrically insulated from the substrate 100 by the device isolation layer 102. A bottom surface of the dummy pillar 200D may be positioned at a lower level than that of the lower surface of the lowermost sacrificial layer 130. In this case, the bottom surface of the dummy pillar 200D may be positioned at a lower level than that of the bottom surface of the vertical channel structure 200.

The gate dielectric layer pattern 202 may be a hollow cylindrical shape in the channel hole 150H and the dummy hole 150D. The gate dielectric layer pattern 202 may include a blocking insulating layer, a charge storage layer, and a tunnel insulating layer. For example, the gate dielectric layer pattern 202 may include silicon oxide, silicon nitride, silicon oxynitride, gallium oxide, germanium oxide, a high dielectric material, or a combination thereof. In some embodiments, the gate dielectric layer pattern 202 may include a plurality of insulating layers.

The vertical channel pattern 204 may be formed in a hollow cylindrical shape or a cup shape. The filling insulating layer 206 may be filled in an empty region defined by the vertical channel pattern 204. Alternatively, the vertical channel pattern 204 may be a solid shape with no filling. The vertical channel pattern 204 may be, for example, a semiconductor material doped with impurities or an intrinsic semiconductor material that is not doped with impurities. For example, the vertical channel pattern 204 may include silicon (Si), germanium (Ge), or a combination thereof. The filling insulating layer 206 may include an insulating material having an excellent gap-fill characteristic. For example, the filling insulating layer 206 may include a high density plasma oxide layer, a spin on glass (SOG) layer, or a CVD oxide layer, etc.

The contact pad 207 may be formed on the vertical channel structure 200 and the dummy pillar 200D. The contact pad 207 may include impurity-doped poly silicon or a metal material.

Referring to FIG. 2C, a second insulating layer 170 covering the substrate 100 in which the vertical channel structure 200 and the dummy pillar 200D are formed and a cover layer 180 covering the second insulating layer 170 may be formed. For example, the second insulating layer 170 may include the same or similar material as the first insulating layer 160. For example, the cover layer 170 may include poly silicon.

Referring to FIG. 2D, at least one contact hole 155 may be formed in each of the plurality of contact regions CTR1~CTR6 of the word line contact region WCTR. The contact hole 155 may be formed to pass through the cover layer 180, the second insulating layer 170, the at least one interlayer insulating layer 140, the at least one sacrificial layer 130 and/or the preparatory landing portion 130L in each of the plurality of contact regions CTR1~CTR6. The contact hole 155 may be formed by forming a mask pattern (not shown) on the cover layer 180 and continuously, anisotropically etching the cover layer 180, the second insulating layer 170, the at least one interlayer insulating layer 140, the at least one sacrificial layer 130 and/or the preparatory landing portion 130L by using the mask pattern as an etch mask. In some embodiments, the contact hole 155 may be formed to pass through the sacrificial layer 130 formed in each of the plurality of contact regions CTR1~CTR6. In some embodiments, the contact hole 155 may be formed to pass through the preparatory landing portion 130L formed in each of the plurality of contact regions CTR1~CTR6 and not to pass through at least one of the sacrificial layers 130 except for the preparatory landing portion 130L in some of the plurality of contact regions CTR1~CTR6. In some embodiments, the device isolation layer 102 may be exposed in a bottom surface of the contact hole 155, whereas the substrate 100 may not be exposed. In some embodiments, the substrate 100 may be exposed through the bottom surface of the contact hole 155. That is, the contact hole 155 may pass through the preparatory landing portion 130L formed in each of the plurality of contact regions CTR1~CTR6, while passing or not passing through a portion of the sacrificial layer 130 below the preparatory landing portion 130L and the device isolation layer 102 because the first insulating layer 160, the sacrificial layer 30, and the interlayer insulating layer 140 that fill between the cover layer 180 and the substrate 100 may have different occupancies in each of the plurality of contact regions CTR1~CTR6. A portion of the contact hole 155 that exposes side walls of the sacrificial layer 130 may be a through hole 130H. Thus, in each of the plurality of contact regions CTR1~CTR6, the through hole 130H may be formed in the preparatory landing portion 130L while may not be formed in some of the sacrificial layers 130 except for the preparatory landing portion 130L.

Referring to FIG. 2E, an extension contact hole 155E may be formed by partially removing portions of the second insulating layer 170, the first insulating layer 160, and the interlayer insulating layer 140 that are exposed through the contact hole 155 of FIG. 2D. To form the extension contact hole 155E, a wet etching process having etch selectivity may be performed on insulating layers such as the second insulating layer 170, the first insulating layer 160, and the intermediate insulating layer 140. Thus, during a process of forming the extension contact hole 155E, the second insulating layer 170, the first insulating layer 160, and the intermediate insulating layer 140 may be partially removed, whereas the cover layer 180 and the sacrificial layer 130 may not be removed. A portion of an upper surface of at least the preparatory landing portion 130L around the through hole 130H may be exposed through the extension contact hole 155E. Thereafter, referring to FIG. 2F, an upper portion of the extension contact hole 155E may be wholly exposed by removing the cover layer 180.

Referring to FIG. 2G, a support insulating layer 300 may be formed on the substrate 100 in which the extension contact hole 155E is formed. The support insulating layer 300 may be conformally formed to have a uniform thickness on an inner surface of the extension contact hole 155E and an upper surface of the second insulating layer 170. The support insulating layer 300 may fill a portion of the extension contact hole 155E of a lower side of an upper surface of the preparatory landing portion 130L and may cover the upper surface of the preparatory landing portion 130L and side walls of the extension contact hole 155E of a higher side of the upper surface of the preparatory landing portion 130L. An insulating layer recesses 300R that are not filled by the support insulating layer 300 may be formed in the extension contact hole 155E. A bottom surface of the insulating layer recess 300R may have a higher level than the upper surface of the preparatory landing portion 130L. The support insulating layer 300 may be formed by using, for example, an atomic layer deposition (ALD) method. The support insulating layer 300 may include an insulating material such as silicon oxide. The support insulating layer 300 may have a thickness equal to or greater than ½ of a diameter of the through hole 130H and ½ of a gap between the adjacent two sacrificial layers 130 and may fill the through hole 130H and between the adjacent two sacrificial layers 130.

Referring to FIG. 2H, a word line cut trench WLC that exposes the substrate 100 between the vertical channel structures 200 may be formed in the cell array region CAR. Thereafter, a common source region 110 may be formed by injecting impurity ions into the substrate 100 through the word line cut trench WLC. The common source line 110 may have a conductive type opposite to that of the substrate 100. The word line cut trench WLC may vertically pass through the support insulating layer 300, the second insulating layer 170, the plurality of interlayer insulating layers 140, the plurality of sacrificial layers 130, and the lower gate insulating layer 101, and thus the substrate 100 may be exposed through the word line cut trench WLC. The word line cut trench WLC may be spaced apart from the vertical channel structure 200, and thus side walls of the support insulating layer 300, the second insulating layer 170, the plurality of interlayer insulating layers 140, the plurality of sacrificial layers 130, and the lower gate insulating layer 101 may be exposed through the word line cut trench WLC. The word line cut trench WLC may have a line shape, a bar shape, or a rectangular cross section.

In some embodiments, during formation of the word line cut trench WLC, the upper surface of the substrate 100 exposed through the word line cut trench WLC may be recessed by over etching.

Referring to FIG. 2I, a sacrificial layer removal space 132 may be formed by selectively removing the sacrificial layer 130 of FIG. 2H exposed through the word line cut trench WLC. The sacrificial layer removal space 132 may form the sacrificial layer 130 through the word line cut trench WLC via an isotropic etching process by using an etch liquid having etch selectivity with respect to the support insulating layer 300, the second insulating layer 170, the plurality of interlayer insulating layers 140 and the lower gate insulating layer 101. For example, when the sacrificial layer 130 is a silicon nitride layer, and the interlayer insulating layer 140, the lower gate insulating layer 101, and the second insulating layer 170 are silicon oxide layers, an etching process may be performed by using the etch liquid including phosphoric acid. The sacrificial layer removal space 132 may horizontally extend from the word line cut trench WLC between the plurality of interlayer insulating layers 140 to partially expose side walls of the vertical channel structure 200. The plurality of interlayer insulating layers 140 may be supported by the support insulating layer 300 even if the sacrificial layer 130 is removed, and thus the plurality of interlayer insulating layers 140 may not collapse.

Referring to FIG. 2J, a conductive material layer 210 filling the sacrificial layer removal space 132 may be formed. The conductive material layer 210 may entirely fill the sacrificial layer removal space 132 and conformally cover inner surfaces of the word line cut trench WLC and the insulating layer recesses 300R so that a first recess 212R and a second recess 214R that are limited by the conductive material layer 210 may be formed, respectively, in the word line cut trench WLC and the insulating layer recess 300R. The conductive material layer 210 may include at least one of impurity-doped polysilicon, tungsten, metal nitride layers, and metal silicides.

Referring to FIG. 2K, a plurality of gate electrode layers 220 that are portions of the conductive material layer 210 filling the sacrificial layer removal space 132 may be formed by removing a portion of the conductive material layer 210 of FIG. 2J formed in the word line cut trench WLC and the insulating layer recesses 300R and a portion of the conductive material layer 210 formed on the second insulating layer 170. A contact plug landing portion 220L that is a portion forming a step board having a step shape included in the plurality of gate electrode layers 220 may be arranged in each of the plurality of contact regions CTR1~CTR6. The contact plug landing portion 220L may be a portion that does not include a gate electrode layer 220 there above in a vertical direction with respect to a main surface of the substrate 100 at an end of each of the plurality of gate electrode layers 220. That is, each of the plurality of gate electrode layers 220 may include the contact plug landing portion 220L at an end thereof. The contact plug landing portion 220L may be a portion of the gate electrode layer 220 formed in a portion corresponding to the preparatory landing portion 130L of FIG. 2A. The gate electrode layer 220 may include a support hole 220H corresponding to the through hole 130H of FIG. 2D of the sacrificial layer 130 of FIG. 2D.

Referring to FIG. 2L, a spacer layer 320 conformally, covering a surface of the substrate 100 in which the gate electrode layer 220 is formed, may be formed. The spacer layer 320 may cover an upper surface of the support insulating layer 300, an inner surface of the word line cut trench WLC, and an inner surface of the insulating layer recesses 300R while not entirely filling the word line cut trench WLC and the insulating layer recesses 300R. The spacer layer 320 may include silicon oxide, silicon nitride, silicon oxynitride, or a low dielectric material.

Referring to FIG. 2M, a trench spacer 322 and hole spacers 324 that respectively cover side walls of the word line cut trench WLC and side walls of the insulating layer recesses 300R may be formed by removing a portion of the spacer layer 320 of FIG. 2L formed in the upper surface of the support insulating layer 300, a bottom surface of the word line cut trench WLC, and a bottom surface of the insulating layer recesses 300R of FIG. 2L by removing the portion of the spacer layer 320 and the portion of the support insulating layer 300 until an upper surface of the second insulating layer 170 is exposed. During a process of forming the hole spacers 324, extension insulating layer recesses 310R exposing a part of an upper surface of the contact plug landing portions 220L around the support holes 220H may be formed by removing a part of the support insulating layer 300 positioned on a part of the upper surface of the contact plug landing portions 220L around the support holes 220H. Thus, the support insulating layer 300 may be separated into a support portion 302 of a lower side of the upper surface of the contact plug landing portions 220L and a spacer portion 304 of a higher side of the upper surface of the contact plug landing portions 220L. The support portion 302 of the support insulating layer 300 may be a portion filling the extension contact hole 155E of a lower side of the upper surface of the contact plug landing portion 220L. The spacer portion 304 of the support insulating layer 300 may be a portion covering side walls of the extension contact hole 155E of a higher side of the upper surface of the contact plug landing portions 220L.

Referring to FIG. 2N, an integrated circuit (IC) device 1 may be formed by forming the common source line CSL filling a space of the word line cut trench WLC limited by the trench spacer 322 and the word line contact plugs MCT filling the extension insulating layer recesses 310R.

The common source line CSL and the word line contact plugs MCT may include a conductive material. For example, the common source line CSL and the word line contact plugs MCT may include metal, conductive metal nitride, transition metal, or a combination thereof. The common source line CSL and the word line contact plugs MCT may be formed by forming a conductive material covering the second insulating layer 170 and filling the space of the word line cut trench WLC limited by the trench spacer 322 and the extension insulating layer recesses 310R, and removing a part of the conductive material on the upper surface of the second insulating layer 170. The common source line CSL and the word line contact plugs MCT may be formed by using the same conductive material, and thus the common source line CSL and the word line contact plugs MCT may include the same conductive material. In some embodiments, a metal silicide layer (not shown) for reducing a contact resistance may be disposed between the common source line CSL and the common source region 110. The word line contact plugs MCT may be in contact with the upper surface of respective contact plug landing portions 220L of the gate electrode layer 220, and may be electrically connected to the gate electrode layer 220. A bottom surface of the word line contact plugs MCT may be in contact with a part of the upper surface of the support portion 302 of the support insulating layer 300 and the upper surface of the contact plug landing portion 220L around the support hole 220H.

The IC device 1 may include the substrate 100 including the cell array region CAR and the word line contact region WCTR, the plurality of gate electrode layers 220 alternately stacked on the substrate 100 one by one, and the interlayer insulating layers 140. The plurality of gate electrode layers 220 may extend from the cell array region CAR to the word line contact region WCTR and may have a continuous step shape in the word line contact region WCTR.

The lower gate electrode 220 among the plurality of gate electrode layers 220 may have a larger area than the upper gate electrode 220. The plurality of gate electrode layers 220 may have the continuous step shape in the word line contact region WCTR. Accordingly, the plurality of gate electrode layers 220 may have different horizontal lengths. A horizontal length of each of the plurality of gate electrode layers 220 may be reduced upwardly from the substrate 100. For example, the lowermost gate electrode 220 may have the longest horizontal length, and the uppermost gate electrode 220 may have the shortest horizontal length.

The word line contact region WCTR may include the plurality of contact regions CTR1~CTR6. The contact plug landing portion 220L, that is a respective portion of each of the plurality of gate electrode layers 220, may be arranged in each of the plurality of contact regions CTR1~CTR6. The contact plug landing portion 220L may be a portion that does not include the gate electrode layer 220 at an upper portion thereof in a vertical direction with respect to a main surface of the substrate 100 at an end of each of the plurality of gate electrode layers 220. That is, each of the plurality of gate electrode layers 220 may include the contact plug landing portion 220L at an end thereof. The contact plug landing portion 220L may be a portion of the gate electrode layer 220 formed in a portion corresponding to the preparatory landing portion 130L of FIG. 2A.

The plurality of gate electrode layers 220 may include first through sixth gate electrode layers GL1~GL6 that are sequentially arranged from the lowest part to a highest part. This embodiment shows a case where the plurality of gate electrode layers 220 include six gate electrode layers of the first through sixth gate electrode layers GL1~GL6, but the inventive concepts are not limited thereto. The plurality of gate electrode layers 220 may include seven or more gate electrode layers. The contact plug landing portions 220L that are a part of the first through sixth gate electrode layers GL1~GL6, respectively, may be arranged in each of the first through sixth contact regions CTR1~CTR6. A part of the gate electrode layer 220 may not be arranged above of the contact plug landing portion 220L in each of the first through sixth contact regions CTR1~CTR6.

The semiconductor pattern 105, the vertical channel structure 200, and the contact pad 207 may be formed in the plurality of channel holes 150H in the cell array region CAR. At the same time, the semiconductor pattern 105, the dummy pillar 200D, and the contact pad 207 may be formed in the plurality of dummy holes 150D. The dummy pillar 200D may pass through at least some of the plurality of gate electrode layers 220.

The plurality of channel holes 150H may pass through the plurality of gate electrode layers 220 in the cell array region CAR, and thus the substrate 100 may be exposed. The semiconductor pattern 105 may partially fill a lower portion of each of the plurality of channel holes 150H of the cell array region CAR. The vertical channel structure 200 may be formed on the semiconductor pattern 105 in the plurality of channel holes 150H. The vertical channel structure 200 may be in contact with the semiconductor pattern 105 and may be electrically connected to the substrate 100. A vertical memory device may be formed in the cell array region CAR by the vertical channel structure 200. A bottom surface of the vertical channel structure 200 may be positioned at a higher level than an upper surface of the lowermost first gate electrode layer GL1 among the first through sixth gate electrode layers GL1~GL6 included in the plurality of gate electrode layers 220. The contact pad 207 may be formed on the vertical channel structure 200 in the plurality of channel holes 150H.

The first insulating layer 160 may be formed in the word line contact region WCTR to have an upper surface of the same level as that of the uppermost interlayer insulating layer 140. The second insulating layer 170 may be formed on the uppermost interlayer insulating layer 140 and on the first insulating layer 160 over the cell array region CAR and the word line contact region WCTR.

The word line cut trench WLC exposing the substrate 100 may be formed between the vertical channel structures 200 in the cell array region CAR. The common source region 110 may be formed in a part of the substrate 100 exposed through the bottom surface of the word line cut trench WLC. The trench spacer 322 may be formed at side walls of the word line cut trench WLC. The common source line CSL may fill the word line cut trench WLC in which the trench spacer 322 is formed.

The extension contact hole 155E may be formed in each of the plurality of contact regions CTR1~CTR6 of the word line contact region WCTR. The plurality of gate electrode layers 220 may partially protrude in the extension contact hole 155E. The plurality of gate electrode layers 220 that partially protrude in the extension contact hole 155E may define the support hole 220H passing through the plurality of gate electrode layers 220. A portion of the uppermost gate electrode layer 220 among the plurality of gate electrode layers 220 that partially protrude in the extension contact hole 155E may be a portion of the contact plug landing portion 220L.

For convenience of description, the contact plug landing portion 220L, i.e. the uppermost gate electrode layer 220 among the plurality of gate electrode layers 220 that protrude in the extension contact hole 155E, may include a first support hole in the support hole 220H, and the other gate electrode layers 220 may include a second support hole in the support hole 220H. In the first contact region CTR1, one gate electrode layer 220, i.e., the first gate electrode layer GL, may protrude in the extension contact hole 155E, and thus a gate electrode layer including the second support hole may not be arranged. The support hole 220H included in each of the plurality of gate electrode layers 220 may be arranged in a vertical direction with respect to a main surface of the substrate 100 in one extension contact hole 155E. That is, the first support hole and the second support hole may be arranged in the vertical direction with respect to the main surface of the substrate 100 in one extension contact hole 155E.

The support insulating layer 300, including the support portion 302 of a lower side of an upper surface of the contact plug landing portion 220L that is the uppermost gate electrode layer 220 among the protruding gate electrode layers 220 and the spacer portion 304 of a higher side of the upper surface of the contact plug landing portion 220L, may be formed in one extension contact hole 155E. The support portion 302 and the spacer portion 304 may be separately spaced apart from each other in one extension contact hole 155E. The support portion 302 of the support insulating layer 300 may be a portion filling the extension contact hole 155E of a lower side of the upper surface of the contact plug landing portion 220L. The spacer portion 304 of the support insulating layer 300 may be a portion covering side walls of the extension contact hole 155E of a higher side of the upper surface of the contact plug landing portion 220L. The support portion 302 of the support insulating layer 300 may extend downwardly from a lower surface of the contact plug landing portion 220L. The support portion 302 of the support insulating layer 300 may fill the support hole 220H. When both the first support hole and the second support hole are present in one extension contact hole 155E, the support portion 302 of the support insulating layer 300 may fill the first support hole and the second support hole together.

In some embodiments, the support portion 302 of the support insulating layer 300 may be in contact with the device isolation layer 102 and may have a higher level than that of an upper surface of the substrate 100 in a vertical direction with respect to the main surface of the substrate 100 such that a bottom surface of the support portion 302 may be spaced apart from the upper surface of the substrate 100. The support portion 302 of the support insulating layer 300 may include a narrow width portion 302N of FIG. 2O filling the support hole 220H and a broad width portion 302W of FIG. 2O disposed between the interlayer insulating layers 140 in a horizontal direction in a lower side of the gate electrode layer 220. The narrow width portion 302N and the broad width portion 302W may be alternately arranged in the support portion 302 of the support insulating layer 300.

The plurality of word line contact plugs MCT that are arranged on the support portion 302 of the support insulating layer 300, are in contact with the upper surface of the contact plug landing portion 220L, and extend from the upper surface of the contact plug landing portion 220L and may be respectively arranged in the plurality of extension contact holes 155E. The word line contact plug MCT may be in contact with a part of the upper surface of the contact plug landing portion 220L around the support hole 220H, i.e., the first support hole. However, due to manufacturing variations, some portion or all of the support hole 220H in the landing portion 220L may be filled with the contact plug MCT.

The upper surface of the contact plug landing portion 220L positioned in each of the plurality of extension contact holes 155E may have a different level in a vertical direction with respect to the main surface of the substrate 100, and thus a bottom surface of each of the plurality of word line contact plugs MCT formed in each of the plurality of extension contact holes 155E may have a different level in the vertical direction with respect to the main surface of the substrate 100. Thus, the plurality of word line contact plugs MCT respectively formed in the plurality of contact regions CTR1~CTR6 may have a different height in the vertical direction with respect to the main surface of the substrate 100.

The spacer portion 304 of the support insulating layer 300 may be positioned on the upper surface of the contact plug landing portion 220LL and may surround side walls of the word line contact plug MCT. The hole spacer 324 may be disposed between the spacer portion 304 of the support insulating layer 300 and the side walls of the word line contact plug MCT. A bottom surface of the hole spacer 324 may have a higher level than a bottom surface of the support insulating layer 300 with respect to the main surface of the substrate 100. The trench spacer 322 and the hole spacer 324 may be parts of the spacer layer 320 of FIG. 2L formed together, and thus the spacer 322 and the hole spacer 324 may include the same material.

An IC device according to the inventive concepts may include a contact hole for forming a word line contact plug connected to a plurality of gate electrode layers having different levels through one etching process. A plurality of interlayer insulating layers may be supported by a support insulating layer even when a sacrificial layer is removed, and thus the plurality of interlayer insulating layers may not collapse. A support portion of the support insulating layer may be arranged in a lower side of a contact plug landing portion that is a portion of the gate electrode layer connected to the word line contact plug, thereby preventing a bridge between the contact plug landing portion and a gate electrode layer lower than the contact plug landing portion during a process of forming the word line contact plug.

Referring to FIGS. 1 and 2N, the plurality of gate electrode layers 220 may be gate electrodes of the string select transistor SST, the ground select transistor GST, and the plurality of memory cell transistors MC1, MC2, . . . , MCn−1, and MCn. In some embodiments, among the plurality of gate electrode layers 220, at least one of the lower gate electrode layers may be a gate electrode of the ground select transistor GST, at least one of the upper gate electrode layers may be a gate electrode of the string select transistor SST, and other gate electrode layers may be gate electrodes of the plurality of memory cell transistors MC1, MC2, . . . , MCn−1, and MCn. The plurality of word line contact plugs MCT may connect the gate electrodes of the string select transistor SST, the ground select transistor GST, and the plurality of memory cell transistors MC1, MC2, . . . , MCn−1, and MCn with the string select line SSL, the ground selection line GSL, and the plurality of word lines WL1, WL2, WL3, . . . , WLn−1, and WLn (collectively denoted by WL), respectively.

Although the second insulating layer 170 covers the contact pad 207 in FIG. 2N, a bit line contact plug (not shown) passing through the second insulating layer 170 may be formed on the contact pad 207 in order to electrically connect the bit lines BL1, BL2, . . . , BLm (collectively denoted by BL) and the vertical channel pattern 204.

FIG. 2O is a schematic perspective view of a shape of the insulating support layer 300 included in an IC device according to an embodiment of the inventive concepts.

Referring to FIGS. 2N and 2O, the insulating support layer 300 may include the support portion 302 and the spacer portion 304 that are separated from each other. An upper surface of the support portion 302 and a lower surface of the spacer portion 304 may have the same level, i.e., the same level as an upper surface of the contact plug landing portion 220L. In some embodiments, during a process of forming the extension insulating layer recesses 310R that separates the support portion 302 and the spacer portion 304, the upper surface of the support portion 302 may have a somewhat lower level than the upper surface of the contact plug landing portion 220L. The spacer portion 304 may have a hollow cylindrical shape. The support portion 302 may be integrally formed with the narrow width portion 302N filling the support hole 220H and the broad width portion 302W formed in a portion other than the support hole 220H. The broad width portion 302W may be disposed between the interlayer insulating layers 140 in a horizontal direction at a lower side of a respective gate electrode layer 220. The narrow width portion 302N and the broad width portion 302W that constitute the support portion 302 may be formed in a disc shape. A width of the narrow width portion 302N may be smaller than that of the broad width portion 302W. The narrow width portion 302N and the broad width portion 302W may be alternately arranged in the support portion 302 of the support insulating layer 300.

An outer wall of the spacer portion 304 and an outer lateral wall of the broad width portion 302W of the support portion 302 may be arranged and aligned in a vertical direction with respect to a main surface of the substrate 100. In some embodiments, when the contact hole 155 has a tapered sidewall toward the substrate 100 during an etching process of forming the contact hole 155 of FIG. 2D or when lower portions of the first insulating layer 160 and the interlayer insulating layer 140 are removed less than upper portions thereof during a process of partially removing the first insulating layer 160 and the interlayer insulating layer 140 in order to form the contact hole 155 of FIG. 2E, a width of the support portion 302, in particular, the outer lateral wall of the broad width portion 302W, may have a somewhat smaller value than that of the outer lateral wall of the spacer portion 304. In this case, the support portion 302 may be overlappingly arranged with the outer lateral wall of the spacer portion 304 in a vertical direction with respect to a main surface of the substrate 100.

The descriptions of FIGS. 2A through 2O will be provided below, and thus redundant descriptions may be omitted, and the same reference numerals denote the same components unless particularly mentioned otherwise.

Figure 3:
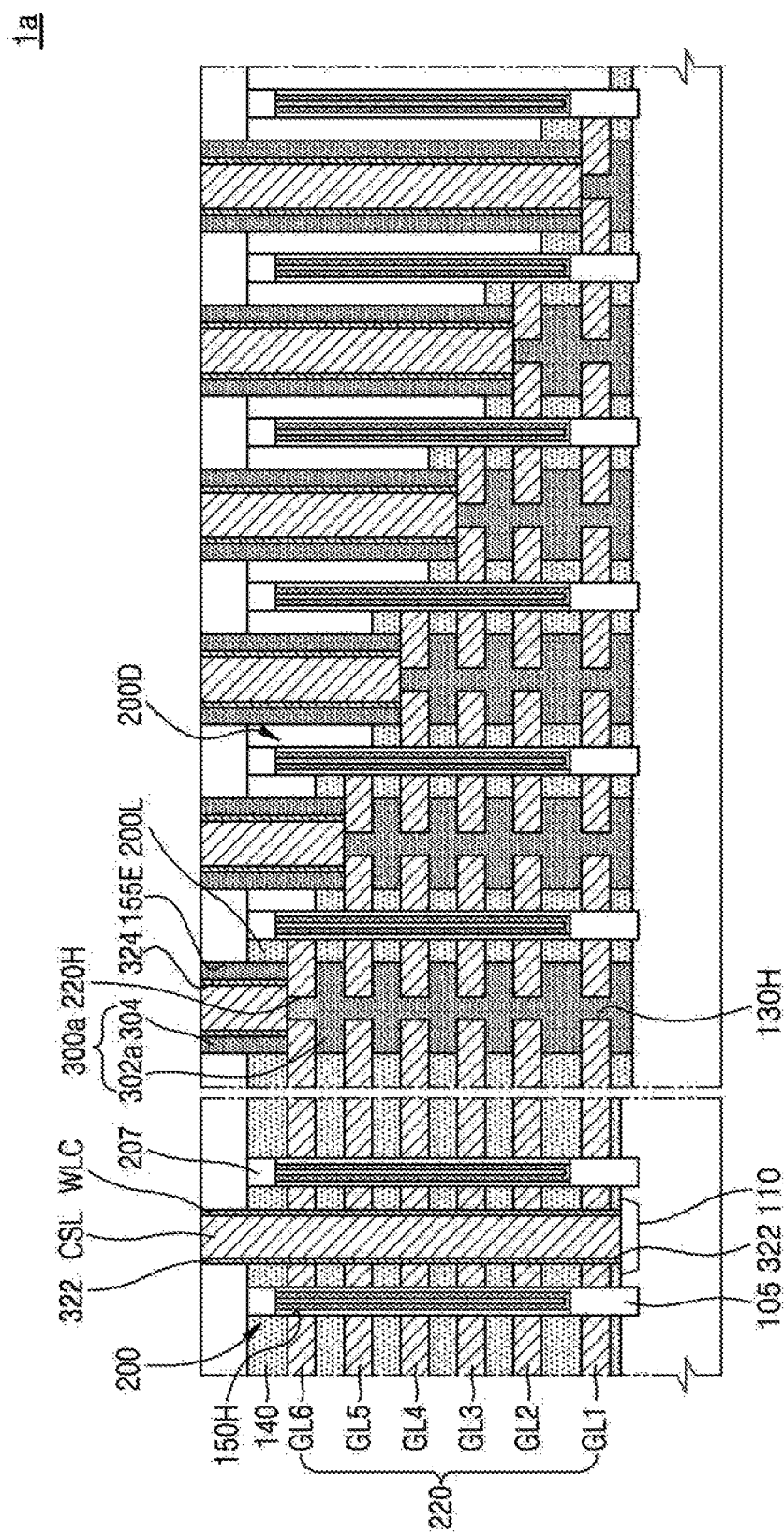
FIG. 3 is a cross-sectional view of an IC device according to an embodiment of the inventive concepts.

FIG. 3 is a cross-sectional view of an IC device 1a according to an embodiment of the inventive concepts. Referring to FIG. 3, the IC device 1a may include a support insulating layer 300a including a support portion 302a and a spacer portion 304 that are separately spaced apart from each other. Unlike the support portion 302 of the support insulating layer 300 of the IC device 1 spaced apart from an upper surface of the substrate 100 in FIG. 2N, a bottom surface of the support portion 302a of the support insulating layer 300a of the IC device 1a may be in contact with the substrate 100. If the contact hole 155 passes through the device isolation layer 102 and thus the substrate 100 is exposed during a process of forming the contact hole 155 of FIG. 2D, or if a part of the device isolation layer 102 covering the substrate 100 is removed during a process of forming the extension contact hole 155E of FIG. 2E, the support portion 302a including the bottom surface contacting the substrate 100 may be formed as shown in FIG. 3.

FIGS. 4A through 4D are cross-sectional views for sequentially describing a method of manufacturing an IC device according to an embodiment of the inventive concepts and cross-sectional views illustrating the IC device according to an embodiment of the inventive concepts.

Referring to FIG. 4A, the thin film structure 150 and the first insulating layer 160 may be formed on the substrate 100 and then the plurality of channel holes 150H may be formed in the cell array region CAR. The plurality of semiconductor patterns 105 that partially fill a lower portion of each of the plurality of channel holes 150H may be formed by performing a selective epitaxial growth process that uses an upper surface of the substrate 100 exposed through the plurality of channel holes 150H as a seed. The vertical channel structure 200 and the contact pad 207 may be formed on the semiconductor patterns 105 in the plurality of channel holes 150H. Unlike shown in FIG. 2B, the dummy hole 150D may not be formed in the word line contact region WCTR in FIG. 4A, and thus the dummy pillar 200D and the contact pad 207 that are arranged in the dummy hole 150D may not be formed.

Figure 4B:
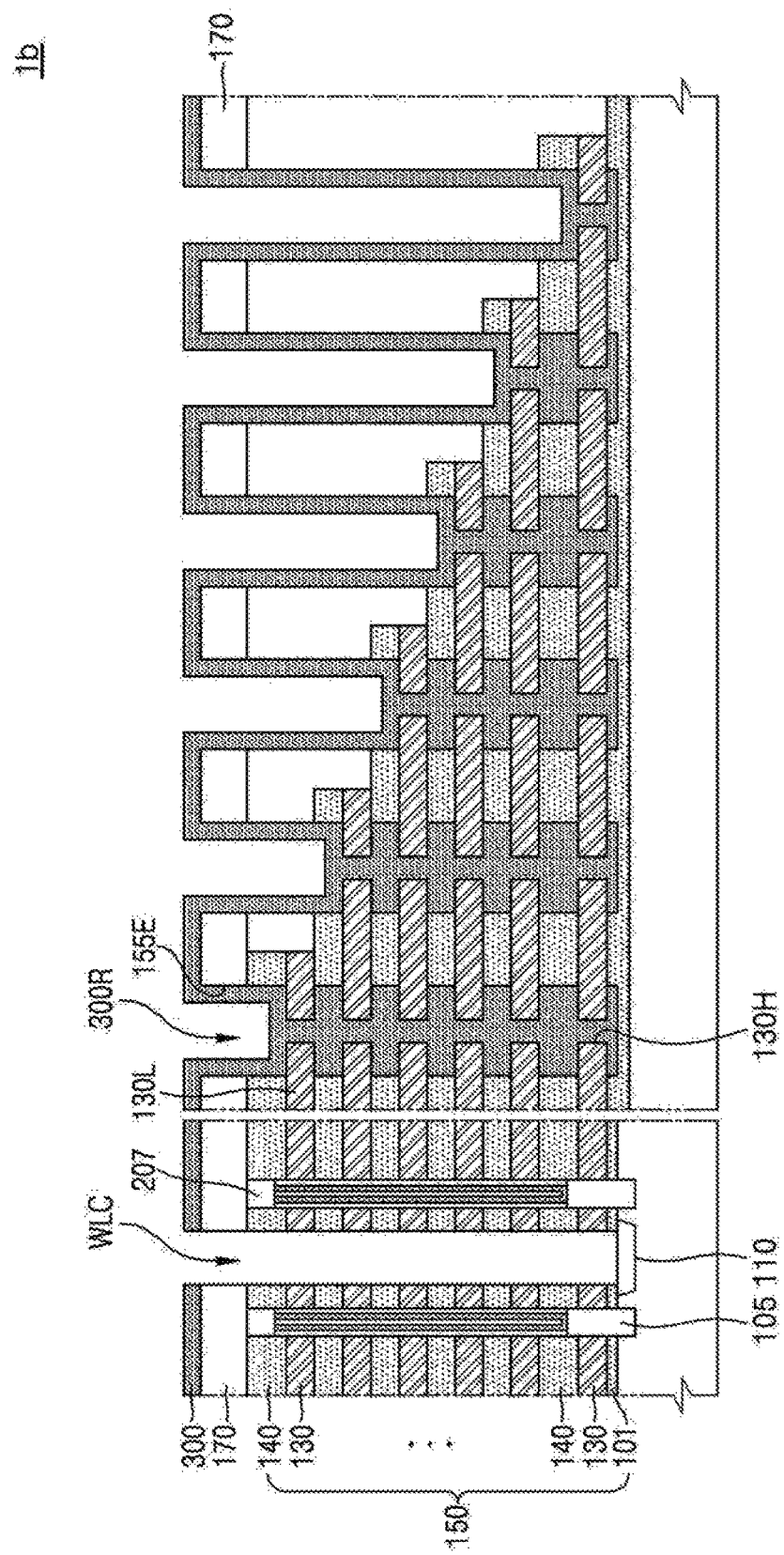
Figure 4C:
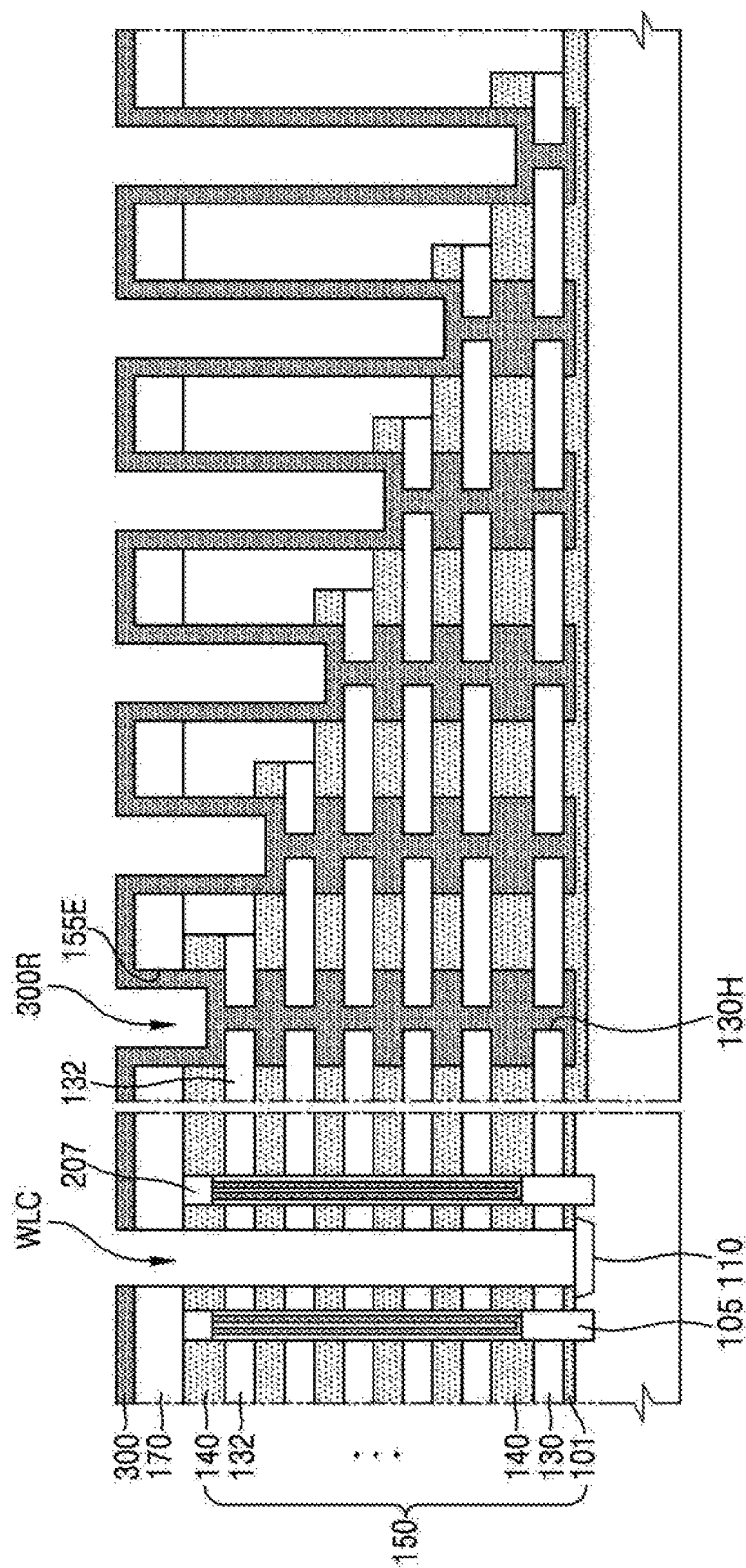

Referring to FIGS. 4B and 4C, with reference to the descriptions of FIGS. 2C through 2H above, the sacrificial layer removal space 132 may be formed by forming the second insulating layer 170, the extension contact hole 155E, the support insulating layer 300, and the word line cut trench WLC and selectively removing the sacrificial layer 130 of FIG. 4B exposed through the word line cut trench WLC. During a process of removing the sacrificial layer 130 for forming the sacrificial layer removal space 132, although the dummy pillar 200D shown in FIG. 2I is not present, since the plurality of interlayer insulating layers 140 may be supported by the support insulating layer 300, the sacrificial layer removal space 132 may not collapse. Thus, spaces between the sacrificial layer removal space 132 may be maintained, thereby stably forming the sacrificial layer removal space 132.

Figure 4D:
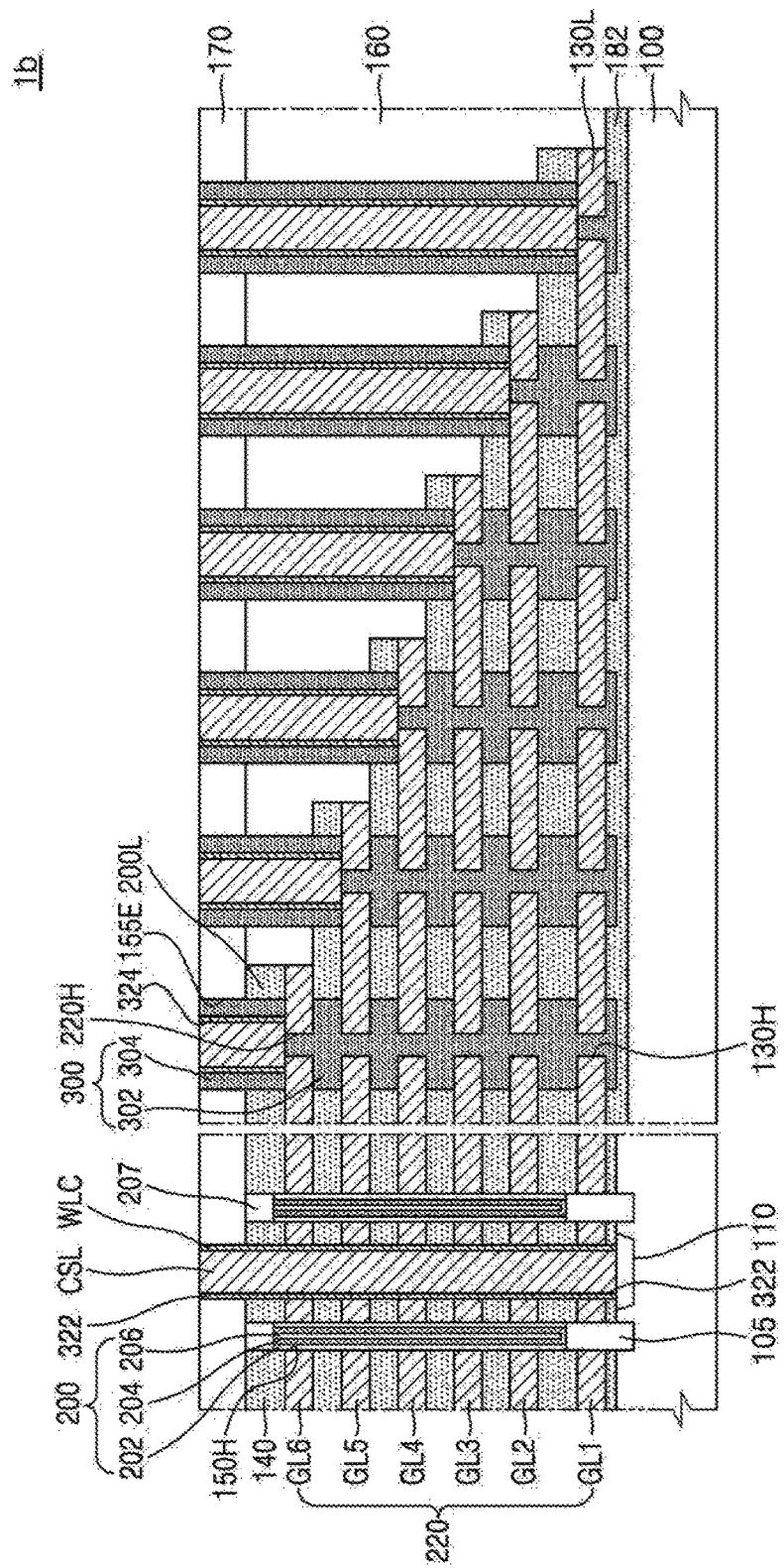

Referring to FIG. 4D, with reference to the descriptions of FIGS. 2J through 2N above, an IC device 1B may be formed. Compared to the IC device 1 of FIG. 2N, the dummy hole 150D may not be formed in the word line contact region WCTR, and thus the dummy pillar 200D and the contact pad 207 may not be formed in the IC device 1B. Although not shown, instead of the support portion 302 of the support insulating layer 300 spaced apart from an upper surface of the substrate 100, the IC device 1B may employ the support portion 302a of the support insulating layer 300a contacting the substrate 100 as shown in FIG. 3.

Figure 5A:
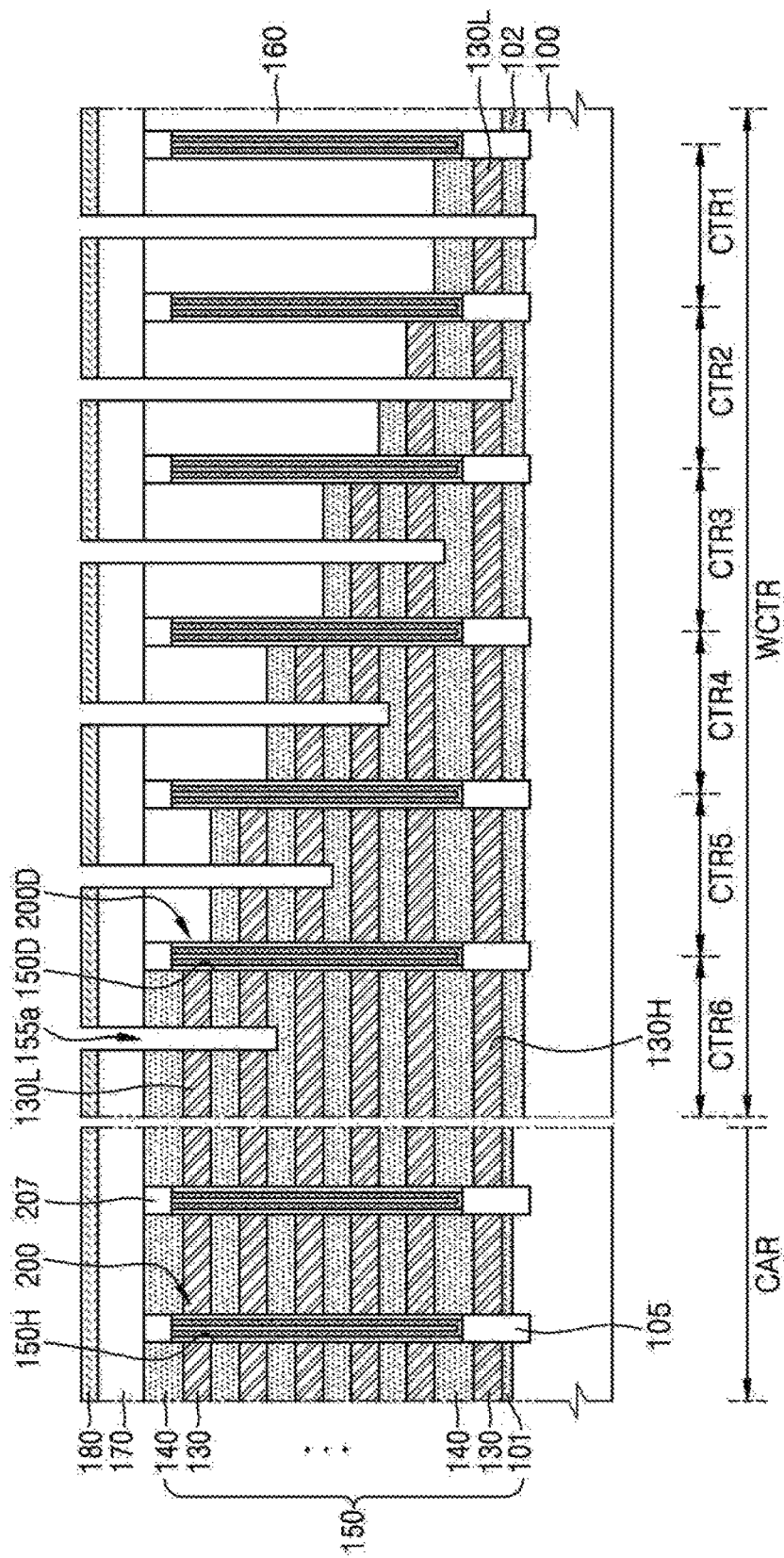
FIGS. 5A through 5C are cross-sectional views for sequentially describing a method of manufacturing an IC device according to an embodiment of the inventive concepts and cross-sectional views illustrating the IC device according to an embodiment of the inventive concepts.
Figure 5B:
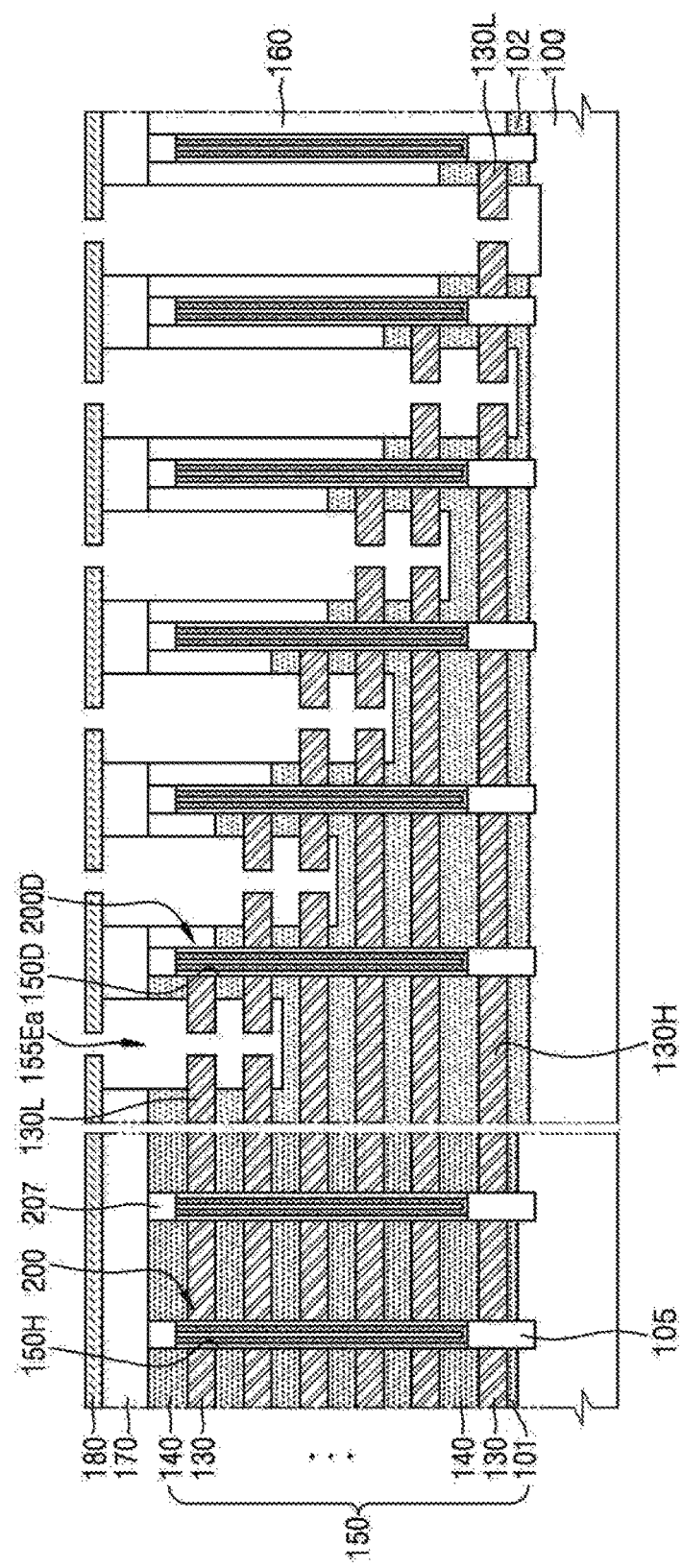
Figure 5C:
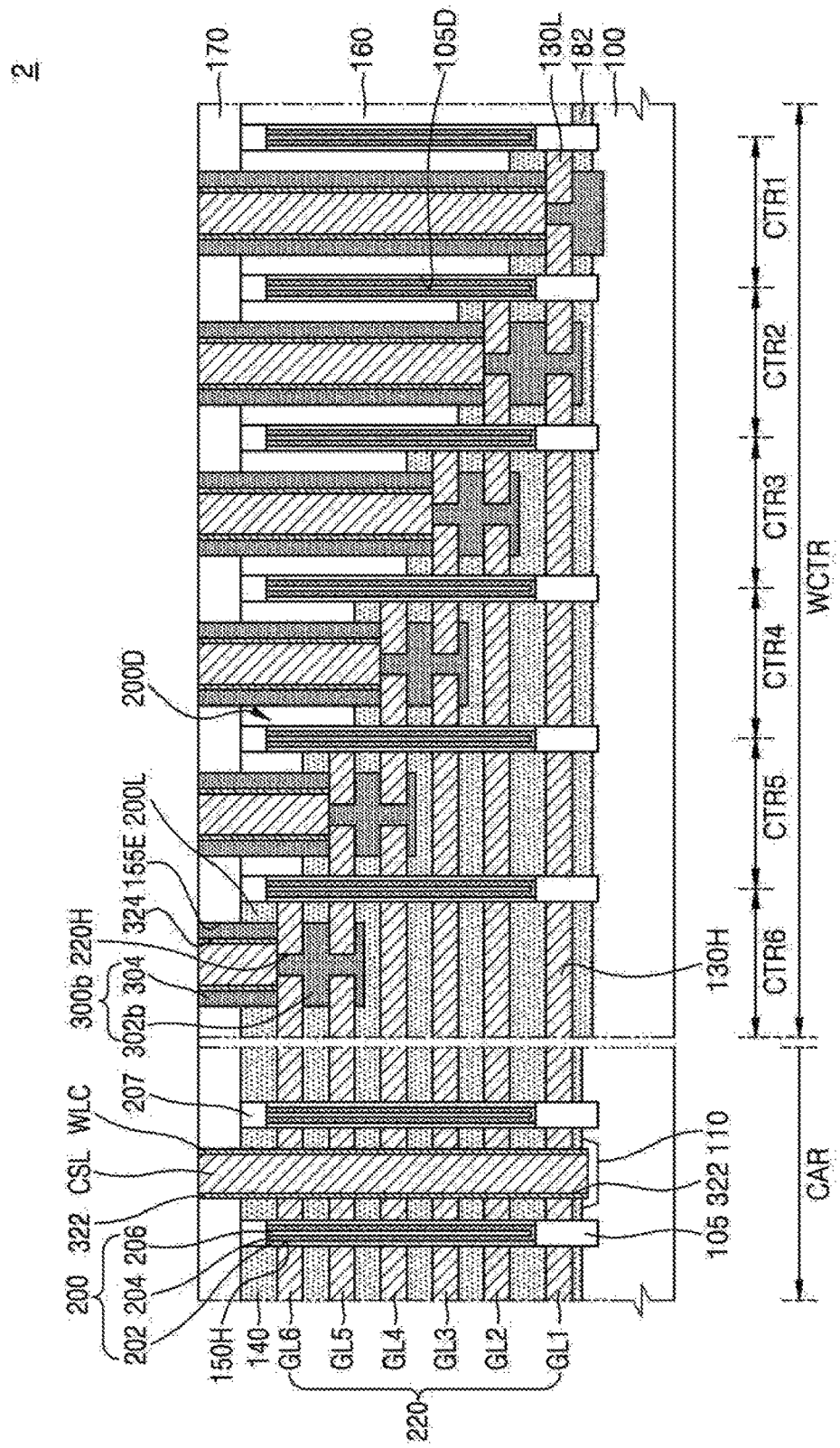

FIGS. 5A through 5C are cross-sectional views for sequentially describing a method of manufacturing an IC device according to an embodiment of the inventive concepts and cross-sectional views illustrating the IC device according to an embodiment of the inventive concepts.

Referring to FIG. 5A, with reference to the descriptions of FIGS. 2A through 2C above, the thin film structure 150, the first insulating layer 160, the vertical channel structure 200, and the dummy pillar 200D may be formed on the substrate 100 and then the second insulating layer 170 and the cover layer 180 may be formed. Thereafter, at least one contact hole 155a may be formed in each of the plurality of contact regions CTR1~CTR6 of the word line contact region WCTR. The contact hole 155a formed in each of the plurality of contact regions CTR1~CTR6 may pass through the at least one interlayer insulating layer 140 and the preparatory landing portion 130L.

At least some of the plurality of contact holes 155a may have different etch depths from others of the plurality of contact holes 155a in each of the plurality of contact regions CTR1~CTR6. Thus, some of the plurality of contact holes 155a formed in each of the plurality of contact regions CTR1~CTR6 may have bottom surfaces of different levels. The plurality of contact holes 155a have bottom surfaces at different levels in FIG. 5A, but the inventive concepts is not limited thereto. For example, a bottom surface of the contact hole 155a formed in some of the plurality of contact regions CTR1~CTR6 may have a different level from or the same level as a bottom surface of the contact holes 155a formed in others of the plurality of contact regions CTR1~CTR6. The substrate 100 may be exposed through the bottom surface of the contact hole 155a formed in some of the plurality of contact regions CTR1~CTR6 and may not be exposed through the bottom surface of the contact hole 155a formed in others of the plurality of contact regions CTR1~CTR6. In some embodiments, the substrate 100 may not be exposed through the bottom surface of all the contact holes 155a formed in the plurality of contact regions CTR1~CTR6.

Referring to FIG. 5B, an extension contact hole 155Ea may be formed by partially removing portions of the second insulating layer 170, the first insulating layer 160, and the interlayer insulating layer 140 that are exposed through the contact hole 155a of FIG. 5A. Some of the plurality of extension contact holes 155Ea formed in each of the plurality of contact regions CTR1~CTR6 may have bottom surfaces at different levels according to a level of a bottom surface of the contact hole 155a.

Thereafter, a subsequent process may be performed with reference to the descriptions of FIGS. 2F through 2M.

Referring to FIG. 5C, an IC device 2 may be formed by forming the common source line CSL filling a space of the word line cut trench WLC limited by the trench spacer 322 and the word line contact plugs MCT filling the extension insulating layer recesses 310R.

The IC device 2 may include a support insulating layer 300b including a support portion 302b and the spacer portion 304. A bottom surface of the support portion 302b positioned in some of the plurality of contact regions CTR1~CTR6 may have different levels from a bottom surface of the support portion 302b positioned in others of the plurality of contact regions CTR1~CTR6 in a vertical direction with respect to a main surface of the substrate 100.

The bottom surface of the support portion 302b formed in each of the plurality of contact regions CTR1~CTR6 may wholly have a different level in FIG. 5C but the inventive concepts are not limited thereto. In some embodiments, a part of the bottom surface of the support portion 302b formed in each of the plurality of contact regions CTR1~CTR6 may have a different level, and another part thereof may have the same level. The bottom surface of a part of the support portion 302b formed in each of the plurality of contact regions CTR1~CTR6 may be in contact with the substrate 100, and the bottom surface of another part thereof may be spaced apart from an upper surface of the substrate 100 such that the bottom surface of another part thereof may not be in contact with the substrate 100.

Figure 6:
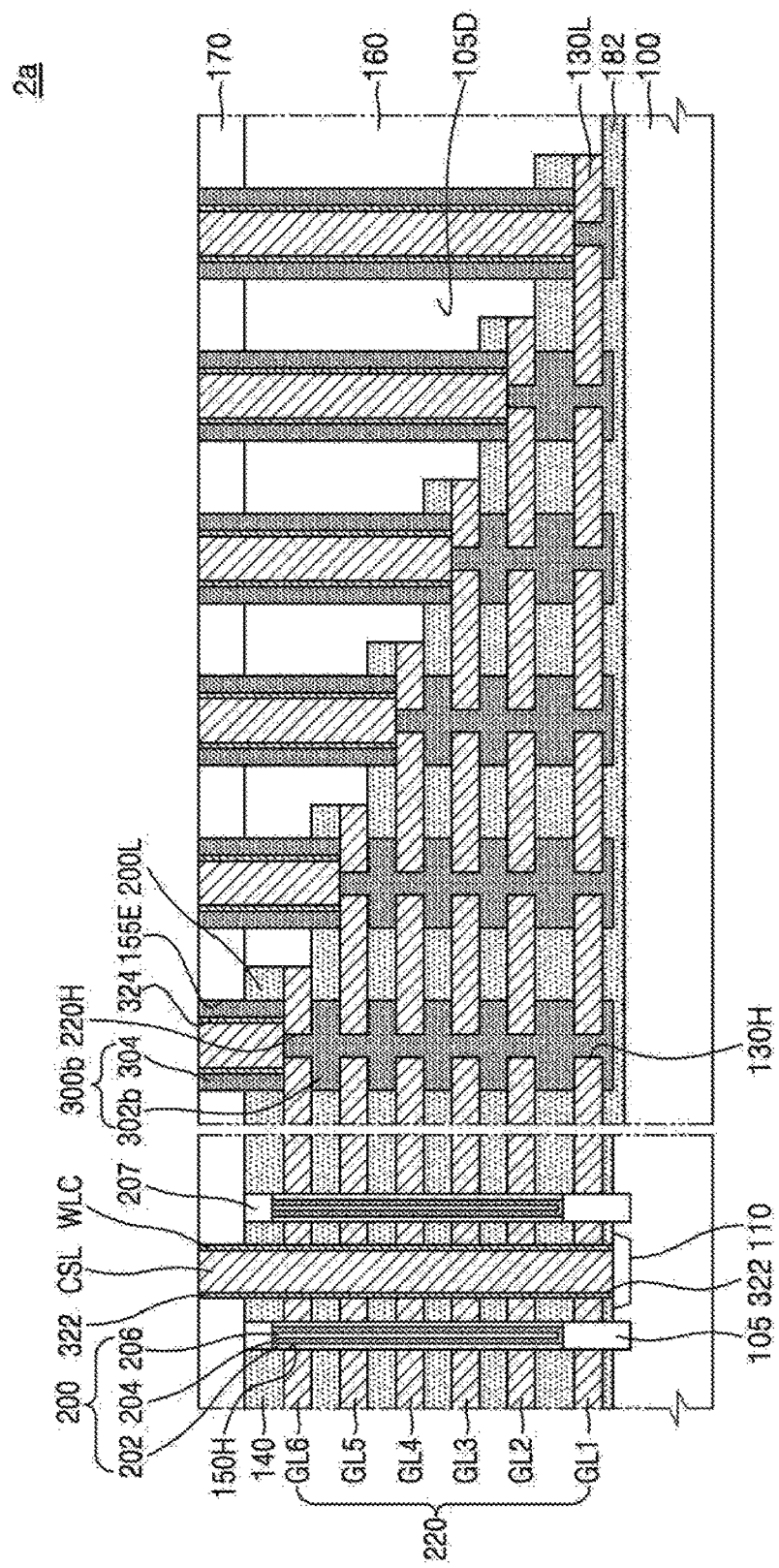
FIG. 6 is a cross-sectional view of an IC device according to an embodiment of the inventive concepts.

FIG. 6 is a cross-sectional view of an IC device according to an embodiment of the inventive concepts.

Referring to FIG. 6, compared to the IC device 1 of FIG. 5C, an IC device 2a may not form the dummy hole 150D in the word line contact region WCTR and thus may not include the dummy pillar 200D and the contact pad 207. That is, during a process of forming the plurality of channel holes 150H in the cell array region CAR of FIG. 5A, the IC device 2a may not form the dummy hole 150D in the word line contact region WCTR as shown in FIG. 4A and thus may not form the dummy pillar 200D and the contact pad 207 in the dummy hole 150D.

FIGS. 7A through 7L are cross-sectional views for sequentially describing a method of manufacturing an IC device 3 according to an embodiment of the inventive concepts and cross-sectional views illustrating the IC device 3 according to an embodiment of the inventive concepts. FIGS. 7A through 7L illustrate a process after FIG. 2G.

Figure 7A:
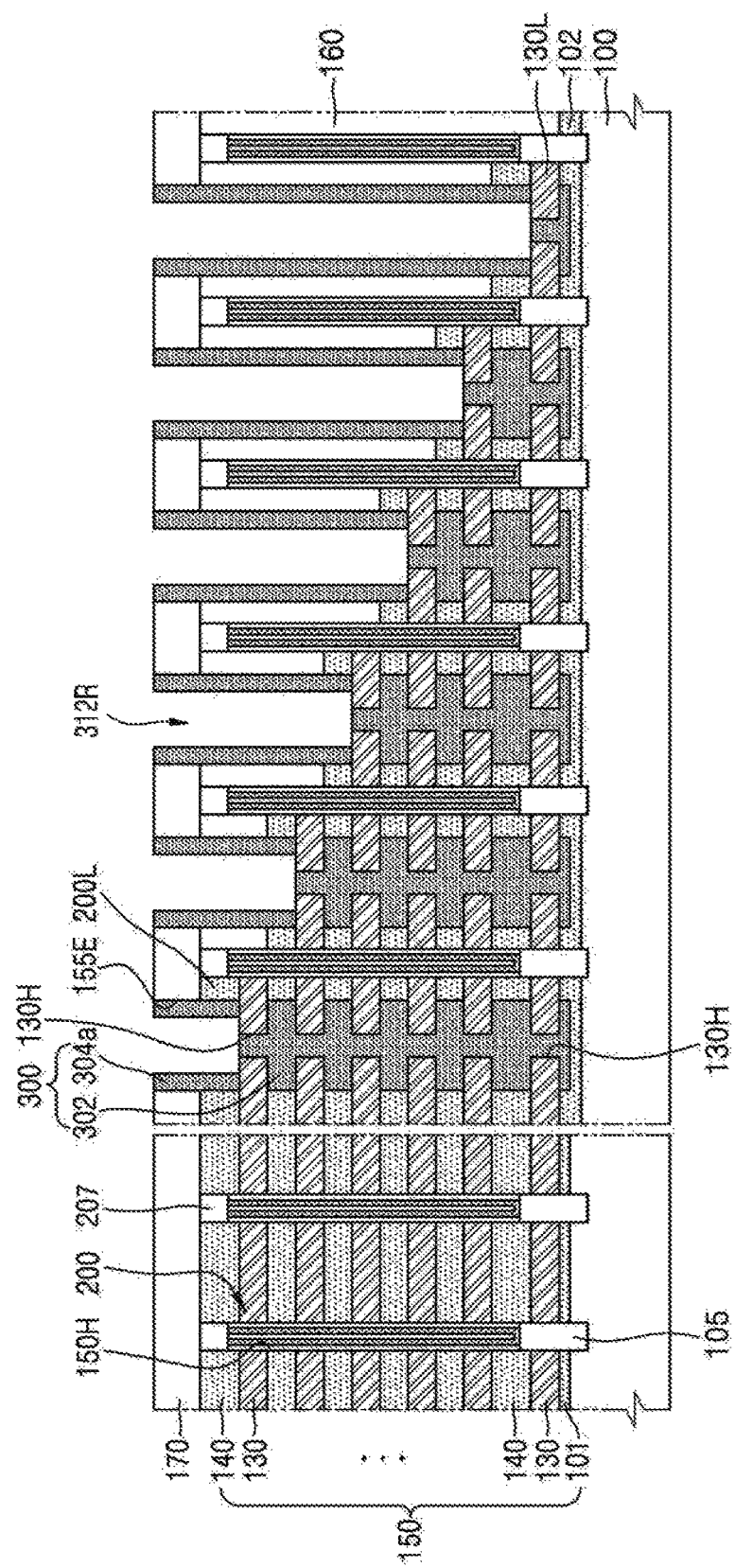
FIGS. 7A through 7L are cross-sectional views for sequentially describing a method of manufacturing an IC device according to an embodiment of the inventive concepts and cross-sectional views illustrating the IC device according to an embodiment of the inventive concepts.

Referring to FIG. 7A, extension insulating layer recesses 312R that expose a part of an upper surface of a respective preparatory landing portion 130L around a respective through hole 130H may be formed by removing a part (see 300 of FIG. 2G) of a support insulating layer formed on an upper surface of the second insulating layer 170 and a part (see 300 of FIG. 2G) of the support insulating layer positioned on the part of the upper surface of the preparatory landing portion 130L around the through hole 130H in a bottom surface of the insulating layer recesses 300R of FIG. 2G. Thus, the support insulating layer 300 may be separated into the support portion 302 at a lower side of the upper surface of the preparatory landing portion 130L and a spacer portion 304a at a higher side of the upper surface of the preparatory landing portion 130L.

Figure 7B:
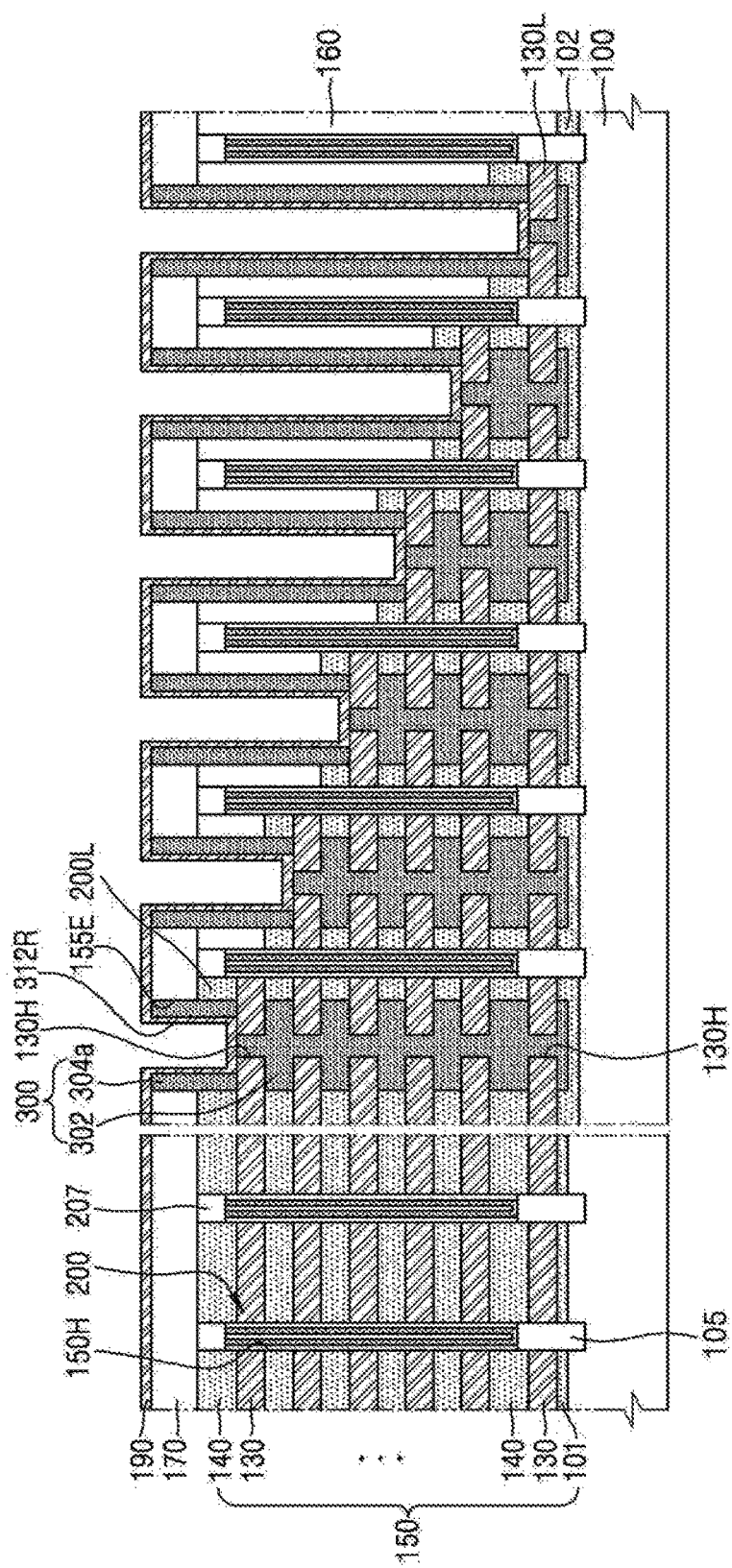

Referring to FIG. 7B, a sacrificial cover layer 190 conformally covering a surface of the substrate 100, in which the extension insulating layer recesses 312R are formed, may be formed. The sacrificial cover layer 190 may cover an upper surface of the second insulating layer 170 and an inner surface of the extension insulating layer recesses 312R while not entirely filling the extension insulating layer recesses 312R. The sacrificial cover layer 190 may be in contact with a part of the upper surface of the preparatory landing portions 130L around the through holes 130H. In some embodiments, the sacrificial cover layer 190 may include the same material as or a material having a similar wet etching characteristic as the sacrificial layer 130. A thickness of a part of the sacrificial cover layer 190 formed on a bottom surface of the extension insulating layer recesses 312R may have a greater value than that of a part of the sacrificial cover layer 190 formed on side walls of the extension insulating layer recesses 312R. The part of the sacrificial cover layer 190 formed on the bottom surface of the extension insulating layer recesses 312R may cover the through holes 130H formed in the preparatory landing portions 130L.

Figure 7C:
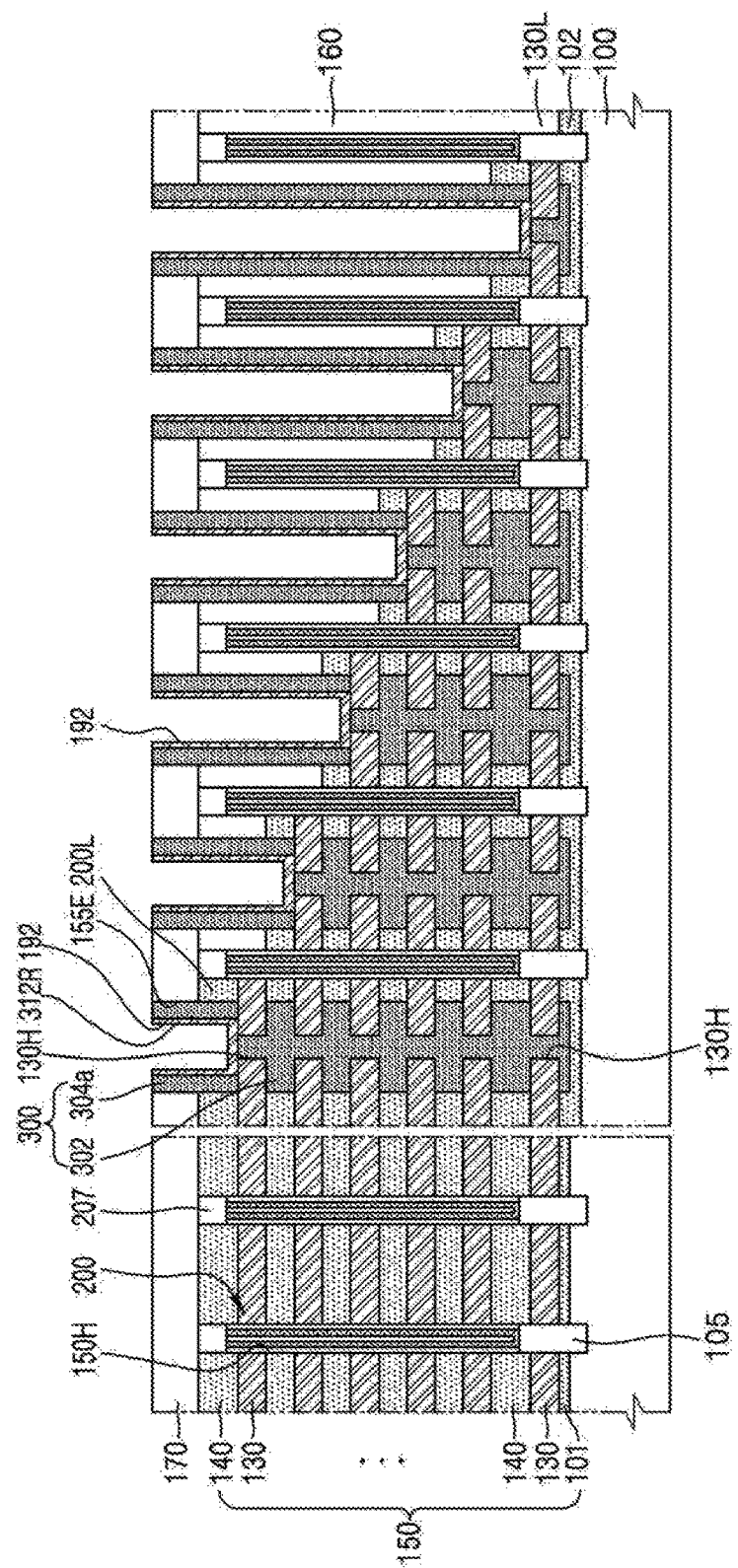

Referring to FIG. 7C, a sacrificial recess cover layer 192 covering the inner surface of each of the extension insulating layer recesses 312R, i.e., side walls and the bottom surface, may be formed by removing parts of the sacrificial cover layer 190 of FIG. 7B formed on the upper surface of the second insulating layer 170. The sacrificial recess cover layers 192 may be formed by forming a filling material layer (not shown) filling the extension insulating layer recesses 312R, performing a planarization process until the upper surface of the second insulating layer 170 is exposed, and removing the filling material layer.

Figure 7D:
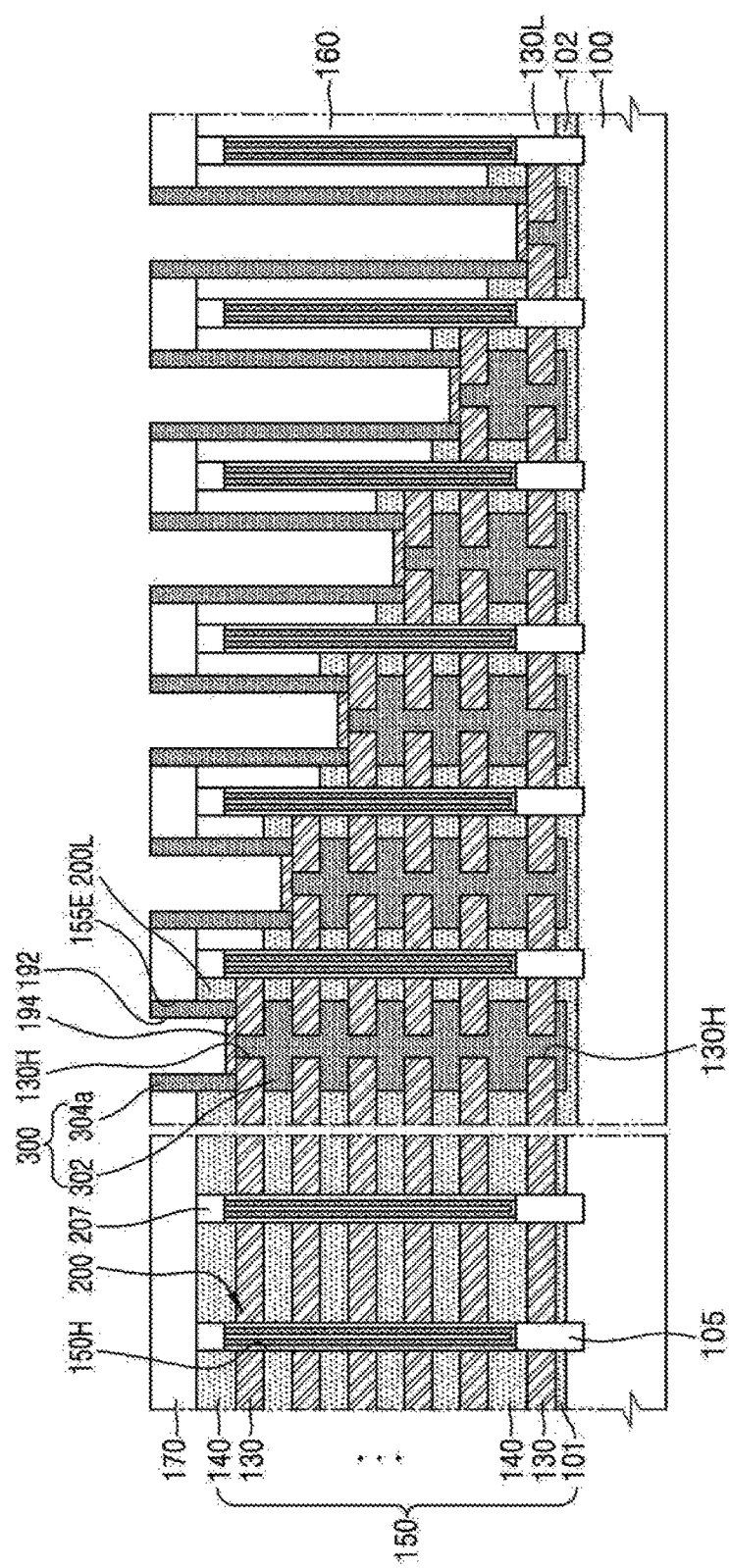

Referring to FIG. 7D, a sacrificial bottom surface cover layer 194 covering the bottom surface of each of the extension insulating layer recesses 312R may be formed by removing a part of the sacrificial recess cover layers 192 of FIG. 7C covering the side walls of the extension insulating layer recesses 312R. The sacrificial bottom surface cover layers 194 may be formed by removing a part of the sacrificial recess cover layers 192 through an anisotropic etching process. When the thickness of a part of the sacrificial cover layer 190 of FIG. 7B formed on the bottom surface of the extension insulating layer recess 312R has the greater value than that of the part of the sacrificial cover layer 190 formed on the side walls of the extension insulating layer recess 312R, if the anisotropic etching process is performed on the sacrificial recess cover layer 192, the part of the sacrificial recess cover layer 192 covering the side walls of the extension insulating layer recess 312R may be wholly removed and only a part of the sacrificial recess cover layer 192 covering the bottom surface of the extension insulating layer recess 312R, i.e., the sacrificial bottom surface cover layer 194, may remain. Thus, a thickness of the sacrificial bottom surface cover layers 194 may have a smaller value than that of the part of the sacrificial recess cover layers 192 covering the bottom surface of the extension insulating layer recesses 312R. The sacrificial bottom surface cover layers 194 may be in contact with a part of the upper surface of the respective preparatory landing portions 130L around the respective through holes 130H. That is, the sacrificial bottom surface cover layers 194 and the respective preparatory landing portions 130L may be directly connected to each other.

Figure 7E:
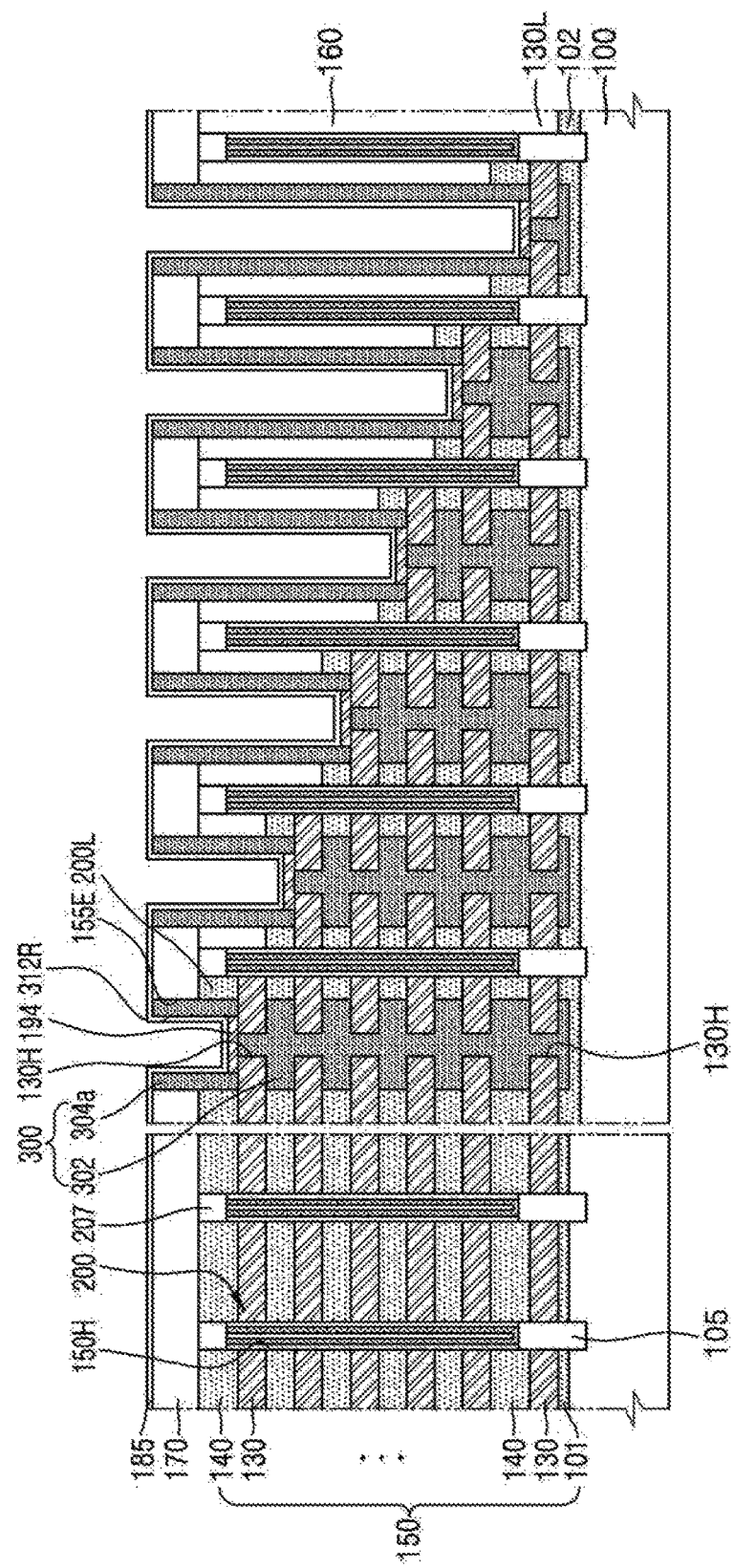

Referring to FIG. 7E, a third insulating layer 185 conformally covering the surface of the substrate 100, in which the sacrificial bottom surface cover layers 194 cover the bottom surface of the extension insulating layer recesses 312R is formed, may be formed. The third insulating layer 185 may cover the upper surface of the second insulating layer 170, an upper surface of the spacer portion 304a of the support insulating layer 300, side surfaces of the extension insulating layer recesses 312R, and an upper surface of the sacrificial bottom surface cover layers 194 while not entirely filling the extension insulating layer recesses 312R. The third insulating layer 185 may include, for example, silicon oxide.

Figure 7F:
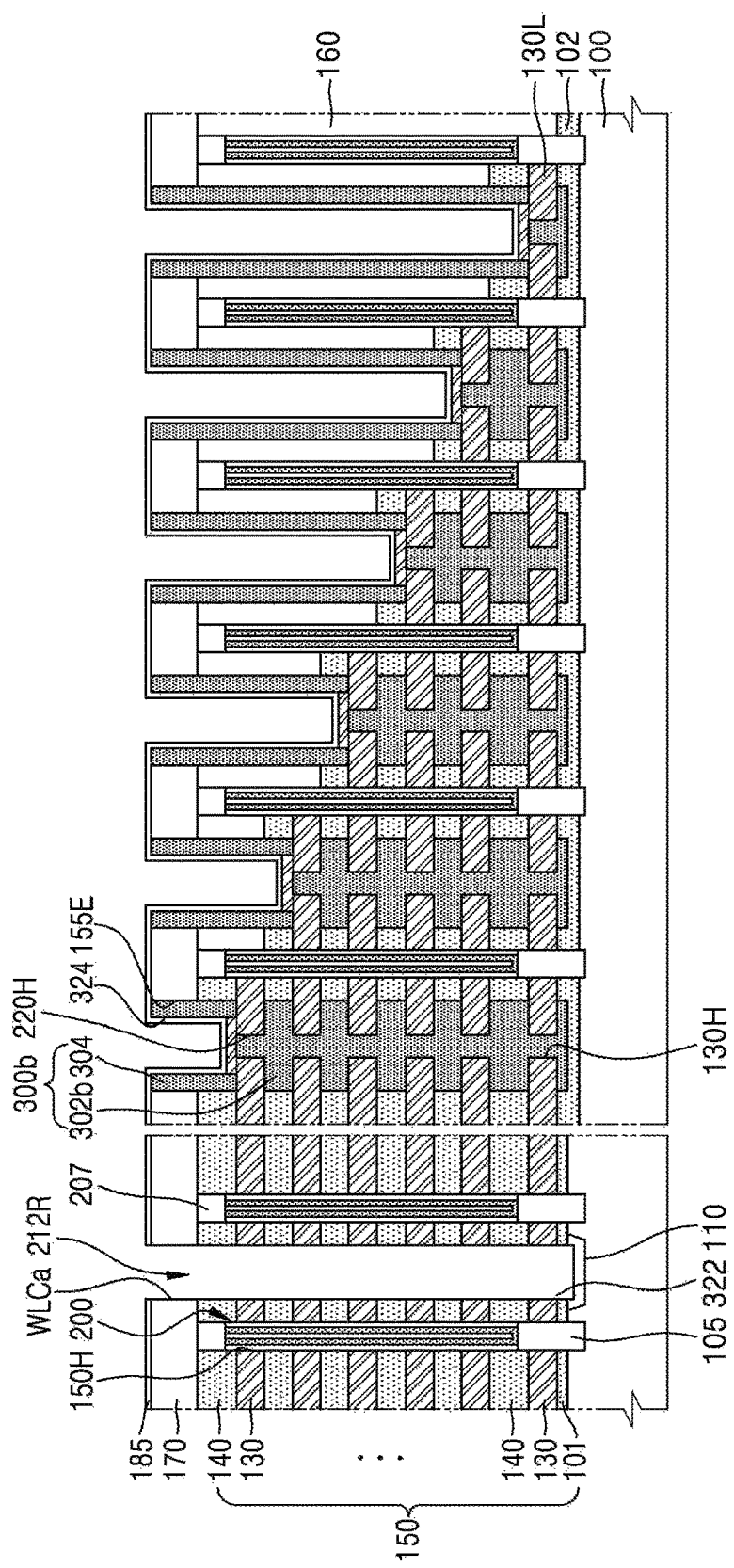

Referring to FIG. 7F, a word line cut trench WLCa exposing the substrate 100 between the vertical channel structures 200 in the cell array region CAR may be formed. Thereafter, the common source region 110 may be formed by injecting impurity ions into the substrate 100 through the word line cut trench WLCa.

Figure 7G:
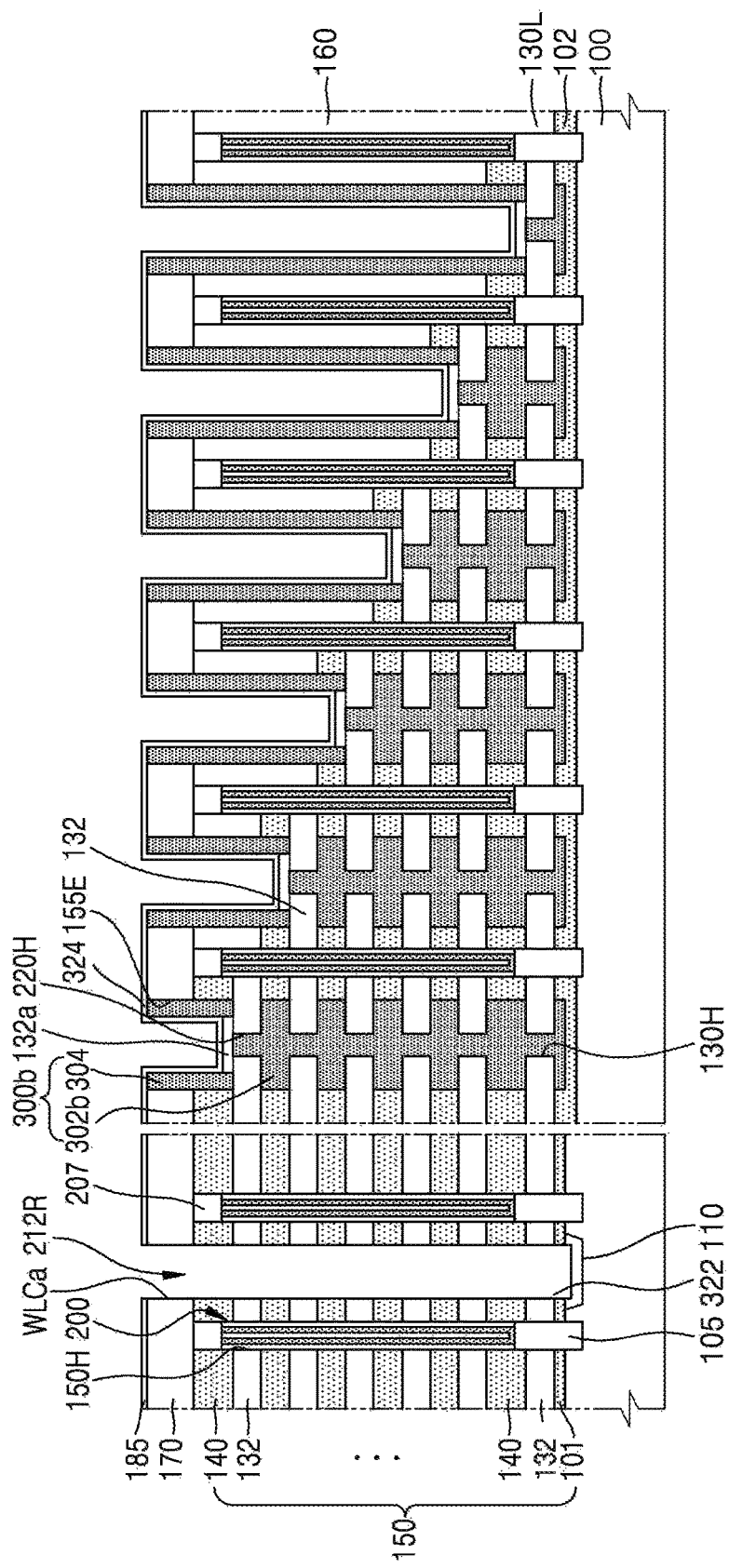

Referring to FIG. 7G, the sacrificial removal space 132 may be formed by selectively removing the sacrificial layer 130 of FIG. 7F exposed through the word line cut trench WLCa. If the sacrificial removal space 132 is formed by removing the sacrificial layer 130. The sacrificial bottom surface cover layers 194 of FIG. 7F of the sacrificial layer 130 connected to the preparatory landing portions 130L of FIG. 7F may also be exposed during this process. Thus, a cover layer removal space 132a connected to the sacrificial removal space 132 may be formed by selectively removing the sacrificial layer 130 and simultaneously removing the sacrificial bottom surface cover layer 194.

Figure 7H:
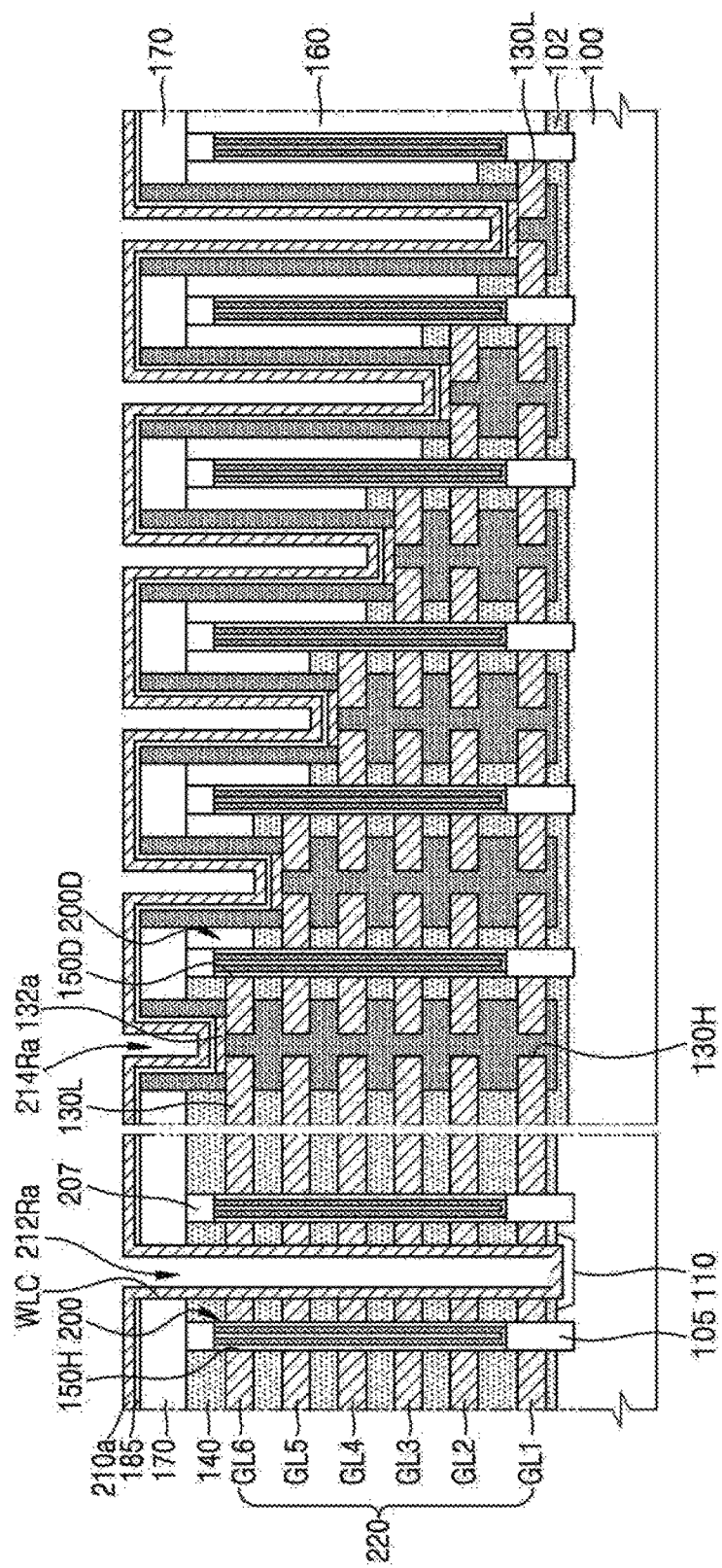

Referring to FIG. 7H, a conductive material layer 210a filling the sacrificial removal space 132 and the cover layer removal space 132a connected to the sacrificial removal space 132 may be formed. The conductive material layer 210a may conformally cover a surface of the third insulating layer 185 and an inner surface of the word line cut trench WLCa while entirely filling the sacrificial removal space 132 and the cover layer removal space 132a such that a first recess 212Ra and second recesses 214Ra limited by the conductive material layer 210a may be respectively formed in the word line cut trench WLCa and the extension insulating layer recesses 312R.

Figure 7I:
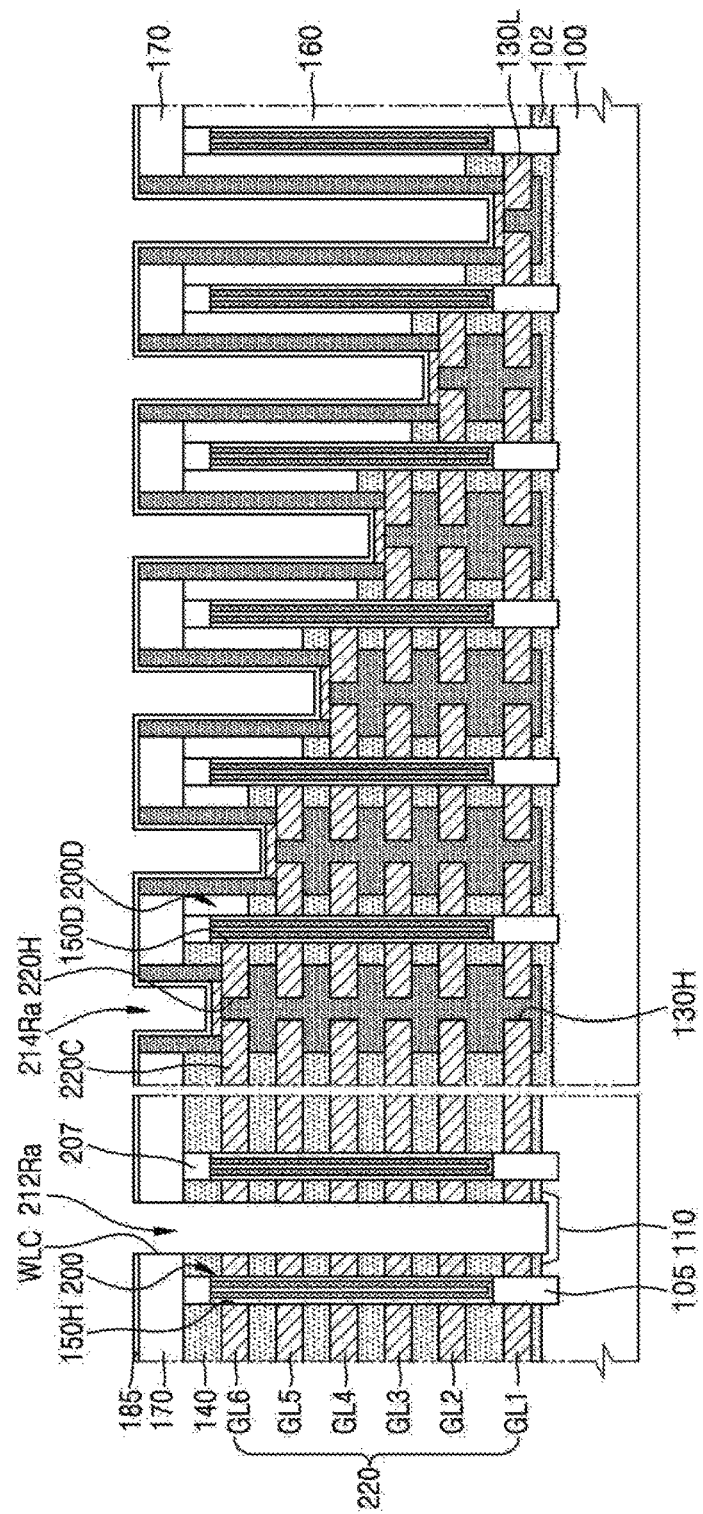

Referring to FIG. 7I, the plurality of gate electrode layers 220, that are a part of the conductive material layer 210a of FIG. 7H filling the sacrificial layer removal space 132, and the hole cover portions 222, that is a part of the conductive material layer 210a filling the cover layer removal space 132a, may be formed by removing a part of the conductive material layer 210a formed in the word line cut trench WLCa and the extension insulating layer recesses 312R and a part of the conductive material layer 210a formed on the third insulating layer 185. The gate electrode layers 220 may include or define the support holes 220H corresponding to the through hole 130H of FIG. 7G of the sacrificial layer 130 of FIG. 7G. The hole cover portions 222 may cover the support holes 220H formed in the contact plug landing portions 220L on the contact plug landing portions 220L. The hole cover portions 222 may be integrally formed with respective gate electrode layers 220.

Figure 7J:
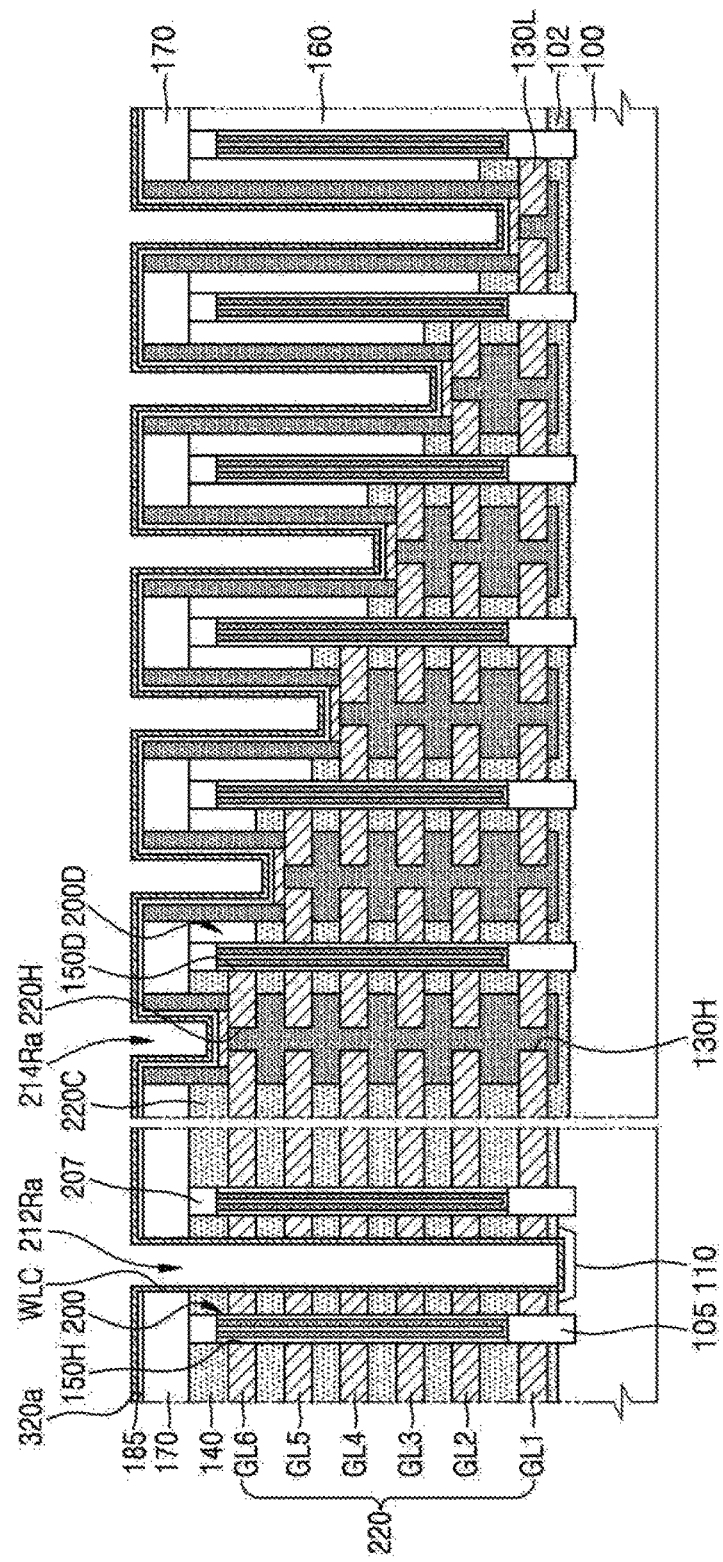
Figure 7K:
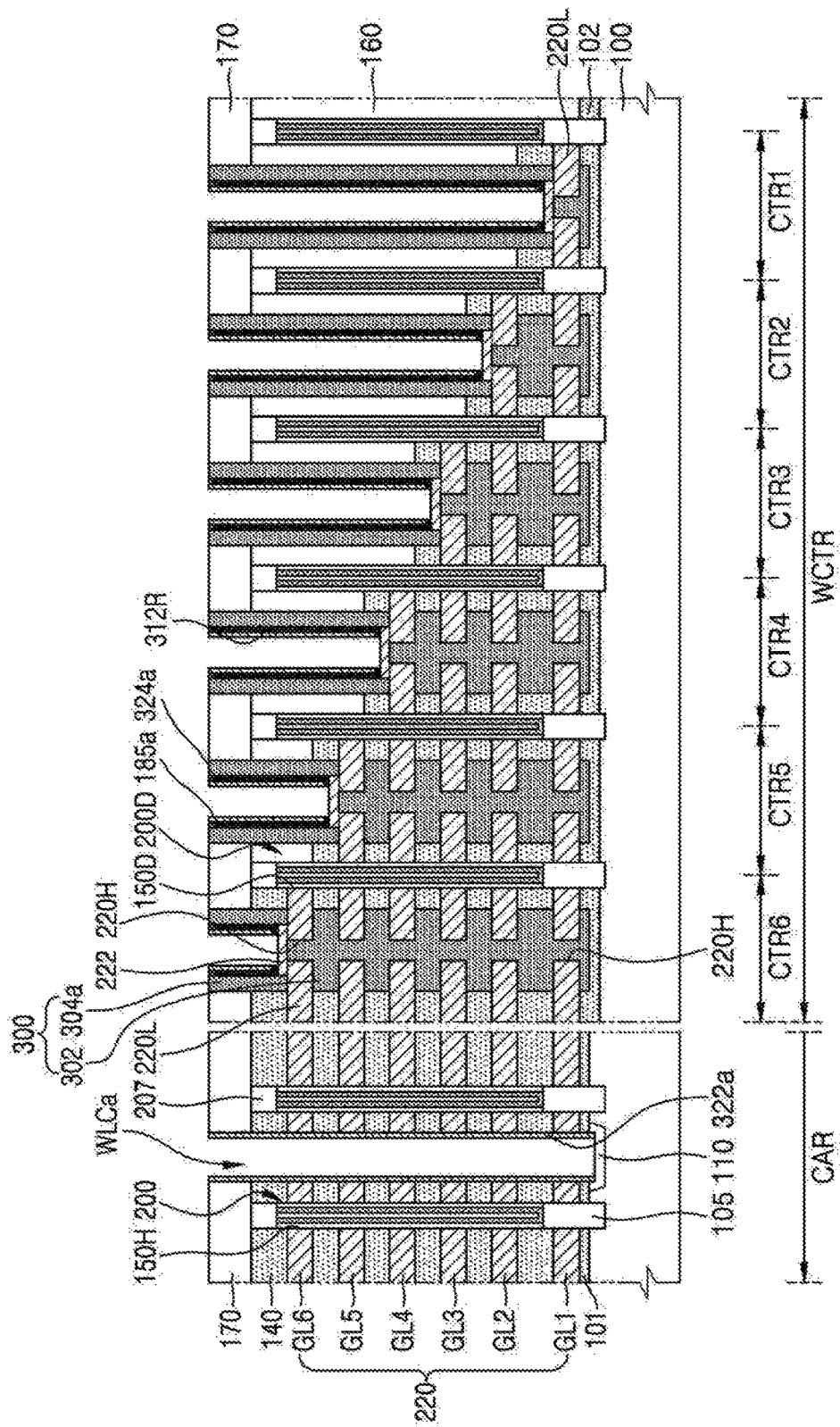

Referring to FIG. 7J, a spacer layer 320a conformally covering a surface of the substrate 100 in which the gate electrode layer 220 and the hole cover portion 222 are formed may be formed. Thereafter, referring to FIG. 7K, a trench spacer 322a that is a part of the spacer layer 320a of FIG. 7J covering side walls of the word line cut trench WLCa and insulating spacers 185a and hole spacers 324a, that are parts of the third insulating layer 185 of FIG. 7J and the spacer layer 320a that sequentially cover side walls of the insulating layer recesses 300R, may be formed by removing a part of the spacer layer 320a and a part of the third insulating layer 185 until the upper surface of the second insulating layer 170 is exposed. During a process of forming the insulating spacers 185a and the hole spacers 324a, an upper surface of the hole cover portions 222 may be partially exposed by partially removing the third insulating layer 185 and the spacer layer 320a that are positioned on the hole cover portions 222. The insulating spacers 185a and the hole spacers 324a may be positioned on the hole cover portions 222. The spacer portions 304a of the support insulating layers 300 may be positioned on the contact plug landing portions 220L adjacent to the hole cover portions 222. Thus, bottom surfaces of the insulating spacers 185a and the hole spacers 324a may have a higher level than a bottom surface of the spacer portions 304a of the support insulating layers 300 with respect to a main surface of the substrate 100. The bottom surface of the insulating layer 185 may have a higher level than the bottom surface of the hole spacers 324a with respect to the main surface of the substrate 100.

Figure 7L:
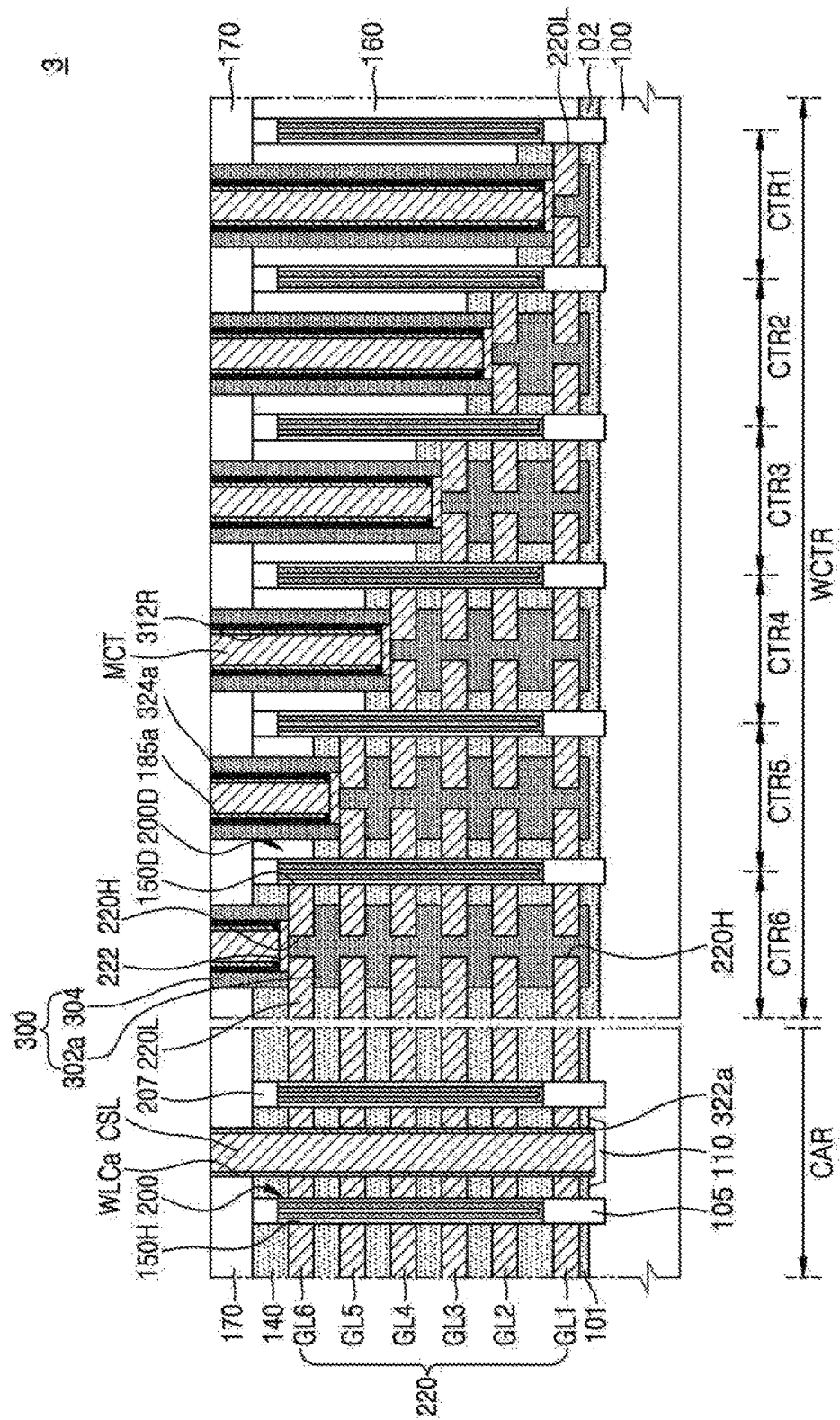

Referring to FIG. 7L, the IC device 3 may be formed by forming the common source line CSL filling a space of the word line cut trench WLCa limited by the trench spacer 322a and the word line contact plugs MCT filling a space of the extension insulating layer recesses 312R limited by the insulating spacers 185a and the hole spacers 324a. The word line contact plugs MCT may be in contact with an upper surface of the hole cover portions 222 and may be electrically connected to respective gate electrode layers 220 through the contact plug landing portions 220L integrally formed with the hole cover portions 222. A bottom surface of the word line contact plug MCT may have the same level as the upper surface of the hole cover portions 222 with respect to the main surface of the substrate 100. The bottom surface of the word line contact plugs MCT may have the same level as the bottom surface of each of the insulating spacers 185a and the hole spacers 324a with respect to the main surface of the substrate 100.

The IC device 3 may include the hole cover portions 222 integrally formed with respective contact plug landing portions 220L to cover first support holes that are the support holes 220H included in the contact plug landing portions 220L and the word line contact plugs MCT contacting the upper surface of the hole cover portions 222.

Figure 8:
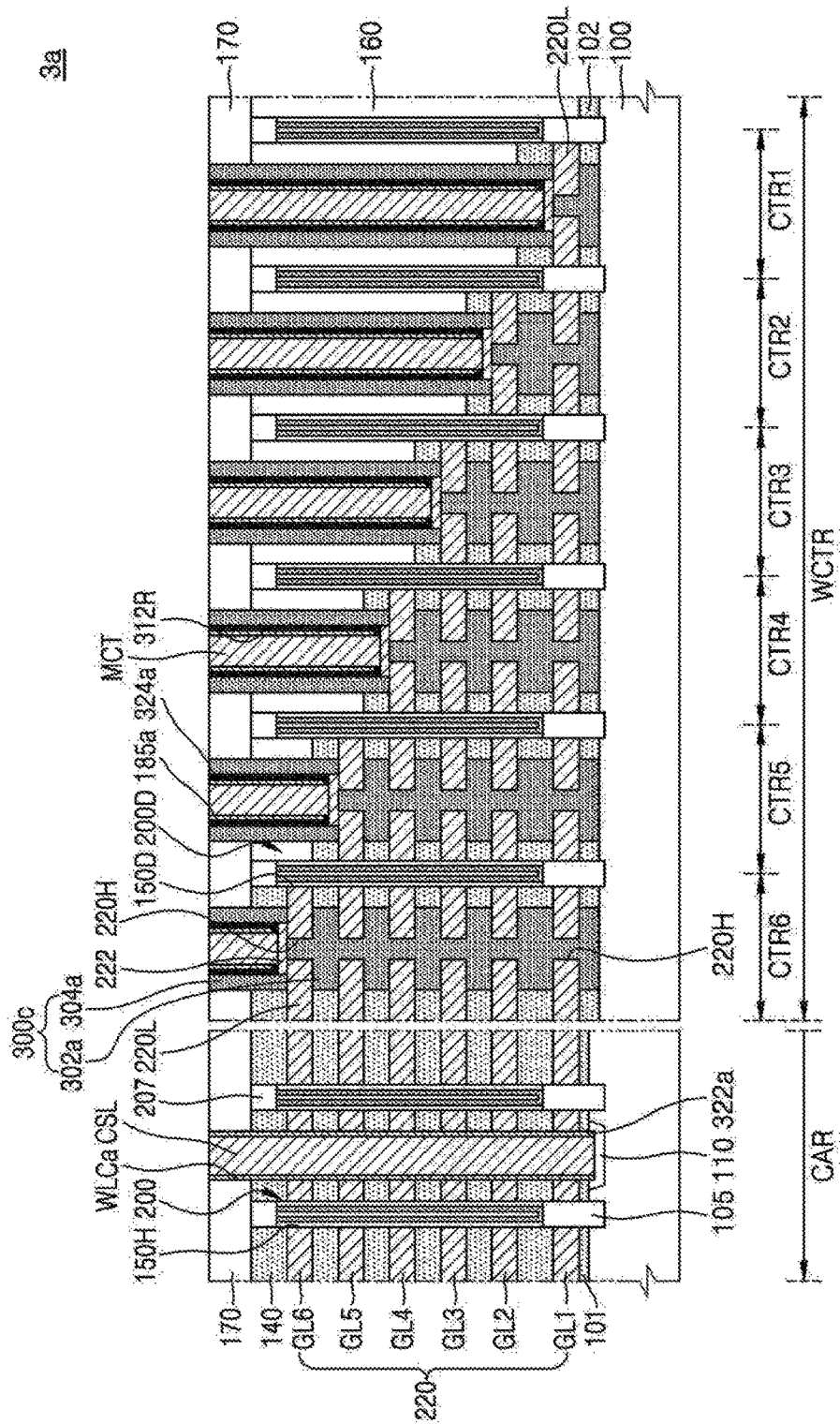
FIG. 8 is a cross-sectional view of an IC device according to an embodiment of the inventive concepts.

FIG. 8 is a cross-sectional view of an IC device 3a according to an embodiment of the inventive concepts. Referring to FIG. 8, the IC device 3a may include support insulating layers 300c including the support portion 302a and the spacer portion 304a that are separately spaced apart from each other. Unlike the support portions 302 of the support insulating layers 300 of the IC device 3 of FIG. 7L that are spaced apart from an upper surface of the substrate 100, a bottom surface of the support portions 302a of the support insulating layers 300c of the IC device 3a may be in contact with the substrate 100.

Figure 9:
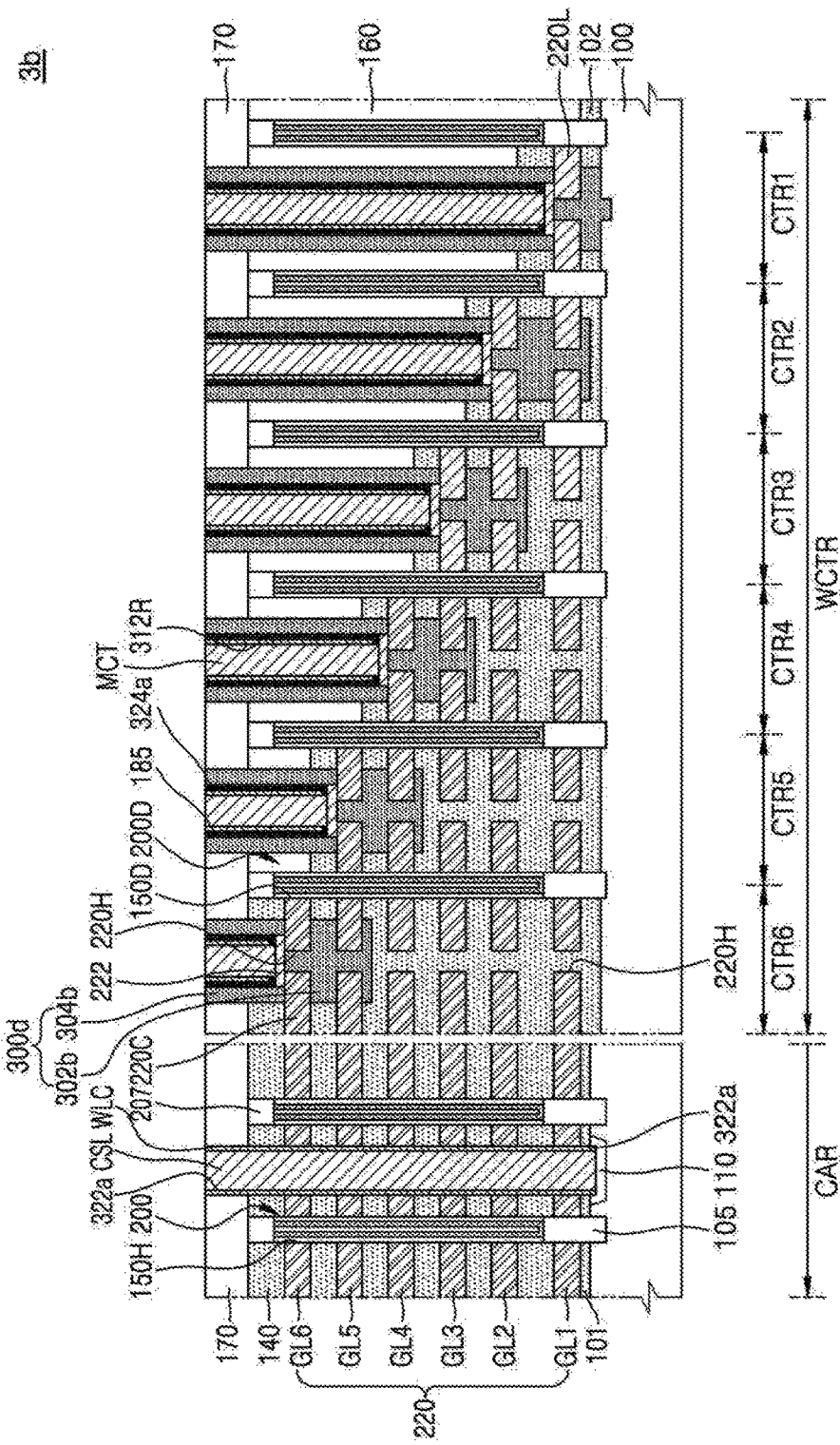
FIG. 9 is a cross-sectional view of an IC device according to an embodiment of the inventive concepts.

FIG. 9 is a cross-sectional view of an IC device 3b according to an embodiment of the inventive concepts. Referring to FIG. 9, the IC device 3b may include support insulating layers 300d including the support portions 302b and the spacer portions 304a. A bottom surface of the support portions 302b positioned in some of the plurality of contact regions CTR1~CTR6 may have a different level from a bottom surface of the support portion 302b positioned in others of the plurality of contact regions CTR1~CTR6 in a vertical direction with respect to a main surface of the substrate 100. The bottom surface of a part of the support portion 302b positioned in each of the plurality of contact regions CTR1~CTR6 may be in contact with the substrate 100 and the bottom surface of another part of the support portion 302b may be spaced apart from an upper surface of the substrate 100.

Figure 10A:
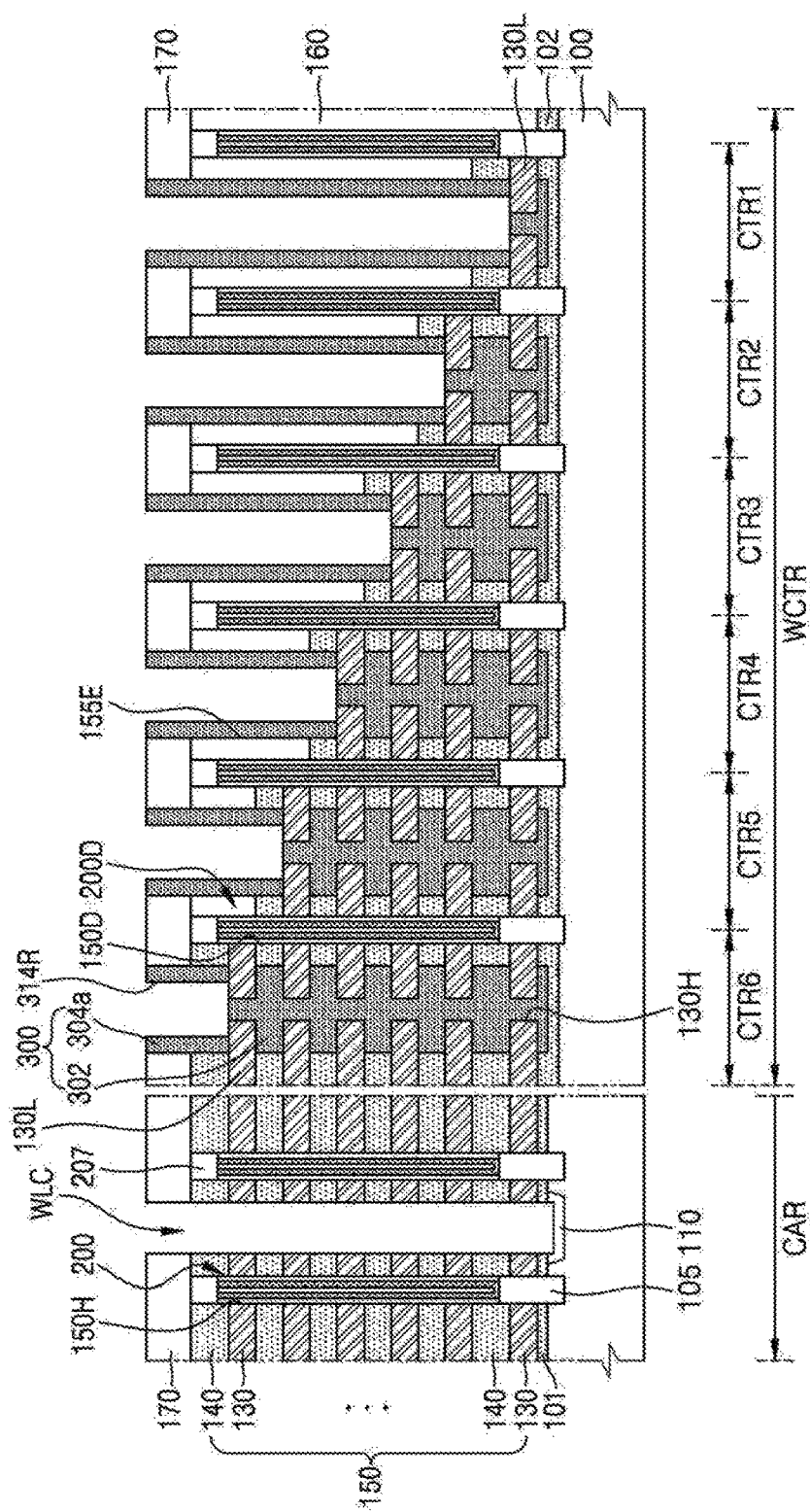
FIGS. 10A through 10C are cross-sectional views for sequentially describing a method of manufacturing an IC device according to an embodiment of the inventive concepts and cross-sectional views illustrating the IC device according to an embodiment of the inventive concepts.
Figure 10B:
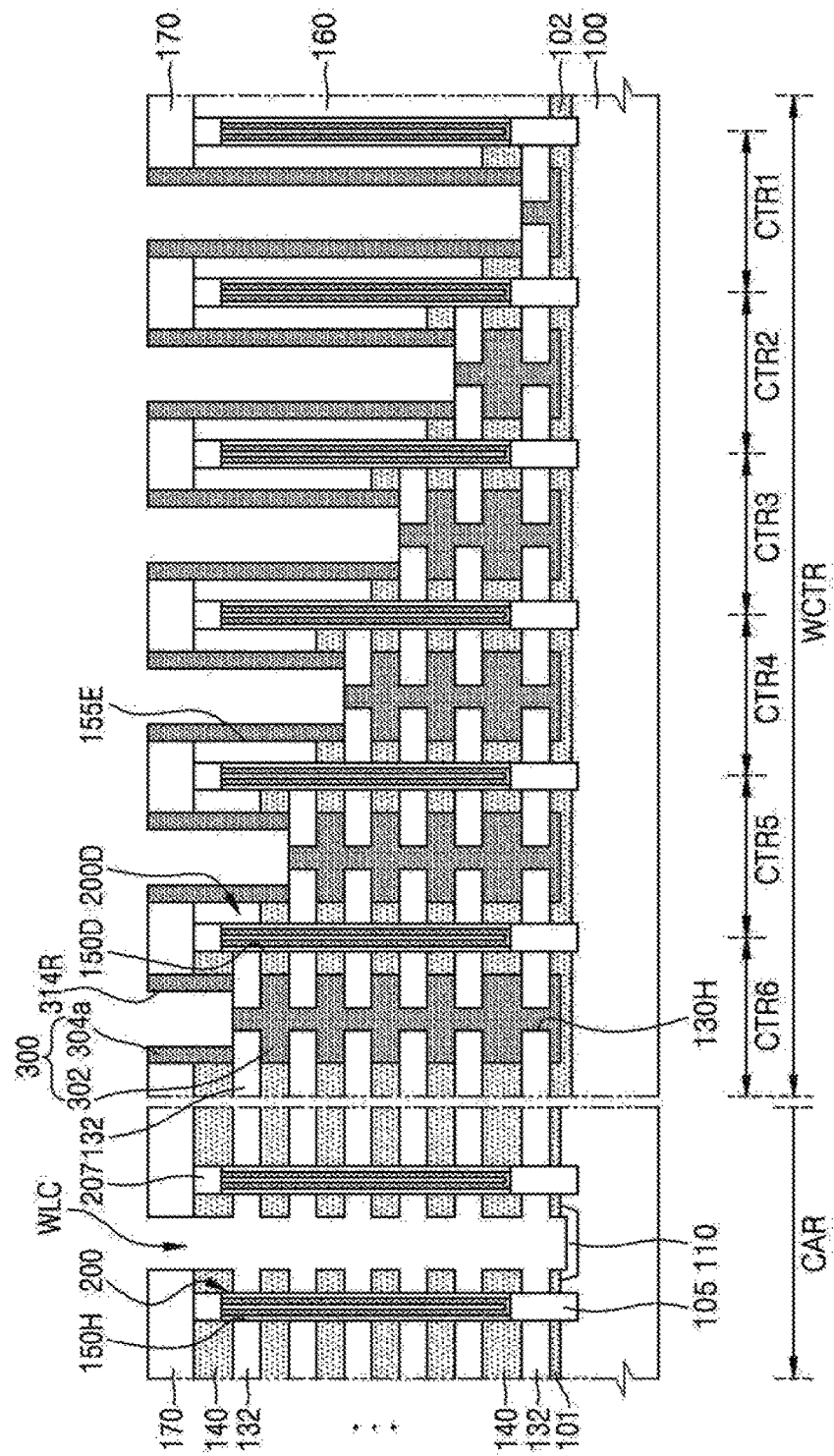
Figure 10C:
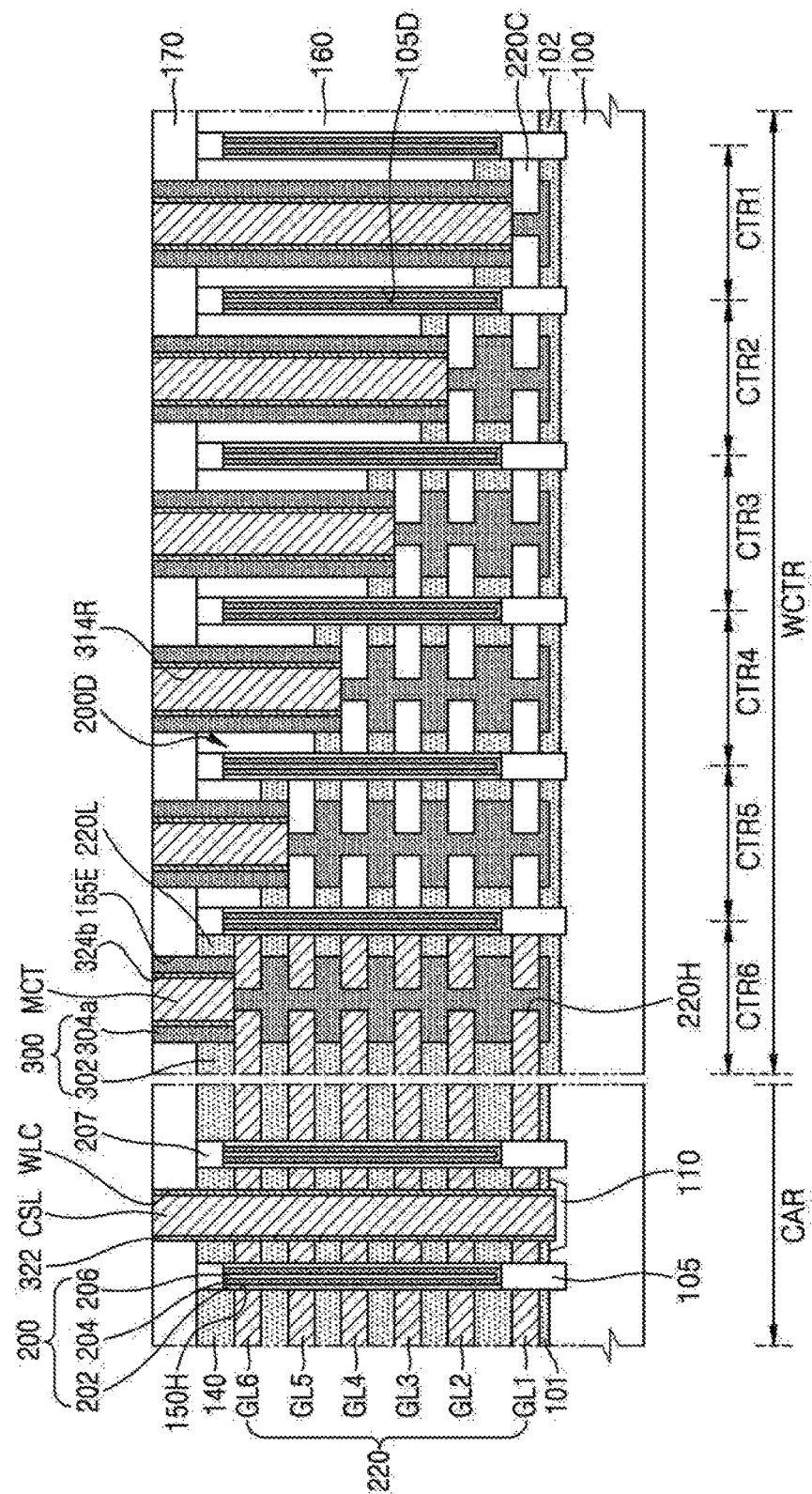

FIGS. 10A through 10C are cross-sectional views for sequentially describing a method of manufacturing an IC device 4 according to an embodiment of the inventive concepts and cross-sectional views illustrating the IC device 4 according to an embodiment of the inventive concepts. FIGS. 10A through 10C illustrate a process after FIG. 2H.

Referring to FIG. 10A, extension insulating layer recesses 314R that expose a part of an upper surface of respective preparatory landing portions 130L around the through holes 130H may be formed by removing a part (see 300 of FIG. 2H) of a support insulating layers formed on an upper surface of the second insulating layer 170 and a part (see 300 of FIG. 2H) of the support insulating layers positioned on the part of the upper surface of the respective preparatory landing portions 130L around the through holes 130H in a bottom surface of the insulating layer recesses 300R of FIG. 2H. Thus, the support insulating layers 300 may be separated into the support portions 302 and the spacer portions 304a.

Referring to FIG. 10B, the gate electrode layers 220 and the word line contact plugs MCT may be formed by filling conductive materials in the sacrificial layer removal spaces 132 and the extension insulating layer recesses 314R. The sacrificial layer removal spaces 132 and the extension insulating layer recesses 314R may be connected to each other, and thus the gate electrode layers 220 and the word line contact plugs MCT may be connected to each other. In some embodiments, before the gate electrode layers 220 and the word line contact plugs MCT are formed, after the trench spacer 322 covering side walls of the word line cut trench WLC is formed, during a process of forming the gate electrode layers 220 and the word line contact plugs MCT, the common source line CSL may be formed by filling the conductive material in the word line cut trench WLC. In some embodiments, during a process of forming the trench spacer 322, hole spacers 324b covering side walls of the extension insulating layer recesses 314R may be formed together. A bottom surface of the hole spacers 324b may have the same level as a bottom surface of the spacer portions 304a with respect to a main surface of the substrate 100.

In the IC device 4, the gate electrode layers 220 and the word line contact plugs MCT may be integrally formed. In the IC device 4, the gate electrode layers 220, the word line contact plugs MCT, and the common source line CSL may be formed together.

Figure 11:
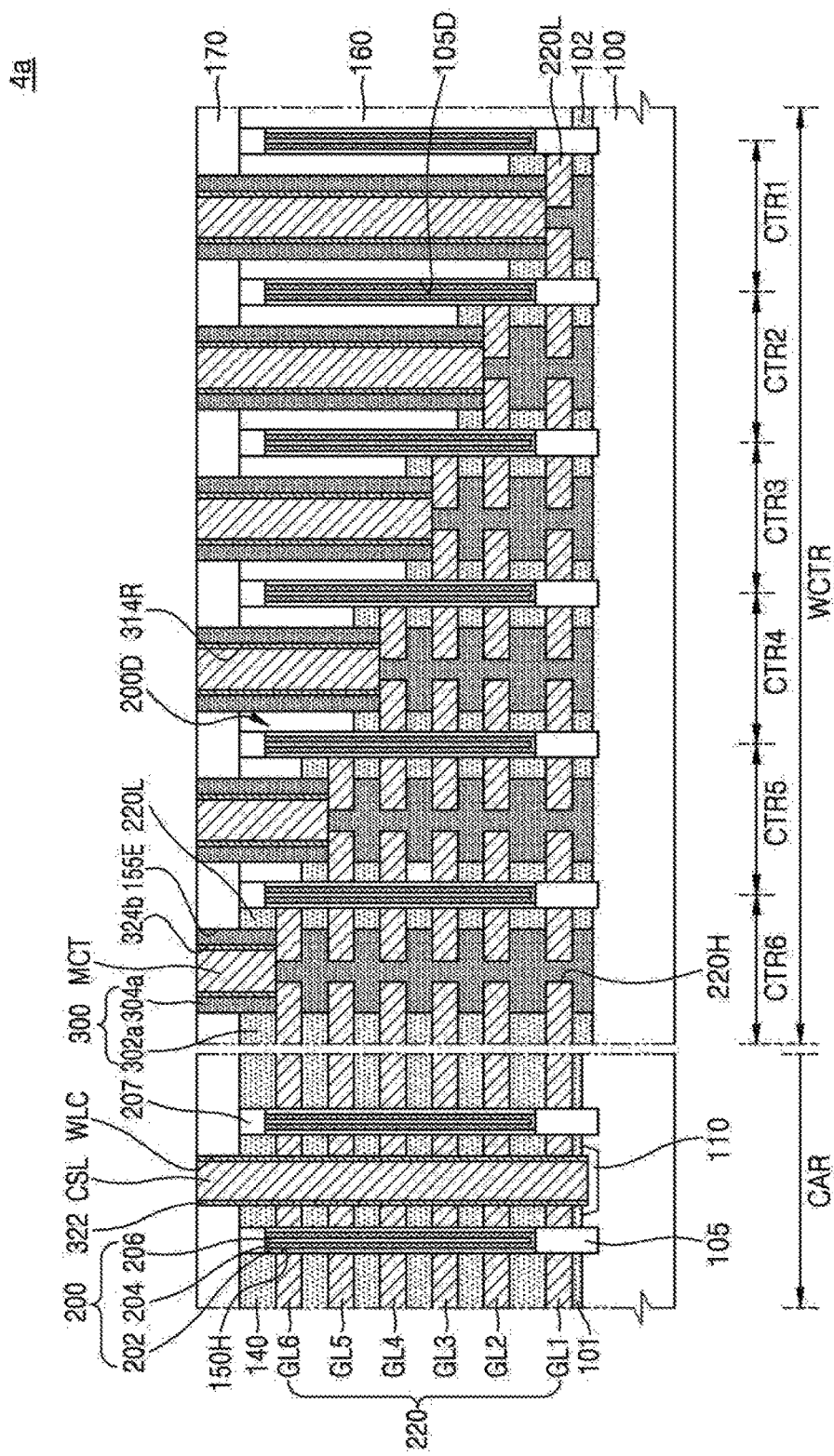
FIG. 11 is a cross-sectional view of an IC device according to an embodiment of the inventive concepts.

FIG. 11 is a cross-sectional view of an IC device 4a according to an embodiment of the inventive concepts.

Referring to FIG. 11, the IC device 4a may include the support insulating layers 300c including the support portions 302a and the spacer portions 304a that are separately spaced apart from each other. Unlike the support portion 302 of the support insulating layer 300 of the IC device 4 of FIG. 10C that are spaced apart from an upper surface of the substrate 100, a bottom surface of the support portions 302a of the support insulating layers 300c of the IC device 4a may be in contact with the substrate 100.

Figure 12:
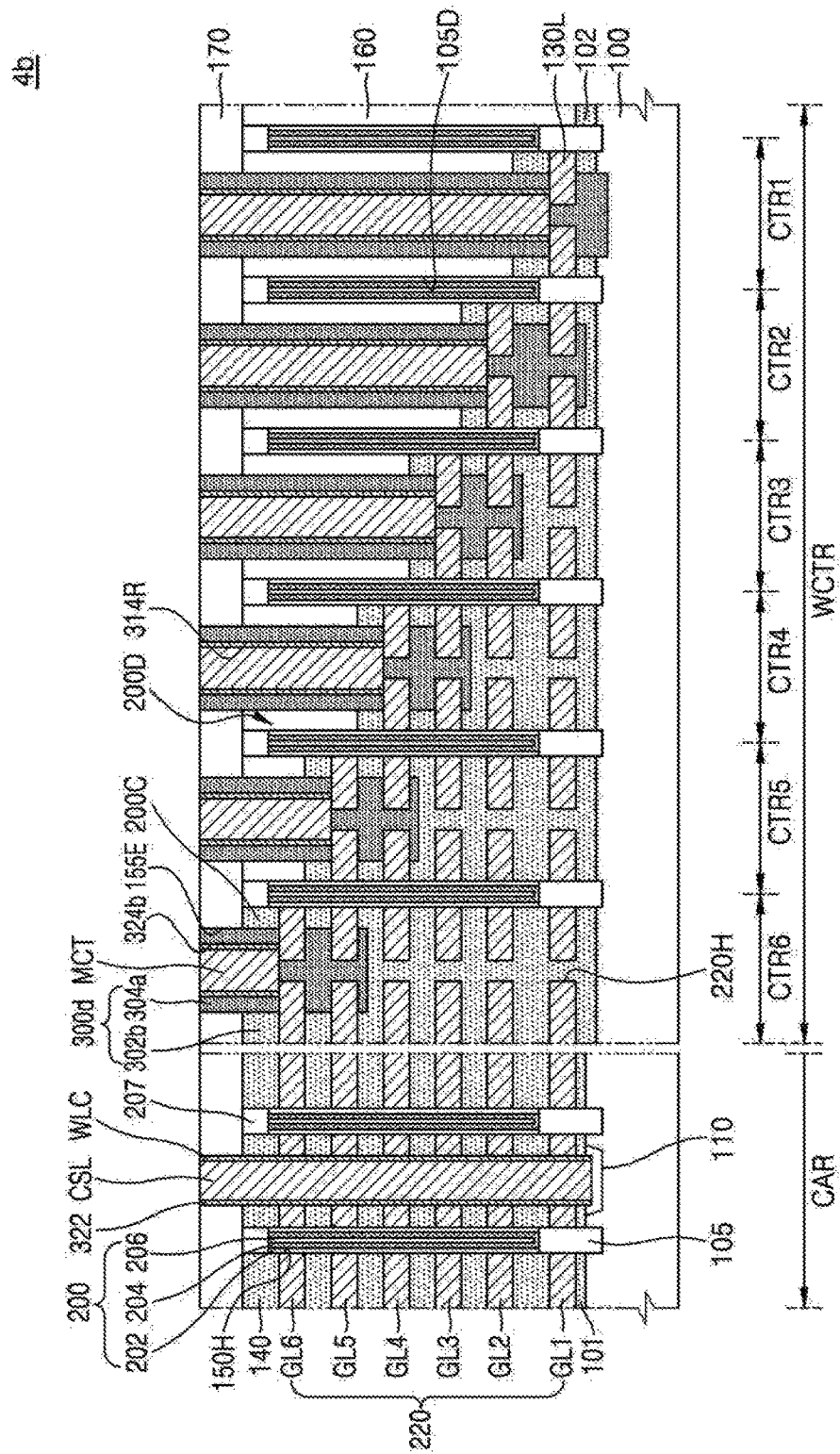
FIG. 12 is a cross-sectional view of an IC device according to an embodiment of the inventive concepts.

FIG. 12 is a cross-sectional view of an IC device 4b according to an embodiment of the inventive concepts.

Referring to FIG. 12, the IC device 4b may include the support insulating layers 300d including the support portions 302b and the spacer portions 304a. A bottom surface of the support portions 302b positioned in some of the plurality of contact regions CTR1~CTR6 may have a different level from a bottom surface of the support portions 302b positioned in others of the plurality of contact regions CTR1~CTR6 in a vertical direction with respect to a main surface of the substrate 100. The bottom surface of a part of the support portions 302b positioned in each of the plurality of contact regions CTR1~CTR6 may be in contact with the substrate 100 and the bottom surface of another part of the support portions 302b may be spaced apart from an upper surface of the substrate 100.

FIGS. 13A through 13G are cross-sectional views for sequentially describing a method of manufacturing the IC device 1 according to an embodiment of the inventive concepts and cross-sectional views illustrating the IC device 1 according to an embodiment of the inventive concepts. Unlike FIGS. 2A through 2N, the cell array region CAR is omitted.

Figure 13A:
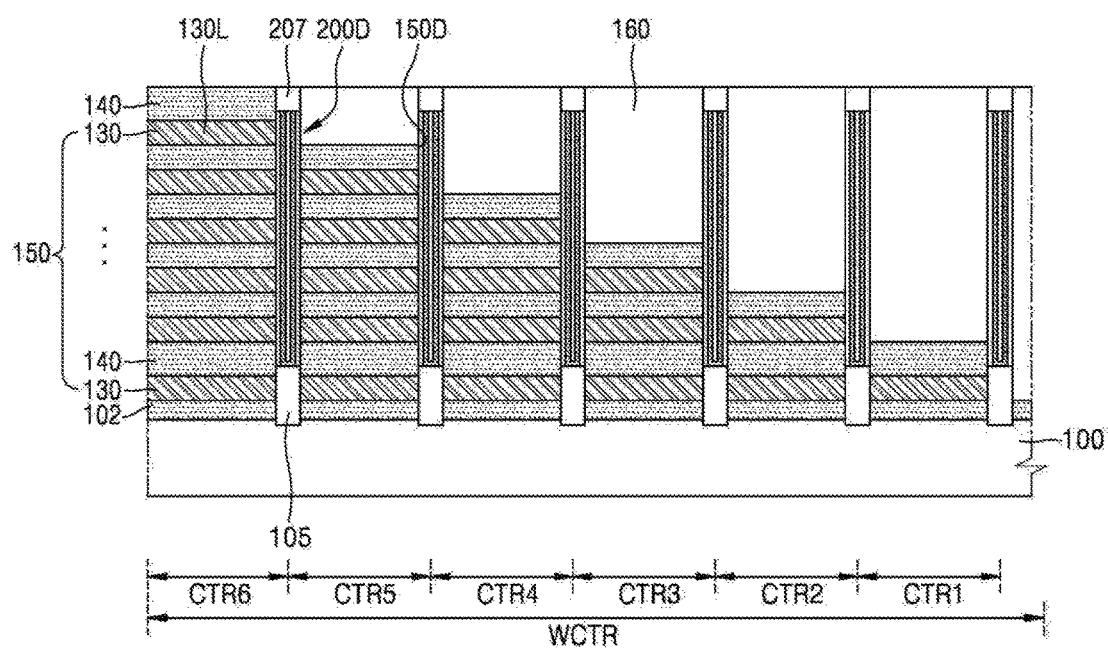
FIGS. 13A through 13G are cross-sectional views for sequentially describing a method of manufacturing an IC device according to an embodiment of the inventive concepts and cross-sectional views illustrating the IC device according to an embodiment of the inventive concepts.

Referring to FIG. 13A, as described with reference to FIG. 2A, the thin film structure 150 and the first insulating layer 160 may be formed on the substrate 100 after forming the device isolating layer 102 on the substrate 100. Thereafter, as described with reference to FIG. 2B, the plurality of dummy holes 150D may be formed in the word line contact region WCTR, and the dummy pillar 200D and the contact pad 207 may be formed in the plurality of dummy holes 150D.

Figure 13B:
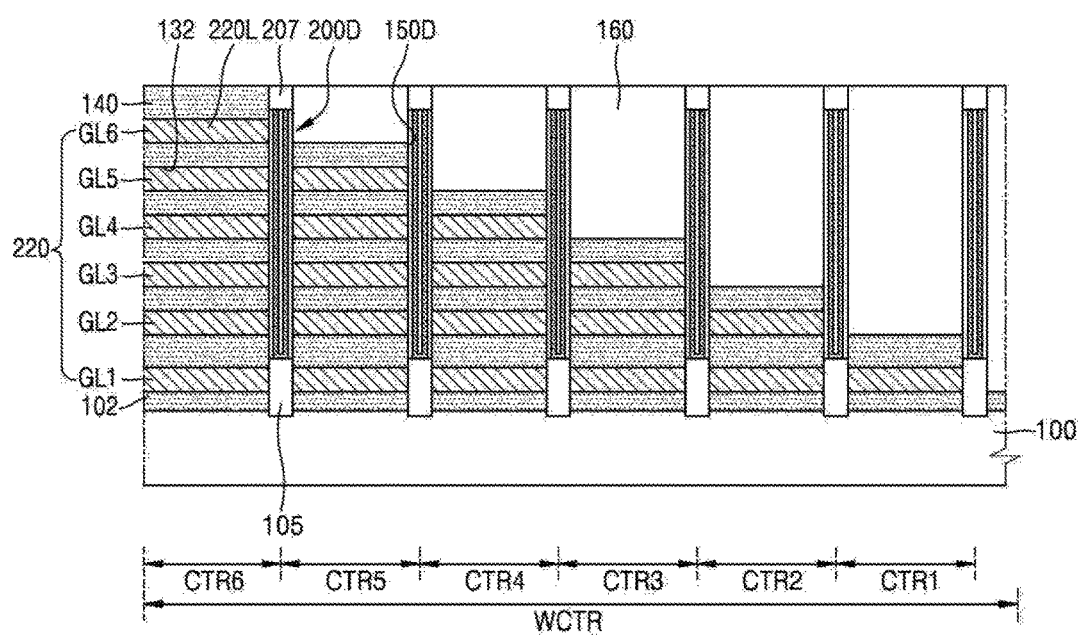

Referring to FIG. 13B, after removing the plurality of sacrificial layers 130 of FIG. 13A, the plurality of gate electrode layers 220 filling the sacrificial layer removal space 132, form which the plurality of sacrificial layers 130 are removed, may be formed. To remove the plurality of sacrificial layers 130, the word line cut trench WLC described with reference to FIG. 2H may be formed in the cell array region CAR.

Figure 13C:
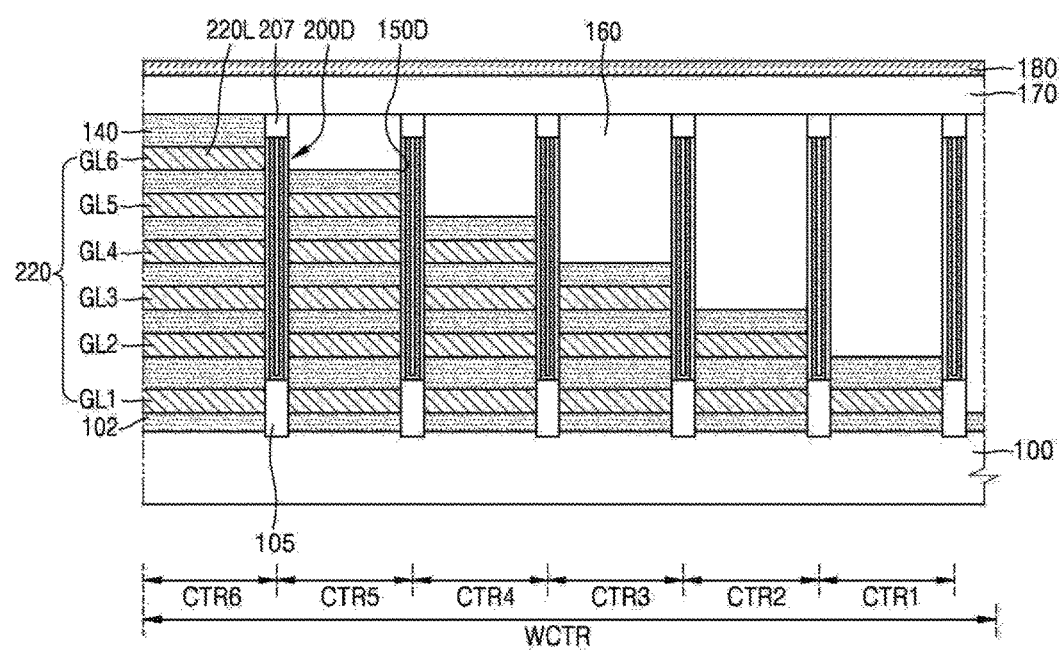
Figure 13D:
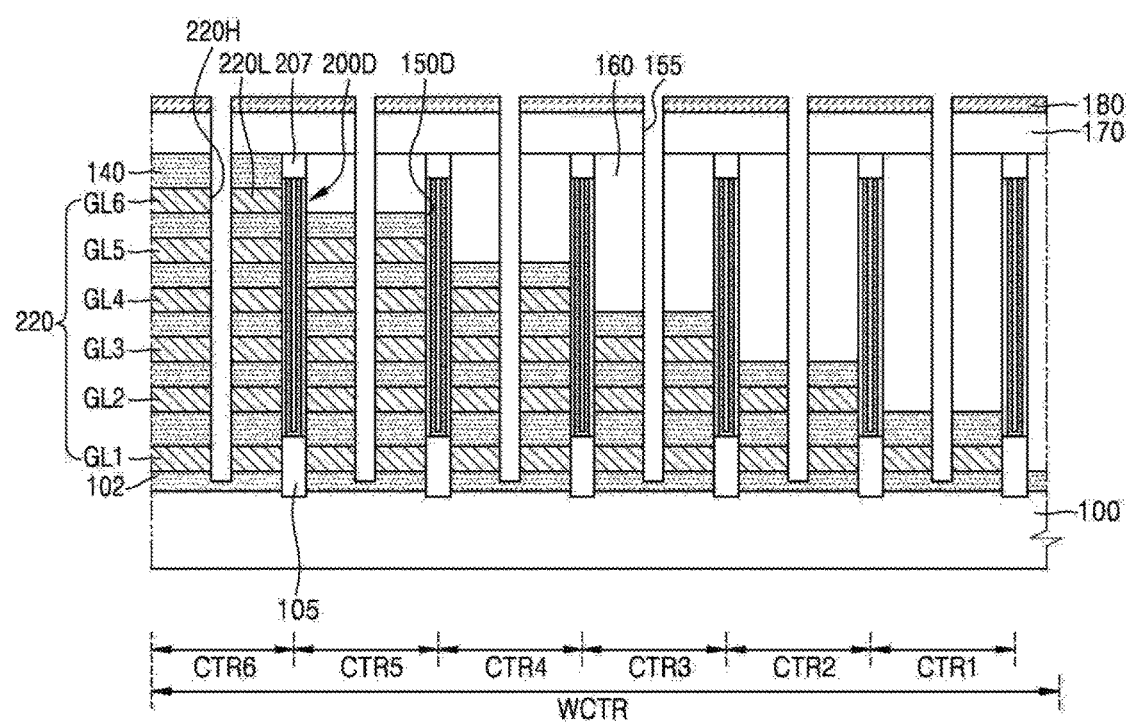
Figure 13E:
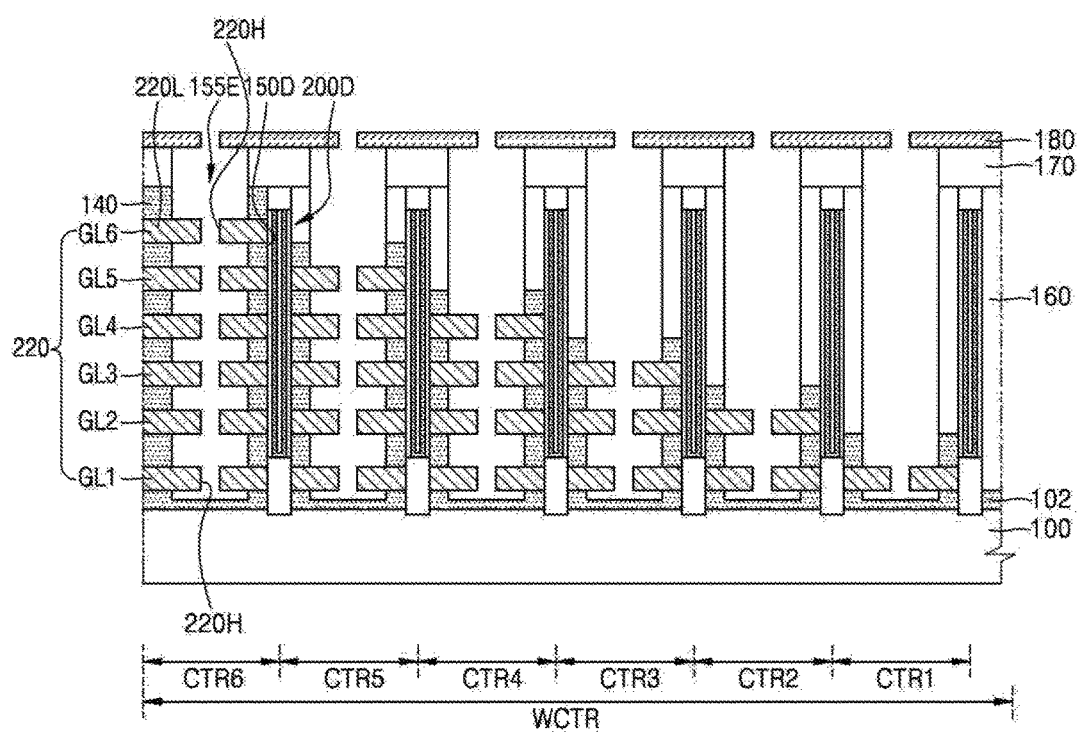
Figure 13F:
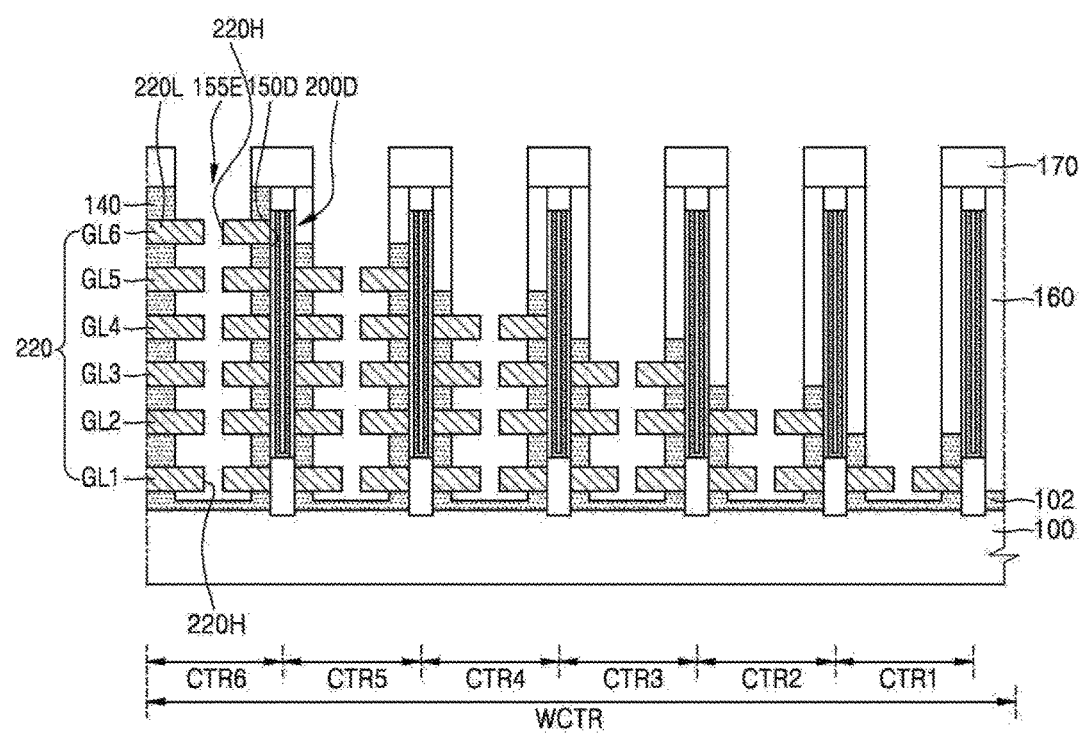
Figure 13G:
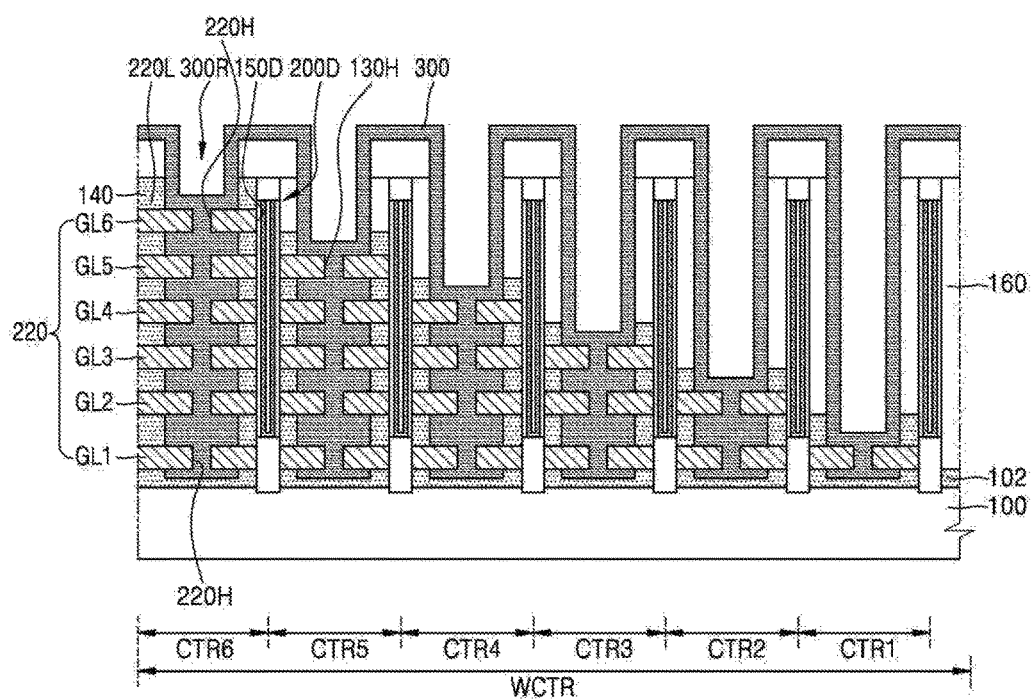

Referring to FIGS. 13C and 13D, the second insulating layer 170 covering the substrate 100 on which the gate electrode layers 220 are formed and the cover layer 180 covering the second insulating layer 170 may be formed. The at least one contact hole 155 may be formed in each of the plurality of contact regions CTR1~CTR6 of the word line contact region WCTR. A portion of the contact holes 155 through which side walls of the gate electrode layers 220 are exposed may be the support holes 220H. In each of the plurality of contact regions CTR1~CTR6, the support holes 2200H may be formed in the contact plug landing portions 220L while not formed in a portion of the gate electrode layers 220 other than the contact plug landing portions 220L.

Referring to FIGS. 13C through 13G, the extension contact holes 155E may be formed by partially removing portions of the second insulating layer 170, the first insulating layer 160, and the interlayer insulating layers 140 that are exposed through the contact holes 155 of FIG. 13D, an upper portion of the extension contact holes 155E may be entirely exposed by removing the cover layer 180, and the support insulating layers 300 defining the insulating layer recesses 300R may be formed.

Thereafter, through a process described with reference to FIGS. 2L through 2N, the IC device 1 may be formed. The IC device 1 may be formed by forming the gate electrode layers 220 after forming the support insulating layers 300 in FIGS. 2A through 2N, whereas the IC device 1 may be formed by forming the support insulating layers 300 after forming the gate electrode layers 220 in FIGS. 13A through 13G.

Figure 14A:
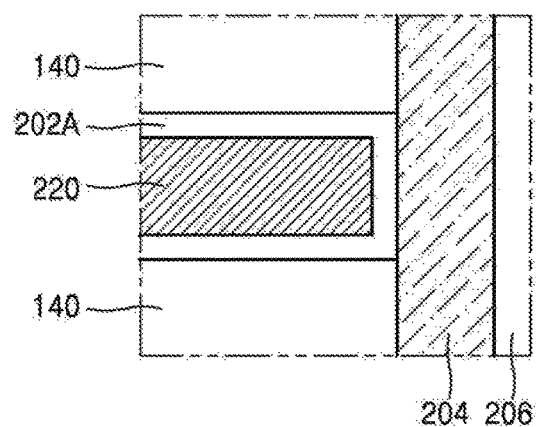
FIGS. 14A and 14B are cross-sectional views illustrating modification examples of gate dielectric layers that are employable in an IC device according to an embodiment of the inventive concepts.
Figure 14B:
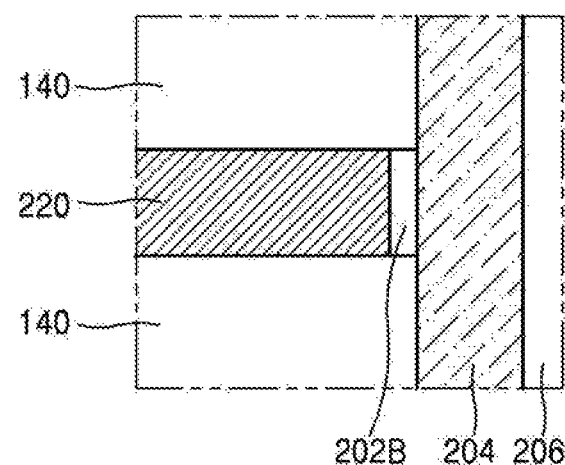

FIGS. 14A and 14B are cross-sectional views illustrating modification examples of gate dielectric layers that are employable in an IC device according to an embodiment of the inventive concepts. FIGS. 14A and 14B are cross-sectional views illustrating structures of employable gate dielectric layer patterns 202A and 202B, instead of the gate dielectric layer pattern 202 of FIGS. 2N, 3, 4D, 5C, 6, 7L, 8, 9, 10C 11, and 12.

The gate dielectric layer pattern 202A may have a surface facing the channel region 204 and surfaces facing the filling insulating layers 206 over the gate dielectric layer pattern 202A and may cover bottom and upper surfaces and side walls of the gate electrode layer 220. The gate dielectric layer pattern 202A may include a blocking insulating layer, a charge storage layer, and a tunnel insulating layer that are sequentially formed from the gate electrode layer 220.

The gate dielectric layer pattern 202B may be formed between the gate electrode layer 220 and the channel region 204 and may not be formed between the gate electrode layer 220 and the filling insulating layers 206. The gate dielectric layer pattern 202B may include a blocking insulating layer, a charge storage layer, and a tunnel insulating layer that are sequentially formed from the gate electrode layer 220. The gate dielectric layer pattern 202B may not cover the bottom and upper surfaces of the gate electrode layer 220 and may cover only the side walls of the gate electrode layer 220.

In some embodiments, the gate dielectric layer patterns 202, 202A, and 202B may include a phase change material of which electrical resistance may be changed by heat generated due to current passing through electrodes adjacent to the gate dielectric layer patterns 202, 202A, and 202B, a ferromagnetic material or an antiferromagnetic material having a thin film structure of which electrical resistance may be changed using spin transfer by electric current, and a perovskite compound or a transition metal oxide. In some embodiments, a barrier metal layer (not shown) may be further formed between the gate dielectric layer patterns 202, 202A, and 202B and the gate electrode layer 220.

While the inventive concepts have been particularly shown and described with reference to embodiments thereof, it will be understood that various changes in form and details may be made therein without departing from the spirit and scope of the following claims.

What is claimed is:

1. A semiconductor device, comprising:
   a stack of alternating interlayer insulating layers and conductive layers on a substrate, each of the conductive layers extending in a first direction less than a previous one of the conductive layers to define a landing portion of the previous one of the conductive layers;
   an insulating plug in one of the conductive layers under one of the landing portions; and
   a contact plug extending from an upper surface of the one of the landing portions.

2. The semiconductor device of claim 1, wherein the contact plug covers the insulating plug.

3. The semiconductor device of claim 2, wherein a diameter of the contact plug is greater than a diameter of the insulating plug.

4. The semiconductor device of claim 3, wherein a longitudinal axis of the contact plug is aligned with a longitudinal axis of the insulating plug.

5. The semiconductor device of claim 2, wherein the contact plug has a first portion and second portion, the first portion on the upper surface of the one of the landing portions, the second portion extending from the first portion, a diameter of the second portion being less than a diameter of the first portion, and the diameter of the second portion being greater than a diameter of a portion of the insulating plug, the portion of the insulating plug being a portion of the insulating plug adjoining the first portion of the contact plug.

6. The semiconductor device of claim 1, wherein a longitudinal axis of the contact plug is aligned with a longitudinal axis of the insulating plug.

7. The semiconductor device of claim 1, further comprising:
   a plurality of contact plugs, each extending from an upper surface of a respective one of the landing portions.

8. The semiconductor device of claim 7, further comprising:
   more than one insulation plug, and each of the insulating plugs in a respective one of the conductive layers under a respective one of the plurality of contact plugs.

9. The semiconductor device of claim 7, further comprising:
   insulating sidewalls on sides of each of the plurality of contact plugs.

10. The semiconductor device of claim 7, wherein each of the plurality of contact plugs has a first portion and second portion, the first portion on the upper surface of the respective one of the landing portions, the second portion extending from the first portion, and a diameter of the second portion being less than a diameter of the first portion.

11. The semiconductor device of claim 1, further comprising:
    a plurality of vertical channel structures penetrating into the stack.

12. The semiconductor device of claim 1, further comprising:
    a plurality of vertical channel structures penetrating trough the stack and into the substrate.

13. A semiconductor device, comprising:
    a first insulating layer over a portion of a substrate;
    a first gate electrode layer on the first insulating layer;
    a second insulating layer on the first gate electrode layer;
    a second gate electrode layer on the second insulating layer;
    a first conductive contact plug extending from an upper surface of the first gate electrode layer;
    a second conductive contact plug extending from an upper surface of the second gate electrode layer; and
    an insulating plug disposed in the first gate, electrode layer, the insulating plug disposed under the second conductive contact plug, and a diameter of a portion of the insulating plug being less than a diameter of the second conductive contact plug.

14. The semiconductor device of claim 13, wherein a longitudinal axis of the second conductive contact plug is aligned with a longitudinal axis of the insulating plug.

15. The semiconductor device of claim 13, further comprising:
    insulating sidewalls on sides of the first and second conductive contact plugs.

16. The semiconductor device of claim 13, wherein the second conductive contact plug has a first portion and second portion, the first portion of the second conductive contact plug on, the upper surface of the second gate electrode layer, the second portion of the second conductive contact plug extending from the first portion of the second conductive contact plug, and a diameter of the second portion of the second conductive contact plug being less than a diameter of the first portion of the second conductive contact plug.

17. The semiconductor device of claim 16, wherein the diameter of the second portion of the second conductive contact plug is greater than a diameter of the portion of the insulating plug, the portion of the insulating plug being a portion adjoining the first conductive contact plug.

18. The semiconductor device of claim 1, wherein the insulating plug is further provided through the one of the landing portions.

19. The semiconductor device of claim 13, wherein t insulating plug is further provided in the second gate electrode layer.

* * * * *